US007592660B2

(12) United States Patent
Nagai et al.

(10) Patent No.: US 7,592,660 B2
(45) Date of Patent: Sep. 22, 2009

(54) SEMICONDUCTOR DEVICE AND METHOD FOR MANUFACTURING THE SAME

(75) Inventors: Kouichi Nagai, Kawasaki (JP); Wensheng Wang, Kawasaki (JP)

(73) Assignee: Fujitsu Microelectronics Limited, Tokyo (JP)

( * ) Notice: Subject to any disclaimer, the term of this patent is extended or adjusted under 35 U.S.C. 154(b) by 0 days.

(21) Appl. No.: 12/131,288

(22) Filed: Jun. 2, 2008

(65) Prior Publication Data

US 2008/0237795 A1    Oct. 2, 2008

Related U.S. Application Data

(63) Continuation of application No. PCT/JP2005/022204, filed on Dec. 2, 2005.

(51) Int. Cl.
*H01L 29/00* (2006.01)
*H01L 21/20* (2006.01)

(52) U.S. Cl. .............. 257/306; 257/532; 257/760; 257/E21.008; 257/E29.343; 438/393; 438/624

(58) Field of Classification Search .............. 257/306, 257/532, 758, 760, E29.343, E21.008; 438/393, 438/622, 624
See application file for complete search history.

(56) References Cited

U.S. PATENT DOCUMENTS

| 6,740,974 B2 * | 5/2004 | Yoshitomi .............. 257/751 |
| 6,953,950 B2 * | 10/2005 | Sashida ................. 257/69 |
| 7,153,735 B2 * | 12/2006 | Sashida ................. 438/239 |
| 2003/0032230 A1 | 2/2003 | Nagano et al. |
| 2005/0002266 A1 | 1/2005 | Kanaya et al. |
| 2005/0181559 A1 | 8/2005 | Natori et al. |
| 2006/0154433 A1 * | 7/2006 | Onoda ................... 438/393 |

FOREIGN PATENT DOCUMENTS

| JP | 2004-87807 A | 3/2004 |
| JP | 2004-193176 A | 7/2004 |
| JP | 2004-349474 A | 12/2004 |
| JP | 2005-229001 A | 8/2005 |
| WO | 02/056382 A1 | 7/2002 |

OTHER PUBLICATIONS

International Search Report of PCT/JP2005/022204, date of mailing Mar. 7, 2006.

* cited by examiner

*Primary Examiner*—Tuan N. Quach
(74) *Attorney, Agent, or Firm*—Westerman, Hattori, Daniels & Adrian, LLP.

(57) ABSTRACT

There is provided a semiconductor device which includes a base insulating film formed on a semiconductor substrate, a capacitor formed on the base insulating film, an interlayer insulating film covering the capacitor, a first layer metal wiring formed on the interlayer insulating film, a single-layer first insulating film which covers the interlayer insulating film and the first layer metal wiring and has a first film thickness above the first layer metal wiring, a first capacitor protective insulating film formed on the first insulating film, a first cover insulating film which is formed on the first capacitor protective insulating film and has a second film thickness thicker than the first film thickness, above the first layer metal wiring, a third hole formed in the insulating films on the first layer metal wiring, and a fifth conductive plug formed in the third hole.

20 Claims, 63 Drawing Sheets

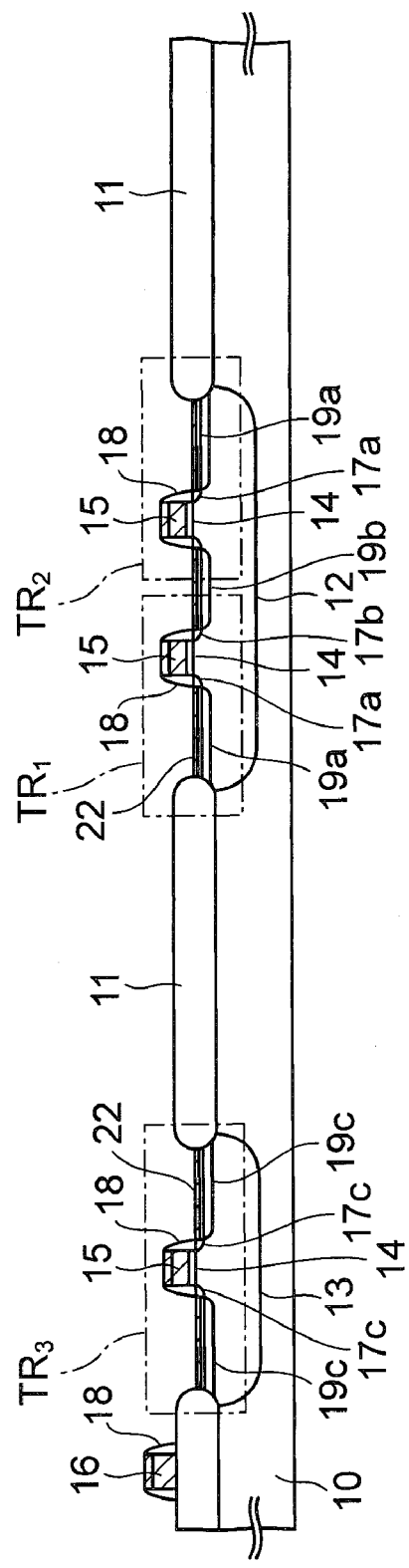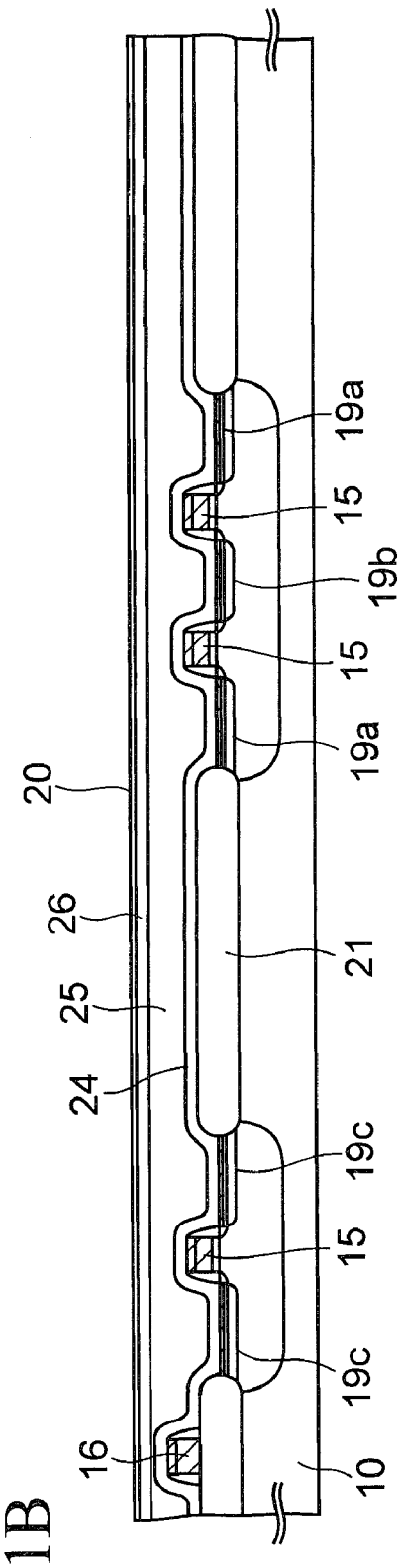

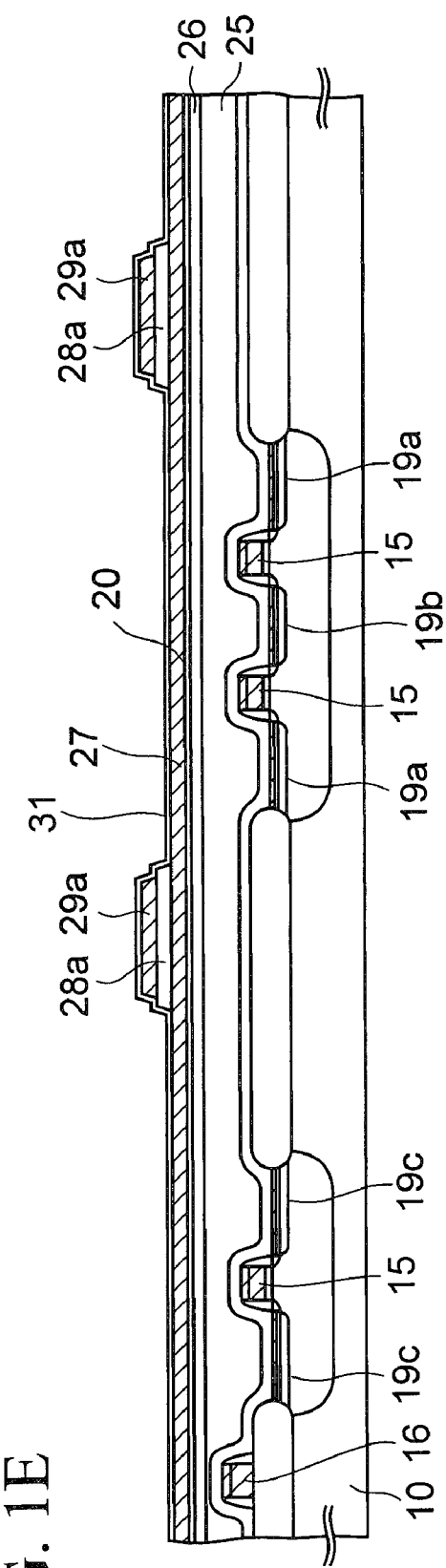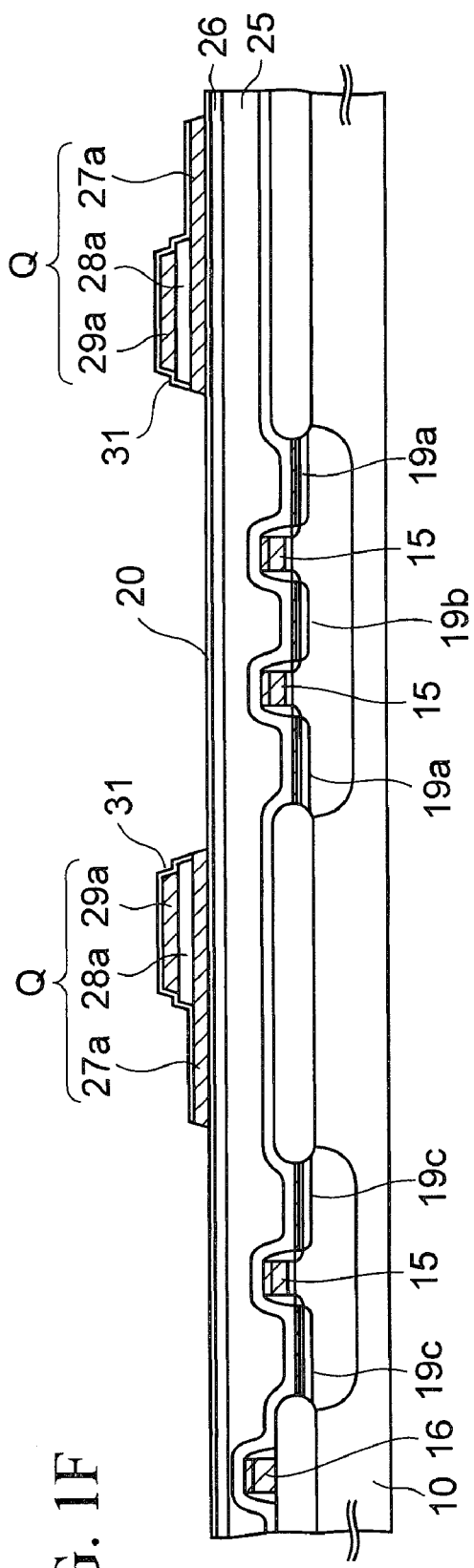

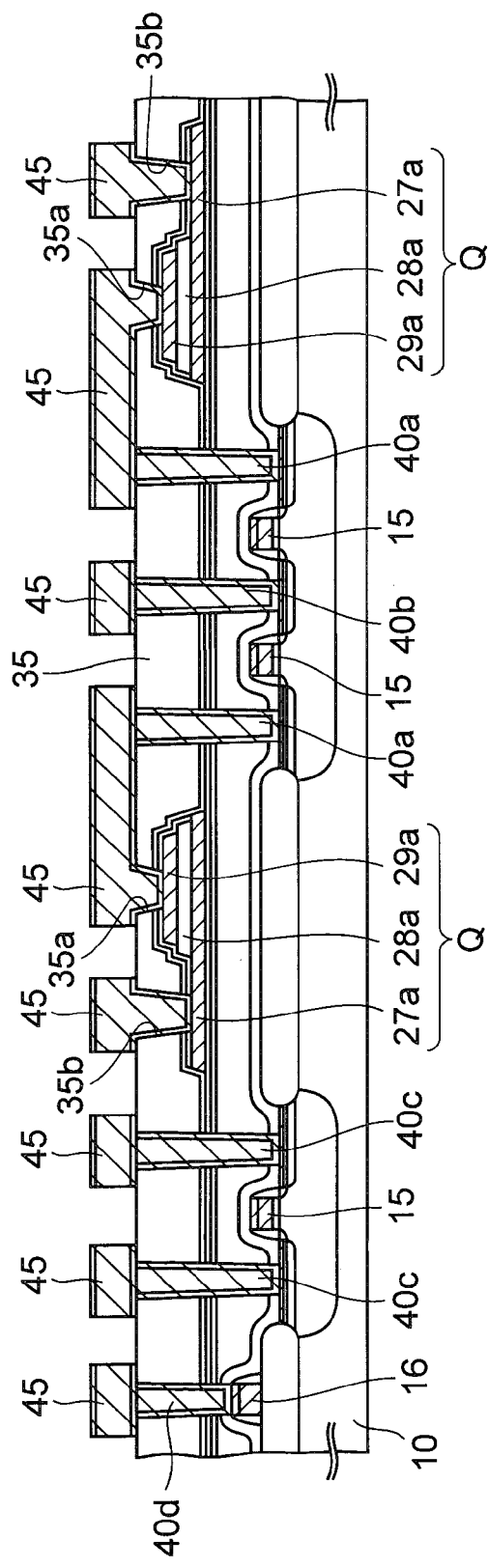
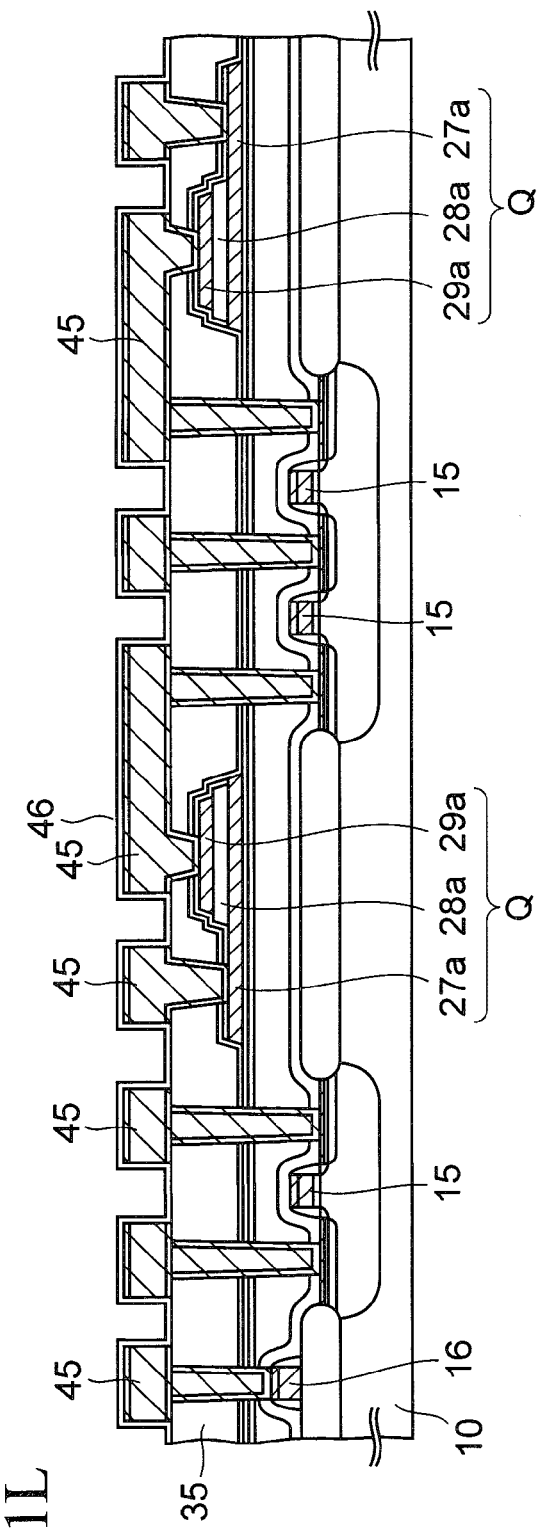
FIG. 1K
FIG. 1L

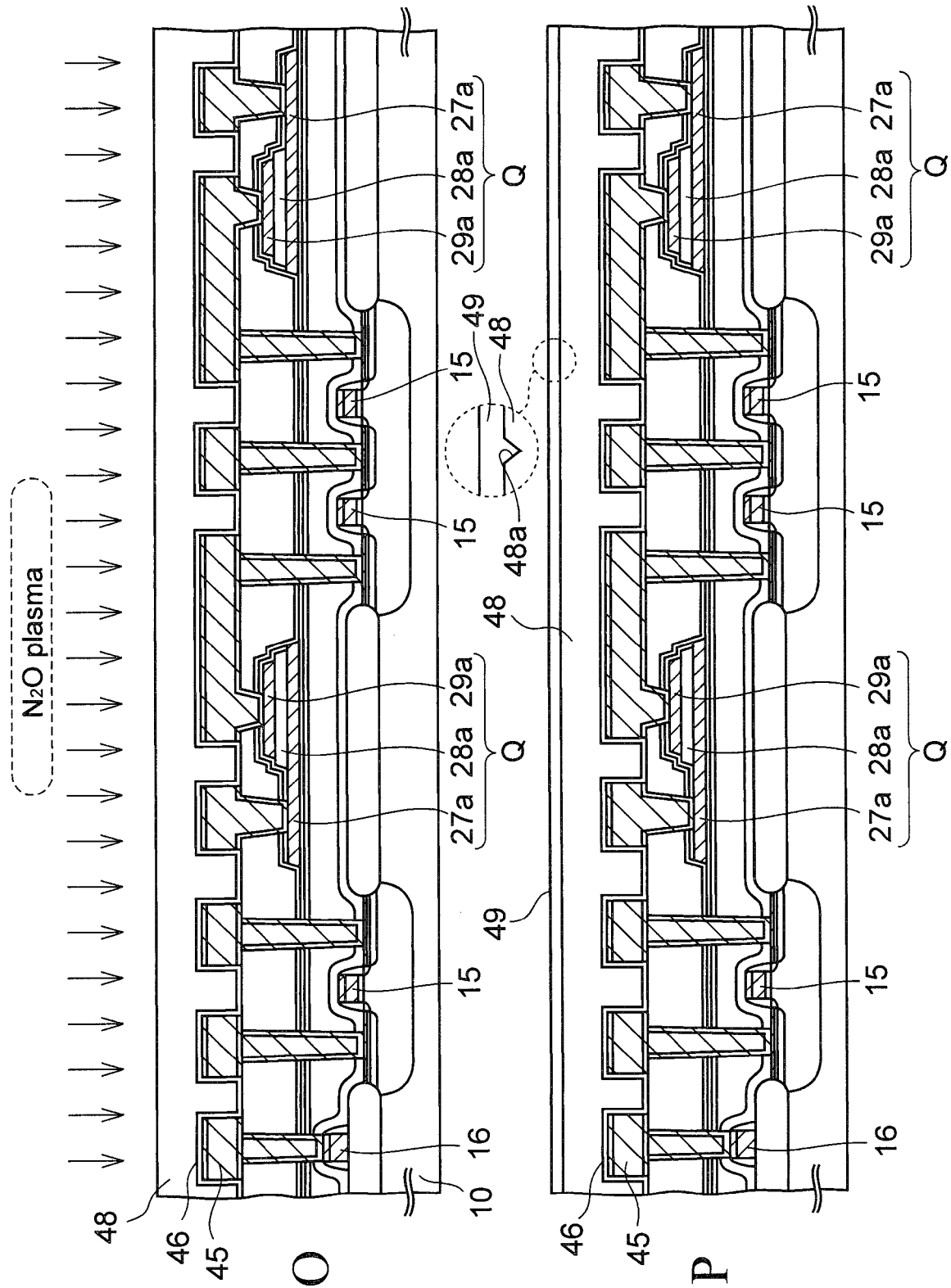

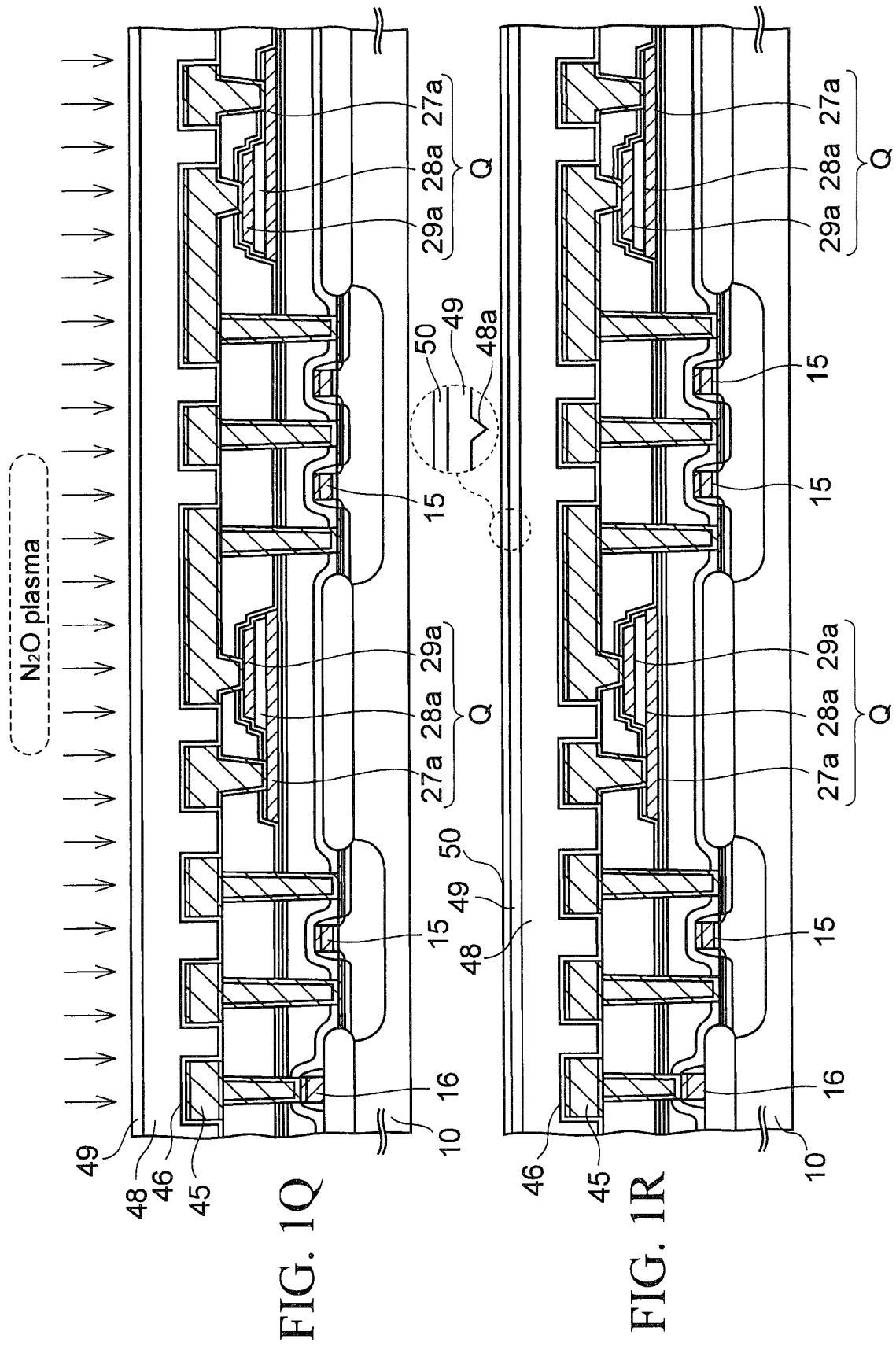

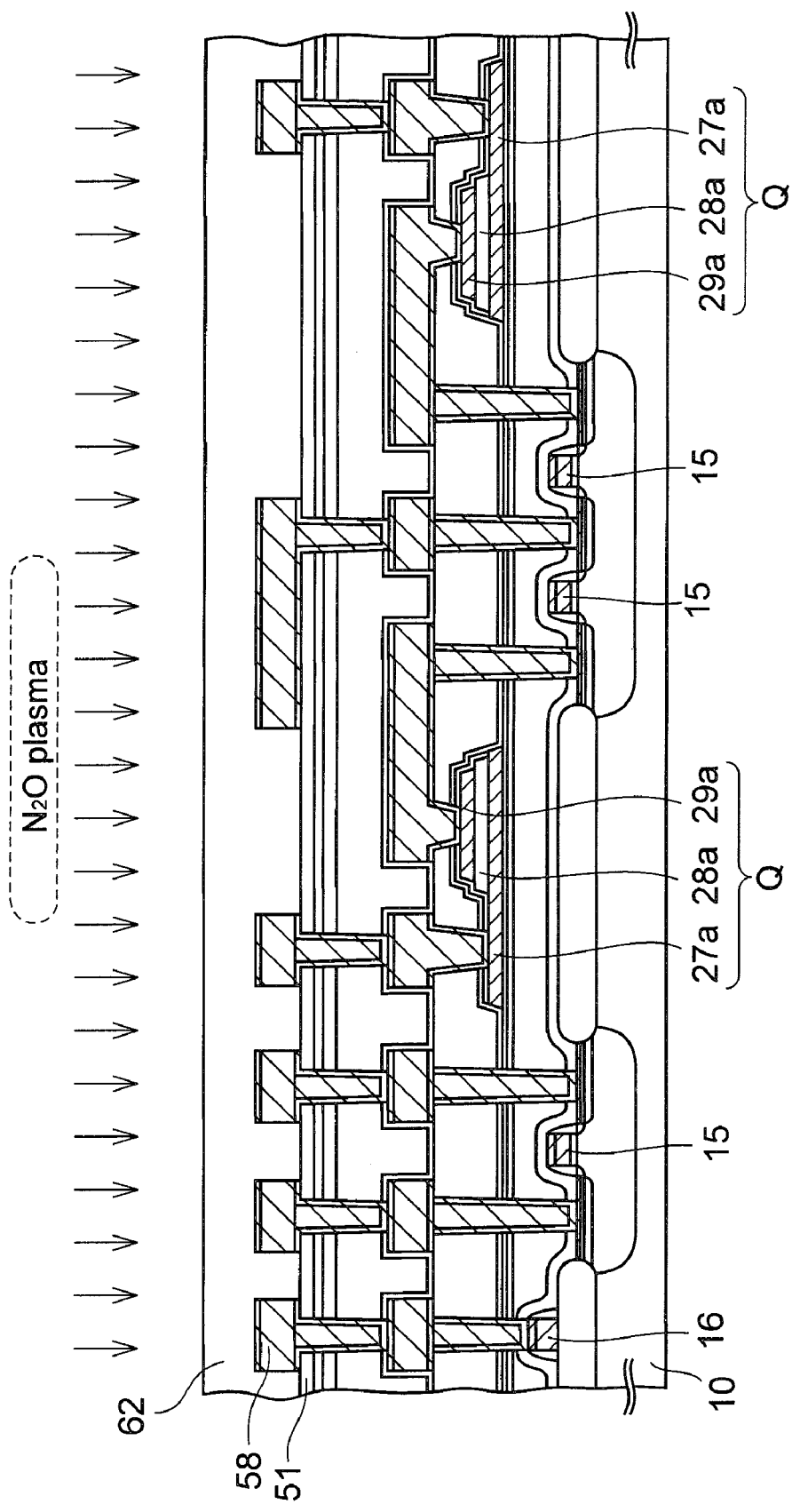

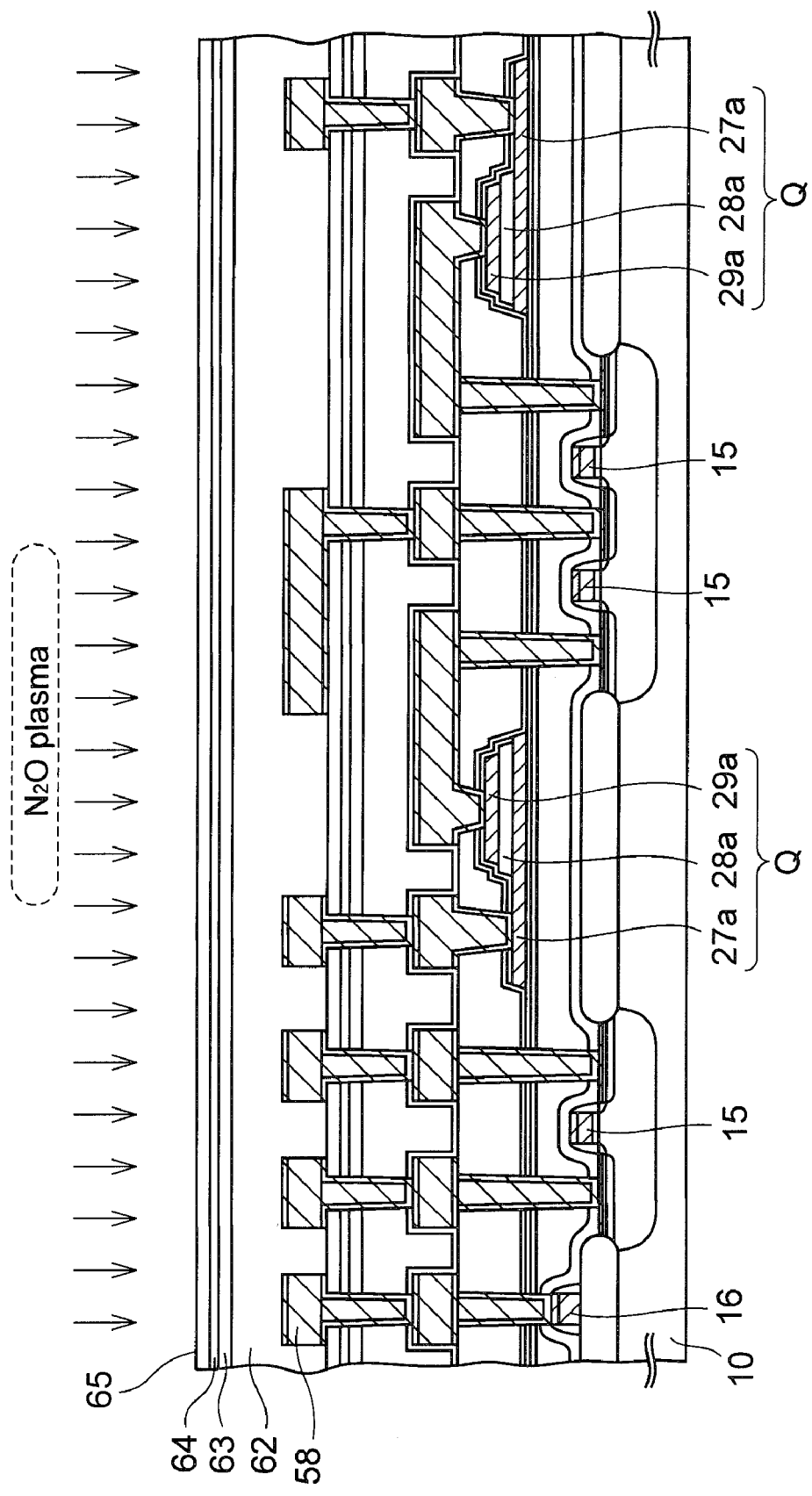

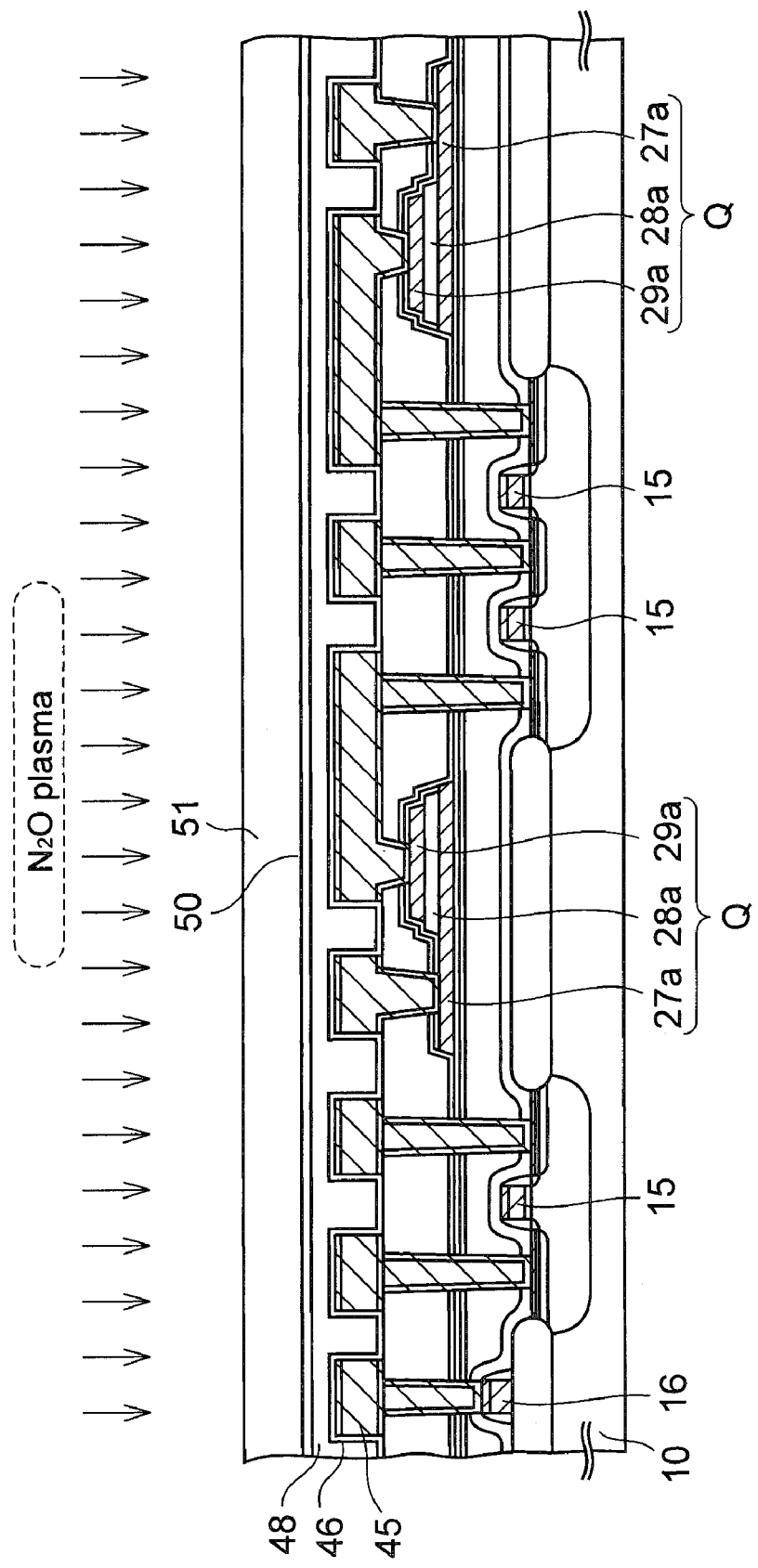

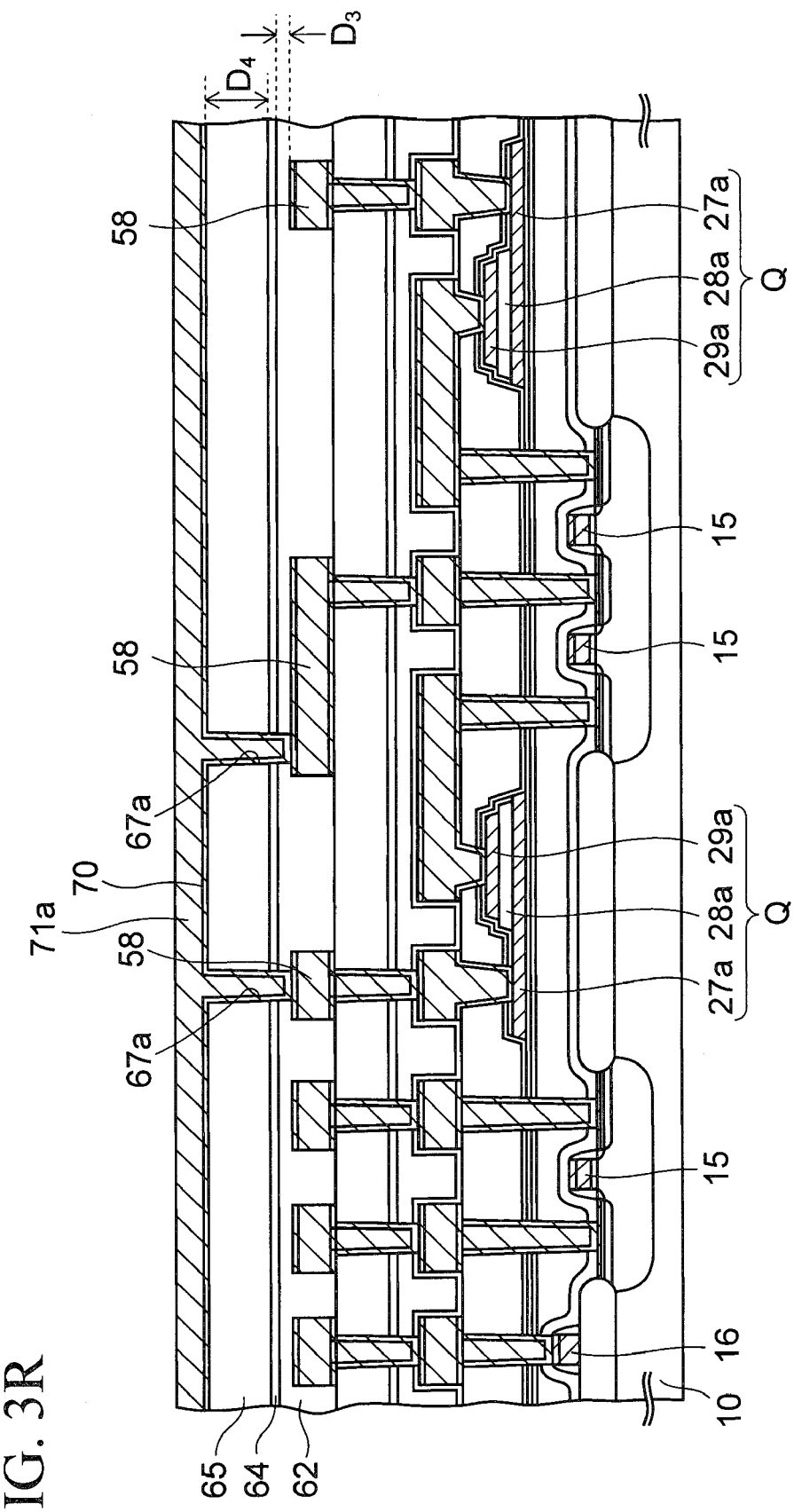

FIG. 7
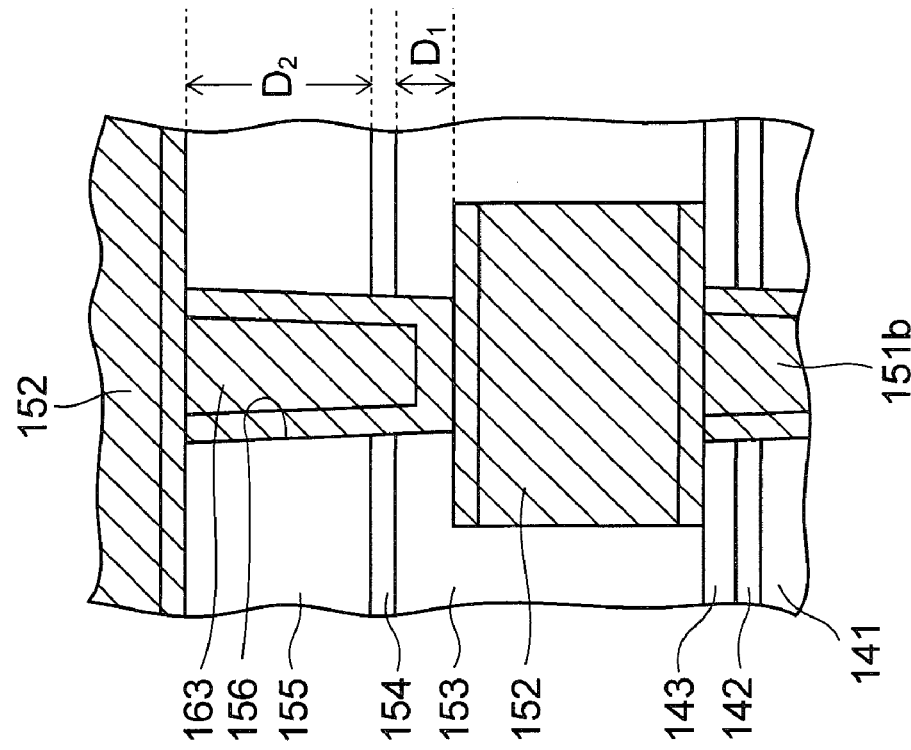
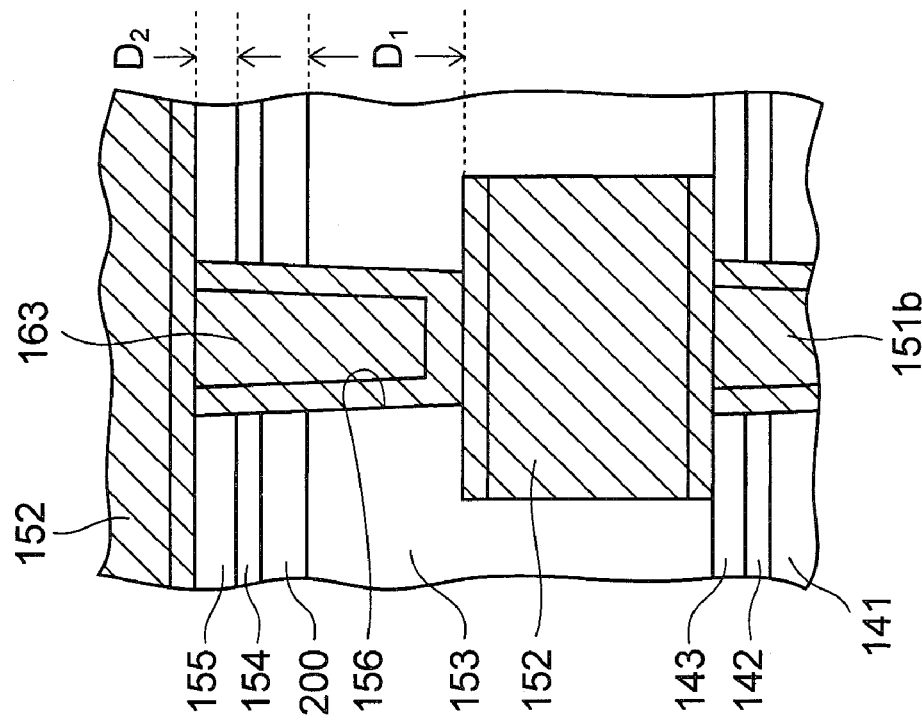

US 7,592,660 B2

SEMICONDUCTOR DEVICE AND METHOD FOR MANUFACTURING THE SAME

CROSS-REFERENCE TO RELATED APPLICATIONS

This application is a continuation of prior International Patent Application No. PCT/JP2005/022204, filed Dec. 2, 2005, the entire contents of which are incorporated herein by reference.

TECHNICAL FIELD

It is related to a semiconductor device and a method for manufacturing the same.

BACKGROUND

Flash memories and ferroelectric memories are well-known as nonvolatile memories capable of retaining stored information even after a power supply is turned off.

Among these, the flash memories include a floating gate that is embedded in a gate insulating film of an insulated gate field effect transistor (IGFET). The flash memories store information by accumulating, in this floating gate, electric charges indicating the information to be stored. However, it is required for such flash memories that a tunnel current be applied to the gate insulating film at the time of writing and erasing the information. Thus, there is a drawback that the flash memories require relatively high voltage.

On the other hand, the ferroelectric memories, which are also referred to as ferroelectric random access memories (FeRAMs), store information by utilizing the hysteresis characteristic of a ferroelectric film provided in a ferroelectric capacitor. The ferroelectric film causes polarization in response to the voltage applied between upper and lower electrodes of the capacitor, and spontaneous polarization remains even after the voltage is turned off. When the polarity of the applied voltage is reversed, the spontaneous polarization is also reversed. Directions of the spontaneous polarization are associated with "1" and "0", so that the information is written in the ferroelectric film. The voltage required for the FeRAMs to carry out writing is lower than that for the flash memories. In addition, there is also an advantage in that the FeRAMs are capable of writing at a higher rate than the flash memories. Furthermore, the FeRAM is also advantageous because high integration and high durability can be achieved.

In the above-described FeRAM, a hole is formed in an insulating film over the capacitor, and a conductive plug for electrically connecting upper and lower wirings is formed in the hole. When the conductive plug causes contact defect, a circuit including the capacitor malfunctions to cause the FeRAM to be defective.

SUMMARY

It is an aspect of the embodiments discussed herein to provide a semiconductor device including a semiconductor substrate, a base insulating film formed over the semiconductor substrate, a capacitor formed over the base insulating film by sequentially forming a lower electrode, a capacitor dielectric film formed of a ferroelectric material, and an upper electrode, an interlayer insulating film covering the capacitor, a first wiring formed over the interlayer insulating film, a single-layer first insulating film which covers the interlayer insulating film and the first wiring and has a first film thickness over the first wiring, a first capacitor protective insulating film formed over the first insulating film, a first cover insulating film which is formed over the first capacitor protective insulating film and has a second film thickness over the first wiring, the second film thickness being thicker than the first film thickness, a first hole formed in the first cover insulating film, the first capacitor protective insulating film, and the first insulating film, over the first wiring, a first conductive plug which is formed in the first hole and is electrically connected to the first wiring, and a second wiring which is formed over the first cover insulating film and is electrically connected to the first conductive plug.

BRIEF DESCRIPTION OF THE DRAWINGS

FIGS. 1A to 1Z and 2A to 2K are cross-sectional views showing processes of manufacturing a semiconductor device that has been previously thought by the inventors.

FIG. 7 is enlarged cross-sectional views of the semiconductor device according to the second embodiment and a semiconductor device of a comparative example in which a cap insulating film is formed, respectively.

DETAILED DESCRIPTION OF THE EMBODIMENTS

Figure 1C:
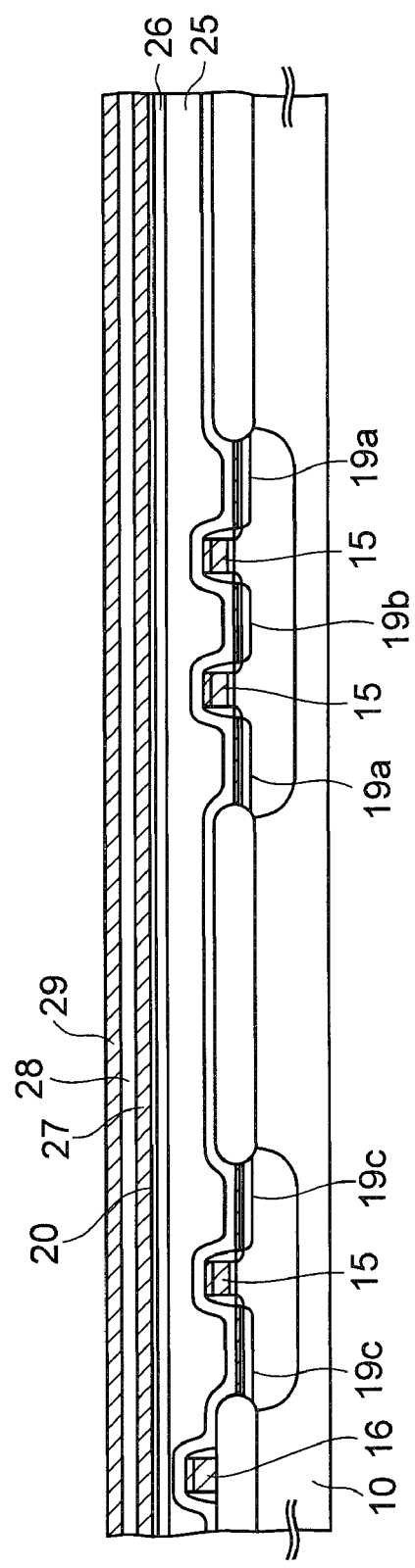

Embodiments of the present semiconductor device and manufacturing method thereof will be described below in detail by referring to the accompanied drawings.

(1) Preliminary Explanation

Before explaining the present embodiment, a preliminary explanation will be given.

In a ferroelectric capacitor provided to a FeRAM, a material used for the ferroelectric film is a ferroelectric oxide with a perovskite structure, such as a $PZT(Pb(Zr,Ti)O_3)$ film or $SBT(SrBi_2Ta_2O_9)$, whose residual polarization charge amount are as high as approximately 10 $\mu C/cm^2$ to 30 $\mu C/cm^2$. When the ferroelectric oxide is exposed to reductants such as hydrogen or moisture, oxygen in the film is reduced to cause the shortage of oxygen. Thus, the ferroelectric characteristic of the ferroelectric capacitor, such as the residual polarization charge amount, is deteriorated.

A silicon oxide film is frequently used as an interlayer insulating film. The silicon oxide film has high hydrophilicity and contains relatively plenty of moisture in the film. The moisture is decomposed into hydrogen and oxygen by heat generated, for example, when an interlayer insulating film or a metal wiring is formed. Then, when the hydrogen comes in contact with the capacitor dielectric film, the capacitor dielectric film is deteriorated as described above. In addition, the capacitor dielectric film is deteriorated by hydrogen penetrated from the outside thereof not only during the process but also during continuous usage of a FeRAM for a long period of time.

For this reason, to protect the ferroelectric film from the above-described reductants, a capacitor protective insulating film such as an alumina film is formed in the FeRAM. The capacitor protective insulating film has a function to prevent reductants from coming in contact with the ferroelectric film, and is formed, for example, between upper and lower wirings.

A semiconductor device including such a capacitor protective insulating film formed of alumina will be described by following the manufacturing processes thereof.

FIGS. 1A to 1Z and 2A to 2K are cross-sectional views showing processes of manufacturing a semiconductor device that has been previously thought by the inventors.

This semiconductor device is a planer-type FeRAM. In the planer-type FeRAM, a contact region is provided in a lower electrode of a capacitor, and a voltage is applied from a metal wiring over the contact region to the lower electrode. This planer-type FeRAM is manufactured as follows.

Firstly, processes for obtaining a cross-sectional structure shown in FIG. 1A will be described.

A surface of an n-type or p-type silicon (semiconductor) substrate 10 is thermally oxidized to form a device isolation insulating film 11. This device isolation insulating film 11 defines active regions of transistors. Such a device isolation structure is referred to as a local oxidation of silicon (LOCOS). In place of this, shallow trench isolation (STI) may be employed.

Subsequently, a p-type impurity, for example boron, is introduced into the active regions of the silicon substrate 10 to form first and second p-wells 12 and 13. Thereafter, the surfaces of the active regions are thermally oxidized to form thermally-oxidized films to be gate insulating films 14 with a thickness of approximately 6 nm to 7 nm.

After that, an amorphous silicon film with a thickness of approximately 50 nm and a tungsten silicide film with a thickness of approximately 150 nm will be sequentially formed on the entire upper surface of the silicon substrate 10. Here, a polycrystal silicon film may be formed in place of the amorphous silicon film. Thereafter, the amorphous silicon film and the tungsten silicide film are patterned by photolithography, so that gate electrodes 15 are formed on the silicon substrate 10, and a wiring 16 is formed on the device isolation insulating film 11.

Furthermore, phosphorus is introduced, as an n-type impurity, into the silicon substrate 10 beside the gate electrodes 15 by ion implantation using the gate electrodes 15 as a mask. Thereby, first to third source/drain extensions 17a to 17c are formed.

After that, an insulating film is formed on the entire upper surface of the silicon substrate 10. Then, the insulating film is etched back to be left as insulating spacers 18 beside the gate electrodes 15 and the wiring 16. For example, a silicon oxide film is formed as the insulating film by CVD method.

Subsequently, by using the insulating spacers 18 and the gate electrodes 15 as a mask, the ion implantation is carried out again to introduce an n-type impurity, such as arsenic, into the silicon substrate 10. Thereby, first to third source/drain regions 19a to 19c are formed on the silicon substrate 10 beside the gate electrodes 15.

Furthermore, a refractory metal film, such as a cobalt film, is formed on the entire upper surface of the silicon substrate 10 by a sputtering method. Then, the refractory metal film is heated, and thereby caused to react with silicon. Accordingly, a refractory metal silicide layer 22, such as a cobalt silicide layer, is formed in the first to third source/drain regions 19a to 19c on the silicon substrate 10. Thereby, resistance of each of the source/drain regions 19a to 19c is lowered. Note that such a refractory metal silicide layer is also formed on surface layers of the gate electrodes 15 and the wiring 16.

Thereafter, the refractory metal layer left unreacted on the device isolation insulating film 11 and the like is removed by wet etching.

With the processes described so far, first to third MOS transistors $TR_1$ to $TR_3$, each of which is formed of the gate insulating film 14, the gate electrode 15, at least one of the first to third source/drain regions 19a to 19c, and the like, are formed in active regions of the silicon substrate 10.

Among these transistors, the first and second MOS transistors $TR_1$ and $TR_2$ are formed in a cell region, and the gate electrodes 15 of the transistors are formed so as to be parallel to each other and configure a part of a ward line. On the other hand, the third MOS transistor $TR_3$ is formed in a peripheral circuit region.

Next, as shown in FIG. 1B, a silicon oxynitride (SiON) film is formed with a thickness of approximately 200 nm on the entire upper surface of the silicon substrate 10 by a plasma CVD method. The silicon oxynitride (SiON) film is set to an etching stopper film 24.

Furthermore, a silicon oxide ($SiO_2$) film is formed as a base insulating film 25 with a thickness of approximately 600 nm on the etching stopper film 24, by the plasma CVD method using a tetraethoxysilane (TEOS) gas. Thereafter, the upper surface of the base insulating film 25 is polished, so as to be planarized, by means of a chemical mechanical polishing (CMP) method. The amount of this polishing is, for example, approximately 200 nm.

After that, by the plasma CMP method using the TEOS gas, a silicon oxide film with a thickness of approximately 100 nm is formed again on the base insulating film 25. The resultant silicon oxide film is set to a cap insulating film 26.

Then, annealing with a substrate temperature of approximately 650° C. is carried out in a nitrogen atmosphere for approximately 30 minutes, as dehydration processing of these insulating films 25 and 26. Thereafter, a first alumina film 20 is formed with a thickness of approximately 20 nm on the cap insulating film 26 by the sputtering method.

Next, processes for obtaining a cross-sectional structure shown in FIG. 1C will be described.

Firstly, a platinum film is formed as a first conductive film 27 on the first alumina film 20 by the sputtering method. This first conductive film 27 is later patterned into a capacitor lower electrode with a film thickness of approximately 155 nm.

Furthermore, a PZT film is formed with a thickness of 150 nm to 200 nm on the first conductive film 27 by the sputtering method. This PZT film is used as a ferroelectric film 28.

As a method for forming the ferroelectric film 28, there are a metal organic CVD (MOCVD) method and a sol-gel method, in addition to the sputtering method. Furthermore, a material of the ferroelectric film 28 is not limited to the above-described PZT, and it may be formed of Bi layer structure compounds, such as $SrBi_2Ta_2O_9$, $SrBi_2(Ta_xNb_{1-x})_2O_9$, or $Bi_4Ti_2O_{12}$. Moreover, the ferroelectric film 28 may be formed of $PLZT(Pb_{1-x}La_xZr_{1-y}Ti_yO_3)$, which is formed by doping lanthanum into PZT, or other metal oxide ferroelectrics.

Here, the PZT formed by the sputtering method is hardly crystallized just after being formed, and has therefore poor ferroelectric characteristics. For this reason, as crystallization annealing for crystallizing PZT constituting the ferroelectric film 28, rapid thermal anneal (RTA) is carried out. This RTA is performed with a substrate temperature of approximately 585° C. for approximately 90 seconds in an atmosphere containing oxygen. Note that, when the ferroelectric film 28 is formed by the MOCVD method, this crystallization annealing is not needed.

Subsequently, a first iridium oxide ($IrO_2$) film is formed with a thickness of approximately 50 nm on the above-described ferroelectric film 28 by the sputtering method. Then, RTA is carried out on this first iridium oxide film. The conditions for the RTA are not particularly limited. In the present embodiment, the RTA is carried out in the atmosphere containing oxygen with a substrate temperature of 725° C. for the processing time of 20 seconds.

Thereafter, a second iridium oxide film is formed with a thickness of approximately 200 nm on the first iridium oxide film by the sputtering method. Then, a laminated film formed of these first and second iridium oxide films is used as a second conductive film 29.

Here, by forming the first conductive film 27 on the first alumina film 20, the orientation of platinum constituting the first conductive film 27 becomes preferable when compared with the case where the first conductive film 27 is directly formed on the first cap insulating film 26 without the first alumina film 20. The orientation of the first conductive film 27 has an effect to align the orientation of the PZT constituting the ferroelectric film 28. As a result, the ferroelectric characteristics of the ferroelectric film 28 are improved.

Figure 1D:
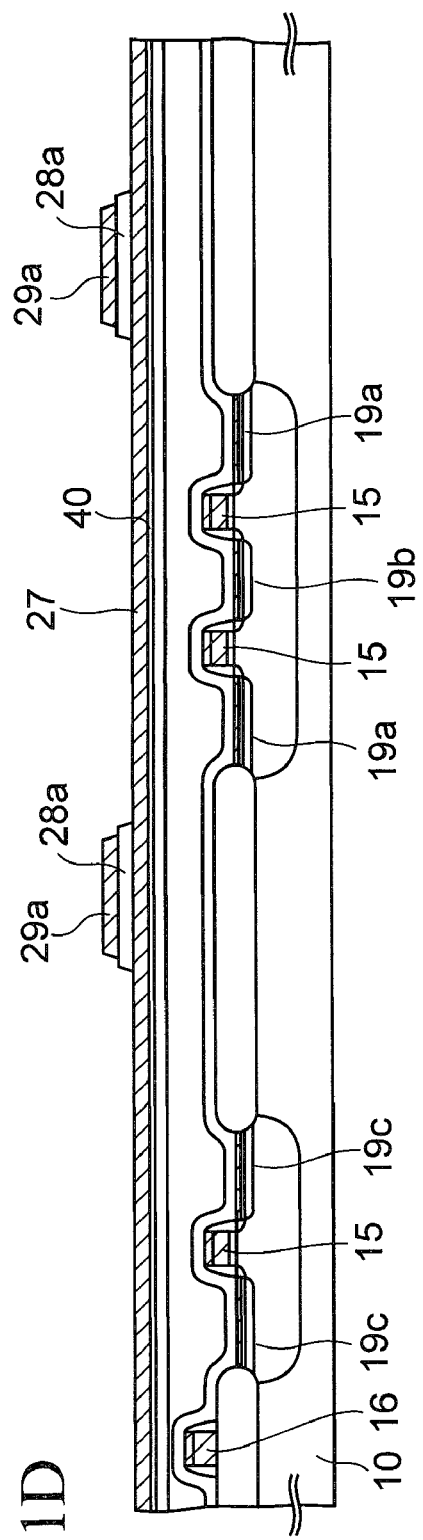

Next, processes for obtaining a cross-sectional structure shown in FIG. 1D will be described.

Firstly, the second conductive film 29 is patterned by photolithography to form an upper electrode 29a. Then, to recover damages received in the ferroelectric film 28 due to this patterning, a first recovery annealing is carried out on the ferroelectric film 28 in a vertical furnace. This recovery annealing is carried out in the atmosphere containing oxygen under conditions, for example, with a substrate temperature of 650° C. and a processing time of 60 minutes.

Subsequently, the ferroelectric film 28 is patterned by photolithography to form a capacitor dielectric film 28a formed of a ferroelectric material such as PZT. The damages received in the capacitor dielectric film 28a by this patterning are recovered by a second recovery annealing. This second recovery annealing is carried out in the atmosphere containing oxygen in a vertical furnace, like the first recovery annealing. For example, it is carried out under conductions with a substrate temperature of 350° C. and a processing time of 60 minutes.

Next, as shown in FIG. 1E, a second alumina film 31 is formed with a thickness of approximately 50 nm on the entire upper surface of the silicon substrate 10 by the sputtering method. This second alumina film is formed for the purpose of protecting the capacitor dielectric film 28a from reductants, such as hydrogen and moisture. Then, to recover damages received in the capacitor dielectric film 28a by the sputtering, a third recovery annealing is carried out in the atmosphere containing oxygen with a substrate temperature of 550° C. for approximately 60 minutes. This third recovery annealing is carried out in a vertical furnace, like the first and second recovery annealing.

Next, as shown in FIG. 1F, the first conductive film 27 and the second alumina film 31 are patterned by photolithography. Thereby, the first conductive film 27 under the capacitor dielectric film 28a is made into a lower electrode 27a, and the second alumina film 31 is left in such a manner as to cover the lower electrode 27a.

Thereafter, to recover damages received in the capacitor dielectric film 28a during the process, a fourth recovery annealing is carried out on the capacitor dielectric film 28a in the atmosphere containing oxygen under conditions with a substrate temperature of 550° C. and a processing time of 60 minutes. The recovery annealing is carried out by using, for example, a vertical furnace.

With the processes described so far, capacitors Q are formed in the cell region on the silicon substrate 10, each of which is formed by laminating the lower electrode 27a, the capacitor dielectric film 28a, and the upper electrode 29a in this order.

Figure 1G:
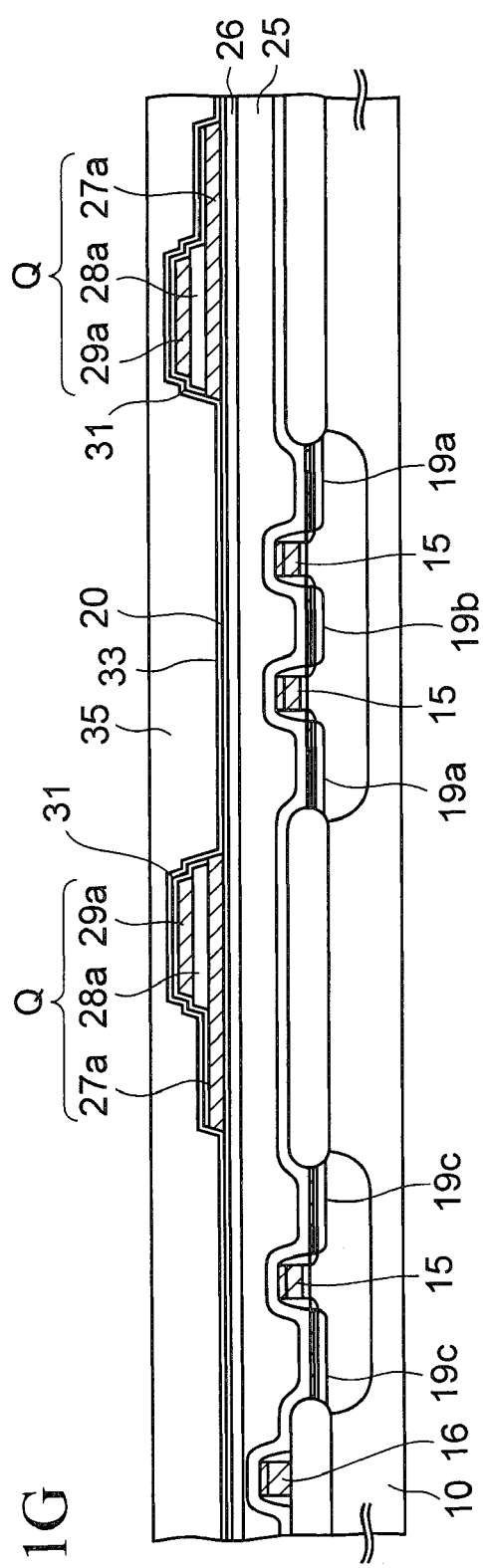

Next, as shown in FIG. 1G, a third alumina film 33 for protecting the capacitor dielectric film 28a is formed with a thickness of approximately 20 nm on the entire upper surface of the silicon substrate 10 by the sputtering method. This third alumina film 33, together with the second alumina film 31 thereunder, prevents reductants, such as hydrogen and moisture, from coming in contact with the capacitor dielectric film 28a, thereby functioning to suppress deterioration of ferroelectric characteristics of the capacitor dielectric film 28a due to reduction thereof.

After that, under conditions with a substrate temperature of 550° C. and a processing time of 60 minutes, s fifth recovery annealing is carried out on the capacitor dielectric film 28a in a vertical furnace filled with the atmosphere containing oxygen.

Then, a silicon oxide film is formed with a thickness of approximately 1500 nm on the above-described third alumina film 33 by the plasma CVD method using the TEOS gas. This silicon oxide film is used as an interlayer insulating film 35. Thereafter, the upper surface of the interlayer insulating film 35 is polished and planarized by the CMP method.

Figure 1H:
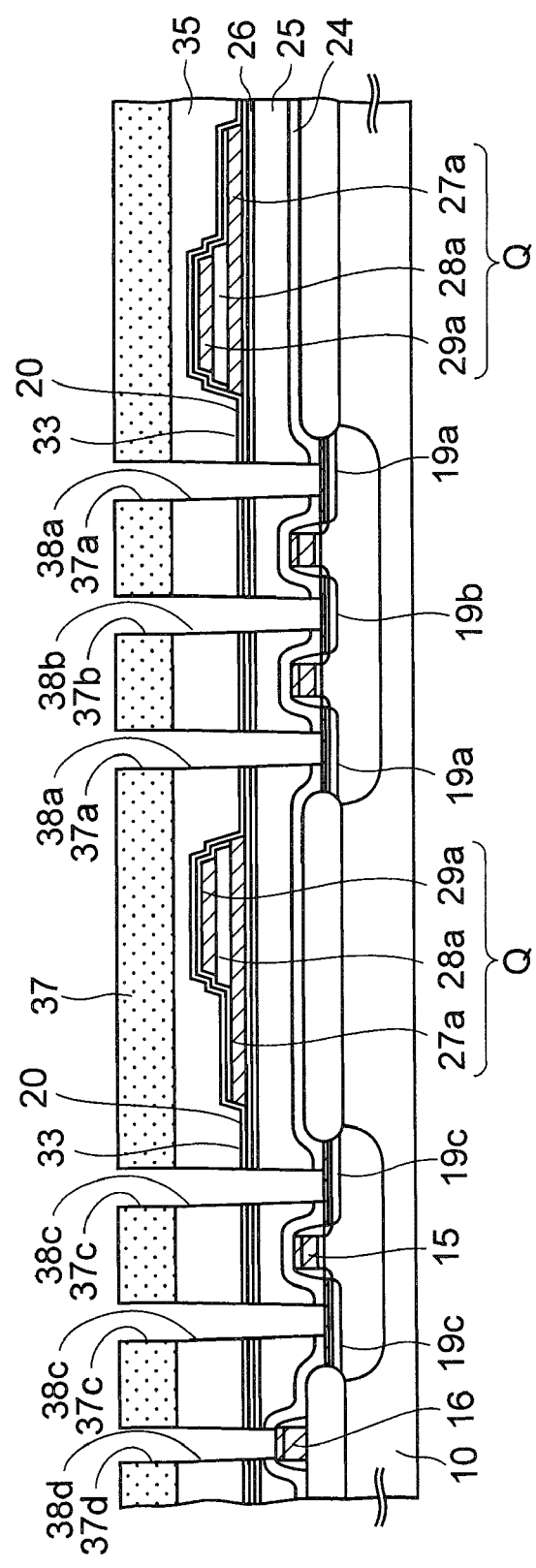

Next, processes for obtaining a cross-sectional structure shown in FIG. 1H will be described.

Firstly, the interlayer insulating film 35 is coated with a photoresist. The photoresist is then exposed and developed to form a first resist pattern 37. As illustrated, the first resist pattern 37 includes hole-shaped first to third windows 37a to 37c over the first to third source/drain regions 19a to 19c, respectively, and a fourth window 37d over the wiring 16.

Subsequently, dry etching is carried out on layers from the interlayer insulating film 35 to the etching stopper film 24 by using the first resist pattern 37 as a mask. Thereby, first to fourth contact holes 38a to 38d are formed in these insulating films respectively under the first to fourth windows 37a to 37d.

This dry etching is carried out in a parallel plate-type plasma etching equipment (unillustrated) in three steps. In the first step of the etching, a mixed gas of $C_4F_8$, $O_2$, and Ar is used as an etching gas so as to etch the layers from the interlayer insulating film 35 to the base insulating film 25. This etching stops on the etching stopper film 24, and the etching stopper film 24 is not etched here.

In the second step, a mixed gas of $O_2$ and Ar is used as an etching gas to remove an etching product generated in the holes during the first step by using a sputtering effect of the mixed gas.

Then, in the third step of the etching, a mixed gas of $C_4F_8$, $CF_4$, $O_2$, and Ar is used as an etching gas to etch the etching stopper film 24.

After the above-described etching is finished, the first resist pattern 37 is removed.

Figure 1I:
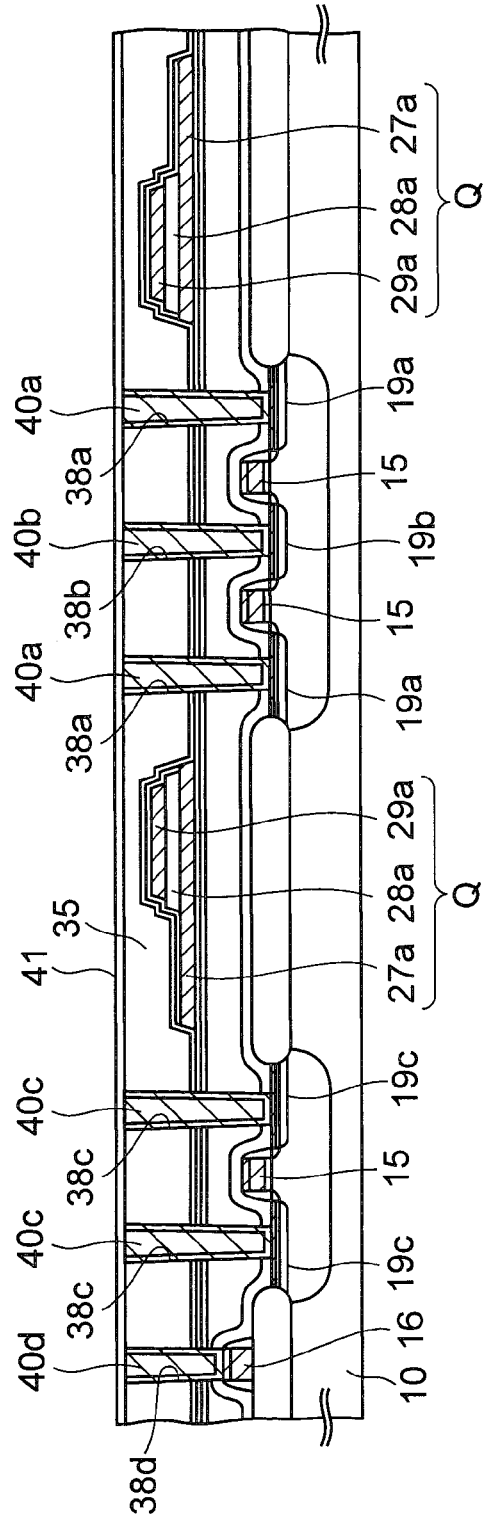

Next, processes for obtaining a cross-sectional structure shown in FIG. 1I will be described.

Firstly, a titanium (Ti) film with a thickness of 20 nm and a titanium nitride (TiN) film with a thickness of 50 nm are formed on the inner surfaces of the first to fourth holes 38a to 38d and the upper surface of the interlayer insulating film 35 by the sputtering method. These films are used as a glue film. Then, a tungsten film is formed on the glue film by the CVD method using a tungsten hexafluoride gas, and this tungsten film is completely embedded in the first to fourth holes 38a to 38d.

Thereafter, the excessive glue film and tungsten film on the interlayer insulating film 35 are polished and removed by the CMP method. The glue film and the tungsten film left in the first to fourth holes 38a to 38d are used as first to fourth conductive plugs 40a to 40d, respectively.

Among these conductive plugs, the first to third conductive plugs 40a to 40c are electrically connected to the first to third source/drain regions 19a to 19c, respectively. In addition, the fourth conductive plug 40d is electrically connected to the wiring 16 thereunder.

Incidentally, the first to fourth conductive plugs 40a to 40d are mainly formed of tungsten which is oxidized very easily. For this reason, contact defect may possibly occur in the atmosphere containing oxygen.

Accordingly, to protect the first to fourth conductive plugs 40a to 40d from being oxidized, a silicon oxynitride film is formed by the CVD method as an oxidation preventive insulating film 41 on the upper surfaces of these plugs and interlayer insulating film 35.

Figure 1J:
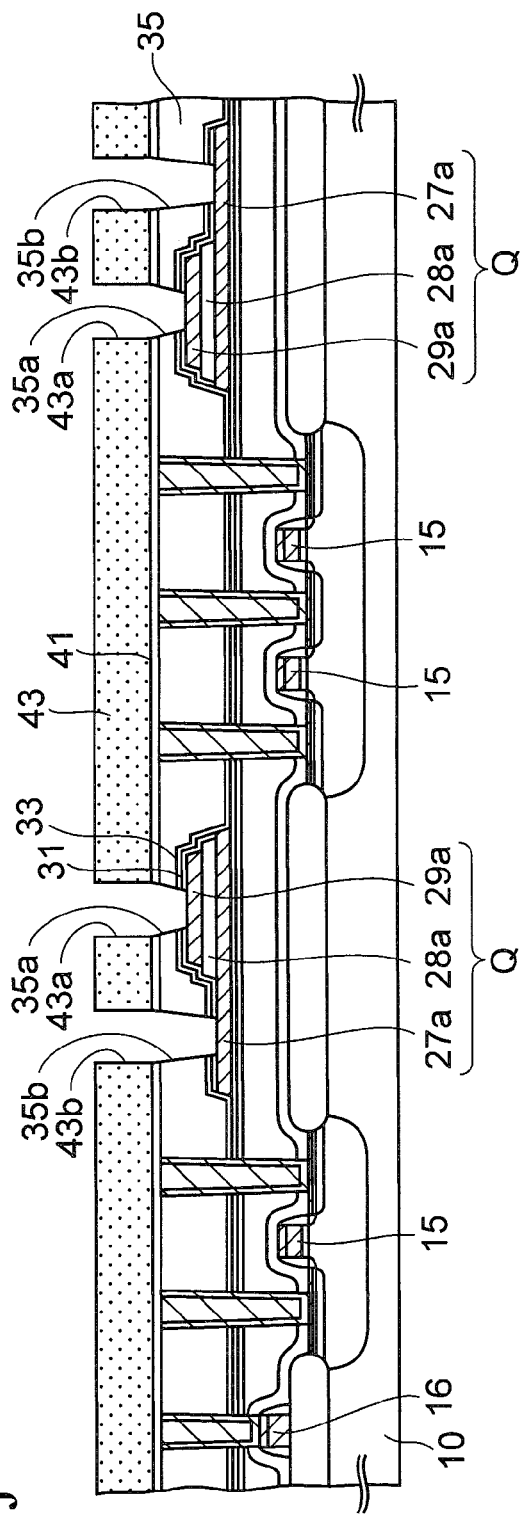

Next, processes for obtaining a cross-sectional structure shown in FIG. 1J will be described.

Firstly, the oxidation preventive insulating film 41 is coated with a photoresist. The photoresist is then exposed and developed to be a second resist pattern 43. As illustrated, hole-shaped fifth and sixth windows 43a and 43b are formed in the second resist pattern 43 respectively over the upper and lower electrodes 29a and 27a.

Subsequently, while using the second resist pattern 43 as a mask, the oxidation preventive insulating film 41, the interlayer insulating film 35, and the second and third alumina films 31 and 33 are etched. Thereby, a first hole 35a is formed on the upper electrode 29a, and a second hole 35b is formed on the contact region of the lower electrode 27a.

Thereafter, to recover damages received in the capacitor dielectric film 28a during the processes so far, the silicon substrate 10 is placed in the vertical furnace with the atmosphere containing oxygen, and a sixth recovery annealing is carried out on the capacitor dielectric film 28a under conditions with a substrate temperature of 500° C. and a processing time of 60 minutes.

Then, the second resist pattern 43 is removed, and thereafter the oxidation preventive insulating film 42 is etched back and removed.

Next, processes for obtaining a cross-sectional structure shown in FIG. 1K will be described.

Firstly, a metal laminated film is formed by the sputtering method on the upper surfaces of the interlayer insulating film 35 and the first to fourth conductive plugs 40a to 40d and the inner surfaces of the first and second holes 35a and 35b. In the present embodiment, the metal laminated film is formed by laminating a titanium nitride film with a thickness of approximately 150 nm, a copper-containing aluminum film with a thickness of approximately 550 nm, a titanium film with a thickness of approximately 5 nm, and a titanium nitride film with a thickness of approximately 150 nm in this order.

Then, the metal laminated film is patterned by photolithography to form first layer metal wirings 45 on the interlayer insulating film 35. Among these first layer metal wirings 45, ones formed on the capacitor Q are electrically connected to the upper and lower electrodes 29a and 27a through the above-described first and second holes 35a and 35b, respectively.

Thereafter, the interlayer insulating film 35 is dehydrated by carrying out annealing under conditions with a substrate temperature of 350° C., a $N_2$ flow rate of 20 liters per minute, and a processing time of 30 minutes, by using, for example, the vertical furnace with the nitrogen atmosphere.

Next, as shown in FIG. 1L, an alumina film is formed by the sputtering method as a first capacitor protective insulating film 46 which covers the first layer metal wirings 45 and the interlayer insulating film 35.

The first capacitor protective insulating film 46 has a function to protect the capacitor dielectric film 28a by blocking reductants, such as hydrogen and moisture. Films having such function include a titanium oxide film, a silicon nitride film, and a silicon oxynitride film, in addition to the alumina film. A single layer or a laminated film formed of these films may be formed as the first capacitor protective insulating film 46. Note that among these films, the alumina film and the titanium oxide film are the best in terms of the blocking function against the reductants. Thus, it is preferable that the alumina film or the titanium oxide film be used as the first capacitor protective insulating film 46.

Figure 1M:
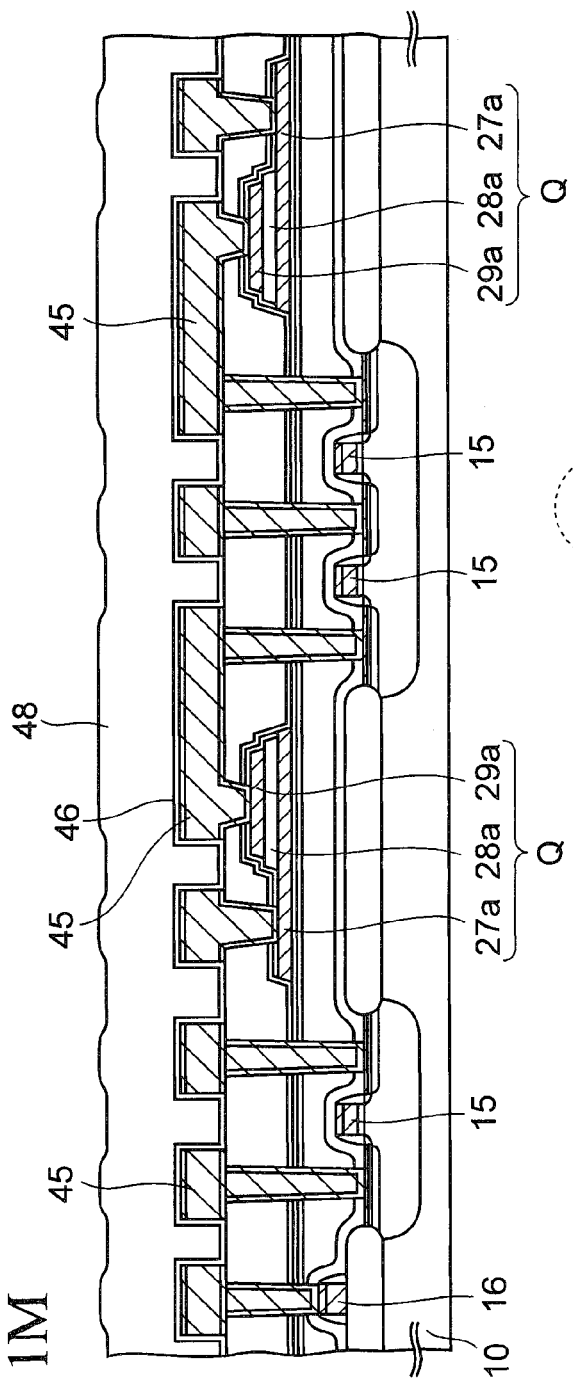

Next, as shown in FIG. 1M, a silicon oxide film is formed on the first capacitor protective insulating film 46 by the plasma CVD method using the TEOS gas and an $O_2$ gas as reactant gases. The resultant silicon oxide film is used as a first insulating film 48. Note that in the CVD method, an $O_3$ gas may be used in place of the $O_2$ gas. In addition, the film thickness of the first insulating film 48 is, for example, approximately 2600 nm on the first layer metal wirings 45.

On the upper surface of the first insulating film 48, unevenness is formed reflecting the shapes of the underlying first layer metal wirings 45. When such unevenness is present, it becomes difficult to form a multilayer wiring structure on the first insulating film 48.

Figure 1N:
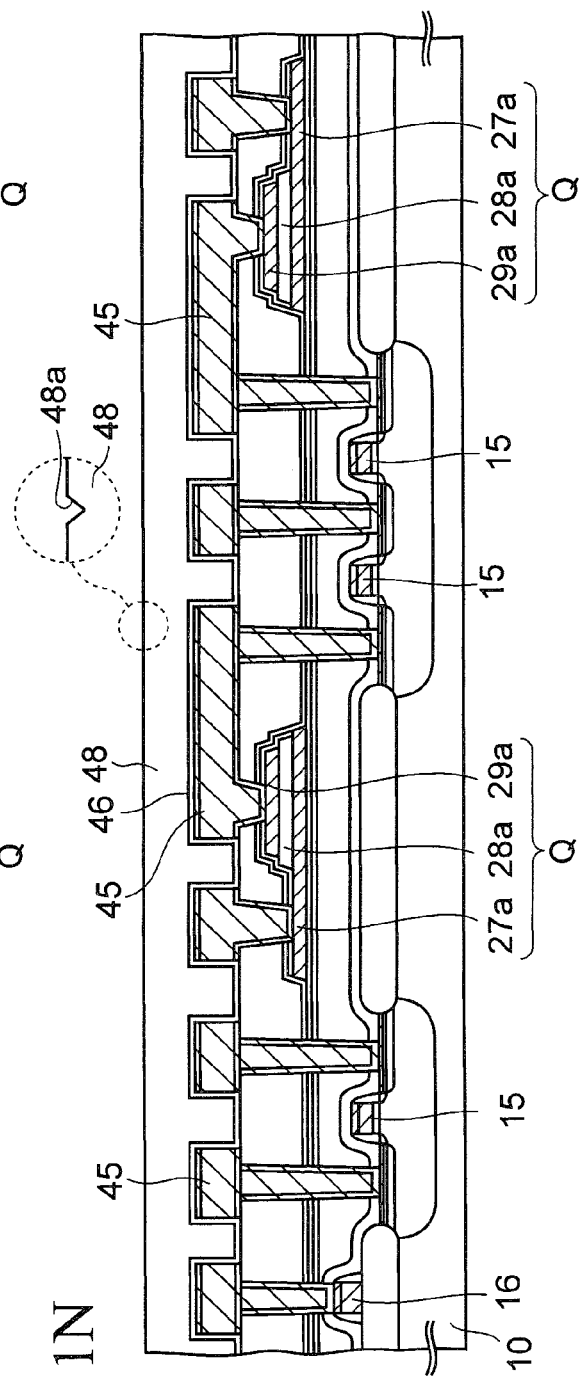

To deal with this problem, in the next process, as shown in FIG. 1N, the upper surface of the first insulating film 48 is polished and planarized by the CMP method. By this CMP, the thickness of the first insulating film 48 becomes approximately 1000 nm on the first layer metal wirings 45.

It is ideal that the surface of the first insulating film 48 be completely planarized by the CMP. However, in reality, a fine scar 48a (see, inside the dotted-line circle), referred to as a micro scratch, is formed on the surface of the first insulating film 48 due to a scar unnecessarily formed on the surface of a polishing pad (unillustrated).

Next, as shown in FIG. 1O, $N_2O$ plasma processing is carried out on the surface of the first insulating film 48 in a CVD equipment under conditions with a substrate temperature of approximately 350° C. and a processing time of approximately four minutes. The first insulating film 48 is thus dehydrated and the surface thereof is nitrided by the $N_2O$ plasma processing. Thus, silicon oxide with high hydrophilicity is prevented from absorbing moisture.

Note that, as shown in FIG. 1N, the fine scar 48a formed during CMP is still present on the surface of the first insulating film 48. When a thin film is formed on the first insulating film 48 with such scar 48a being present, the thickness of the thin film becomes thin on the sides of the scar 48a. Thus, the thin film cannot be formed with excellent coverage.

To deal with this problem, in the next process, as shown in FIG. 1P, a silicon oxide film is formed with a thickness of approximately 100 nm on the first insulating film 48 as a cap insulating film 49 by the plasma CVD method using the TEOS gas. Thereby, the scar 48a is completely embedded by the cap insulating film 49.

Next, as shown in FIG. 1Q, the $N_2O$ plasma processing is carried out again in a CVD equipment in order to dehydrate the cap insulating film 49 and to nitride the surface of the cap insulating film 49 so as to prevent the cap insulating film 49 from resorbing moisture. The $N_2O$ plasma processing is carried out under conditions with, for example, a substrate temperature of 350° C. and a processing time of two minutes.

Next, as shown in FIG. 1R, to prevent reductants contained in the outer atmosphere, such as hydrogen and moisture, from coming in contact with the capacitor dielectric film 28a, an alumina film with excellent blocking capability against these reductants is formed with a thickness of approximately 50 nm on the cap insulating film 49, by the sputtering method. The resultant alumina film is used as a second capacitor protective insulating film 50.

The second capacitor protective insulating film 50 is not limited to the alumina film. Like the first capacitor protective insulating film 46, the second capacitor protective insulating film 50 may be formed of a single layer or laminated layer of an alumina film, a titanium oxide film, a silicon nitride film, and a silicon oxynitride film.

As described above, the scar 48a formed on the first insulating film 48 by CMP is completely embedded by the cap insulating film 49 before the second capacitor protective insulating film 50 is formed. Accordingly, the second capacitor protective insulating film 50 can be evenly formed with a thickness of as thin as approximately 50 nm on the cap insulating film 49.

In contrast, if the second capacitor protective insulating film 50 is formed on the first insulating film 48 without forming the cap insulating film 49, the thickness of the capacitor protective film 50 lacks on the sides of the scar 48a. This may possibly cause hydrogen and the like to come in contact with the capacitor dielectric film 28a from the sides.

Figure 1S:
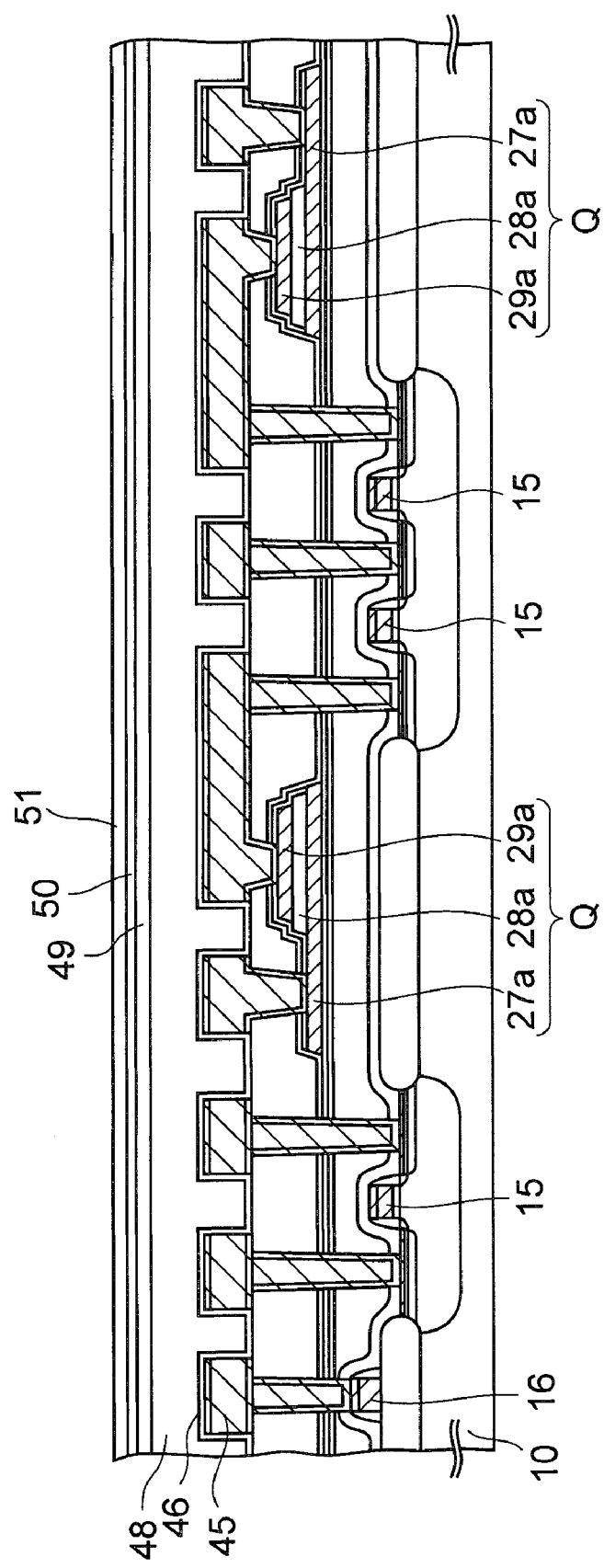

Next, as shown in FIG. 1S, a silicon oxide film is formed on the second capacitor protective insulating film 50 by the plasma CVD method using the TEOS gas. The resultant silicon oxide film is used as a first cover insulating film 51. The thickness of the first cover insulating film 51 is, for example, approximately 100 nm.

Figure 1T:
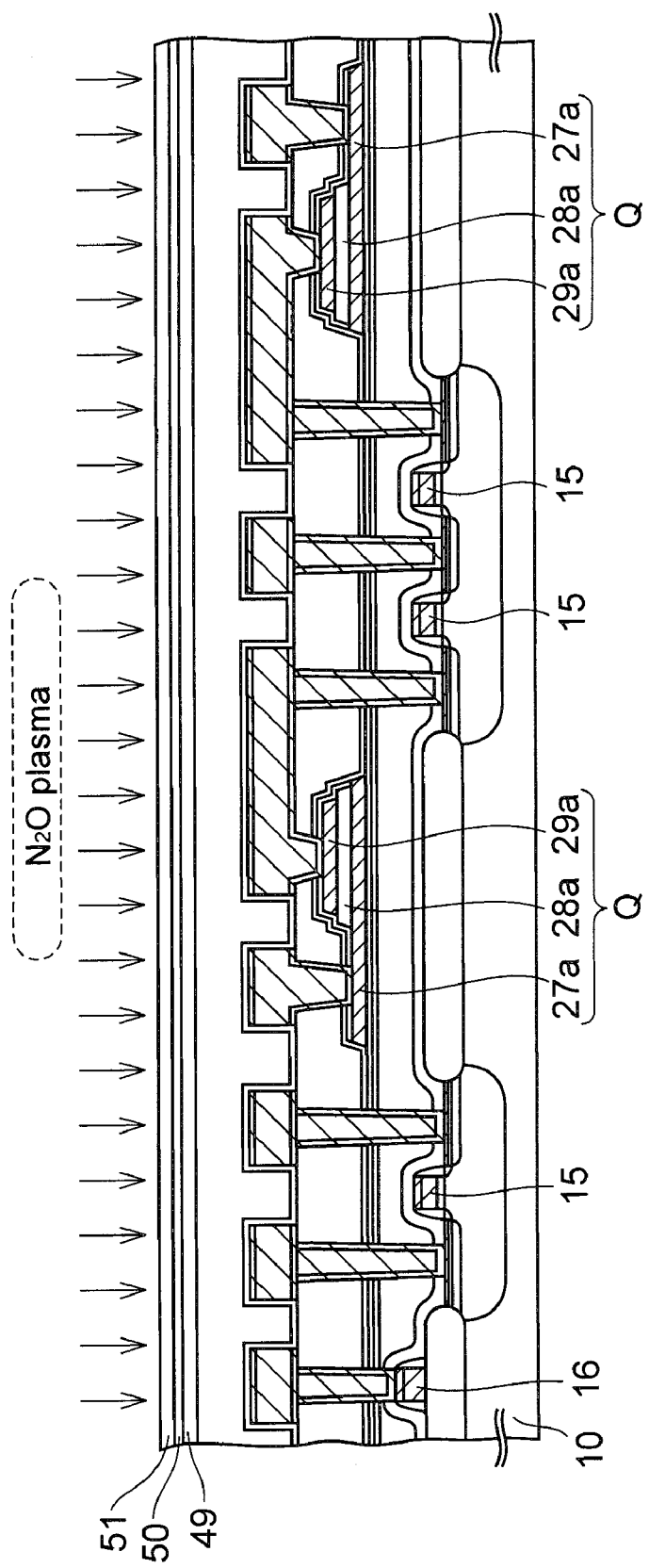

Next, as shown in FIG. 1T, $N_2O$ plasma processing is carried out on the first cover insulating film 51 under conditions with a substrate temperature of 350° C. and a processing time of two minutes. Thereby, the first cover insulating film 51 is dehydrated and the surface thereof is nitrided so as to prevent the first cover insulating film 51 from resorbing moisture. The $N_2O$ processing is carried out by using, for example, a CVD equipment.

Next, processes for obtaining a cross-sectional structure shown in FIG. 1U will be described.

Firstly, the first cover insulating film 51 is coated with a photoresist. The photoresist is then exposed and developed to form a third resist pattern 53 provided with hole-shaped seventh windows 53a over the first layer metal wirings 45.

Subsequently, the insulating films 46 and 48 to 51 under the seventh windows 53a are etched by using a parallel plate-type plasma etching chamber (unillustrated) using a mixed gas of $C_4F_8$, Ar, and $O_2$ as an etching gas. Thereby, third holes 54a are formed on the first layer metal wirings 45.

After this etching is finished, the third resist pattern 53 is removed.

Figure 1U:
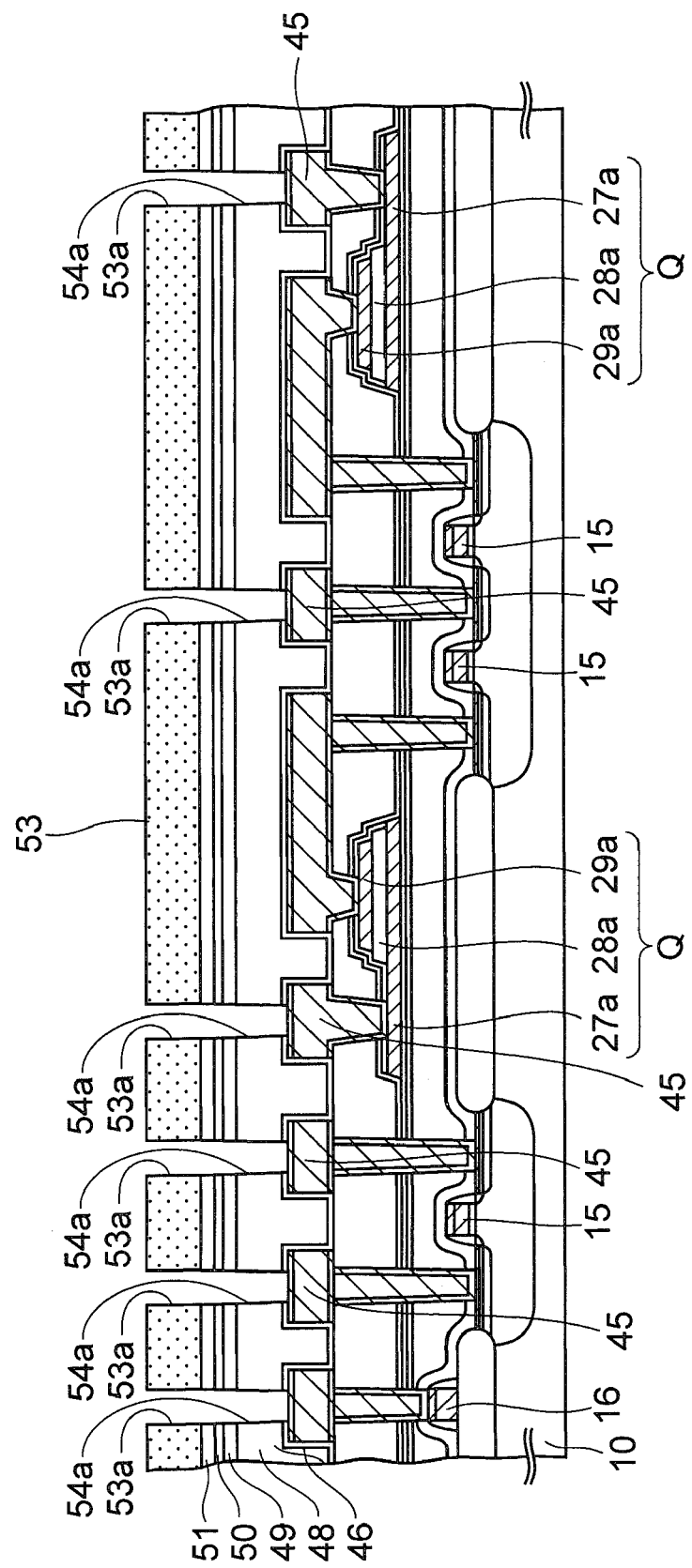
Figure 1V:
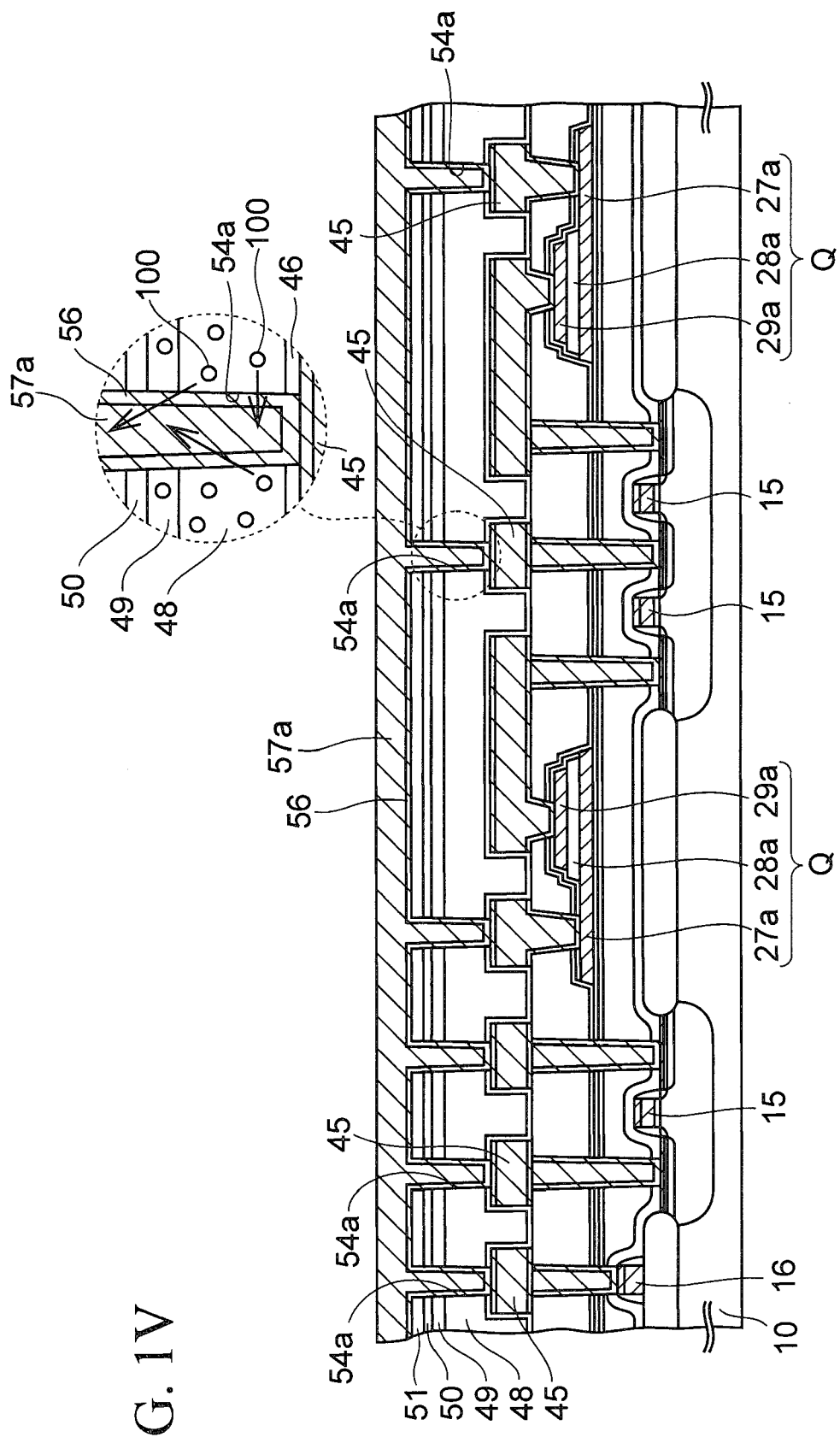

Next, as shown in FIG. 1V, while maintaining the substrate temperature at approximately 200° C., a titanium nitride film is formed with a thickness of approximately 150 nm on inner surfaces of the third holes 54a and on the upper surface of the third cap insulating film 51 by the sputtering method. The resultant film is used as a first glue film 56.

Subsequently, a tungsten film 57a is formed on the first glue film 56 with such a thickness that the third holes 54a are completely embedded, for example, a thickness of approximately 650 nm, by the plasma CVD method using a tungsten hexafluoride gas.

Here, when the tungsten film 57a is formed, the silicon substrate 10 is heated to approximately 430° C. Accordingly, such heat is also applied to the first insulating film 48 and the cap insulating film 49. As described above, the dehydration processing is carried out on these insulating films 48 and 49 by $N_2O$ plasma. However, the dehydration processing is not perfect, and thus small amount of moisture 100 is residual in these insulating films 48 and 49, as shown in the inside of the dotted-line circle in the drawing.

The residual moisture 100 in the insulating films 48 and 49 is vaporized by the heat applied when the above-described first glue film 56 or the tungsten film 57a is formed. However, the second capacitor protective insulating film 50 prevents the vaporized moisture from upwardly escaping. Accordingly, moisture inevitably escapes to the outside through the third holes 54a.

The moisture thus coming out from the third holes 54a causes some of the third holes 54a to be incompletely embedded with the first glue film 56 or the tungsten film 57a.

Figure 1W:
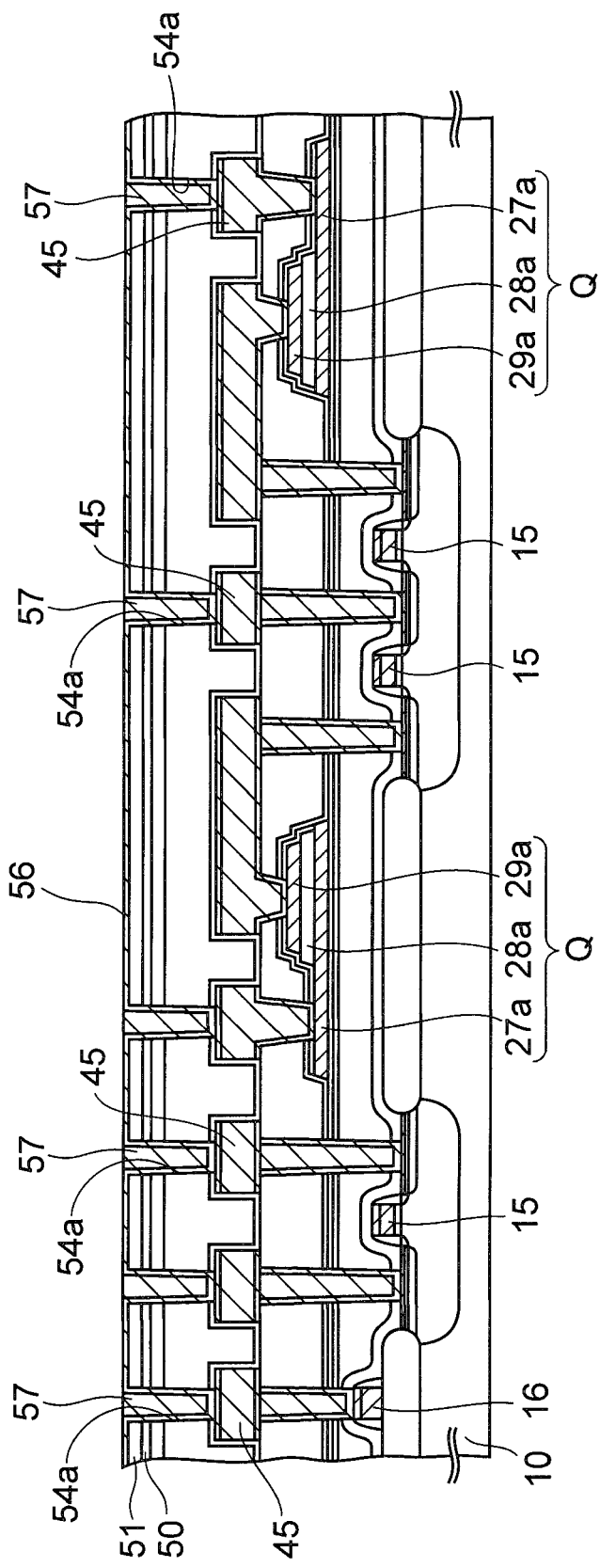

Next, as shown in FIG. 1W, the above-described tungsten film 57a is etched back and removed from the upper surface of the first cover insulating film 51 to be left only in the third holes 53a. With this, fifth conductive plugs 57 are formed in the third holes 54a. The fifth conductive plugs are electrically connected to the first layer metal wirings 45, and are formed of tungsten.

Note that the tungsten film is etched back in the present example, but CMP may be employed in place of etching back.

Next, processes for obtaining a cross-sectional structure shown in FIG. 1X will be described.

Firstly, a metal laminated film is formed on the upper surfaces of the above-described fifth conductive plugs 57 and the first glue film 56 by the sputtering method. The metal laminated film is formed of, for example, a copper-containing aluminum film with a thickness of approximately 550 nm, a titanium film with a thickness of approximately 5 nm, and a titanium nitride film with a thickness of approximately 150 nm in this order.

Thereafter, this metal laminated film and the first glue film 56 are patterned by photolithography to form, on the first cover insulating film 51, second layer metal wirings 58 formed of these films.

In this patterning, the metal laminated film and the first glue film 56 are over-etched in order not to leave residual films of etching on the first cover insulating film 51. Since the second capacitor protective insulating film 50 is covered with the first cover insulating film 51, the thickness of the second capacitor protective insulating film 50 is prevented from being thinned due to etching at the time of the patterning even when the over etching is carried out. Accordingly, the thickness of the second capacitor protective insulating film 50 can be sufficiently maintained, and the reductants, such as hydrogen, can be effectively blocked by the second capacitor protective insulating film 50 even after the above-described patterning is finished.

Note that, as described above, the first capacitor protective insulating film 46 is formed on the first layer metal wirings 45 so that the reductants, such as hydrogen, are prevented from coming in contact with the capacitor dielectric film 28a.

In contrast, the second layer metal wirings 58 are far from the capacitor Q, and the first and second capacitor protective insulating films 46 and 50 are formed thereunder. Accordingly, even when a film is formed on the second layer metal wirings 58 by the plasma CVD, hydrogen hardly comes in contact with the capacitor Q. Thus, a capacitor protective insulating film is not needed to be formed on the second layer metal wirings 58.

Figure 1X:
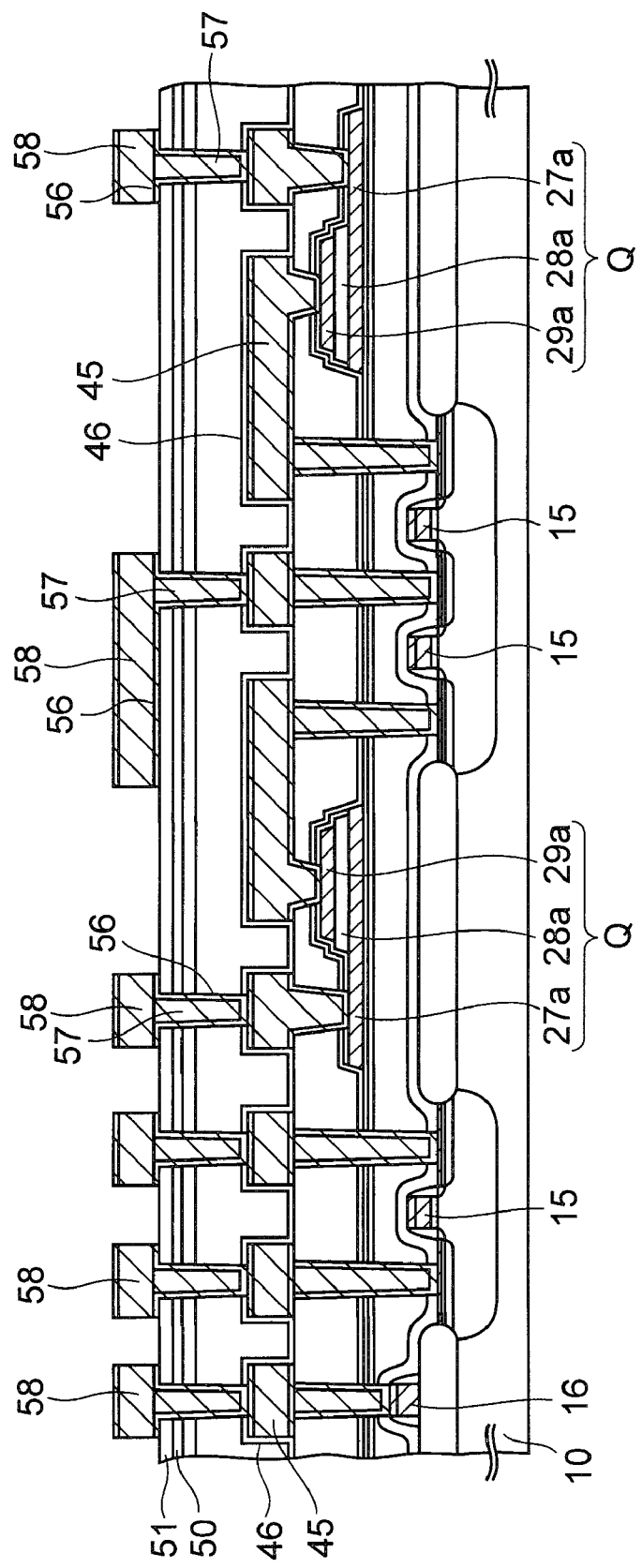
Figure 1Y:
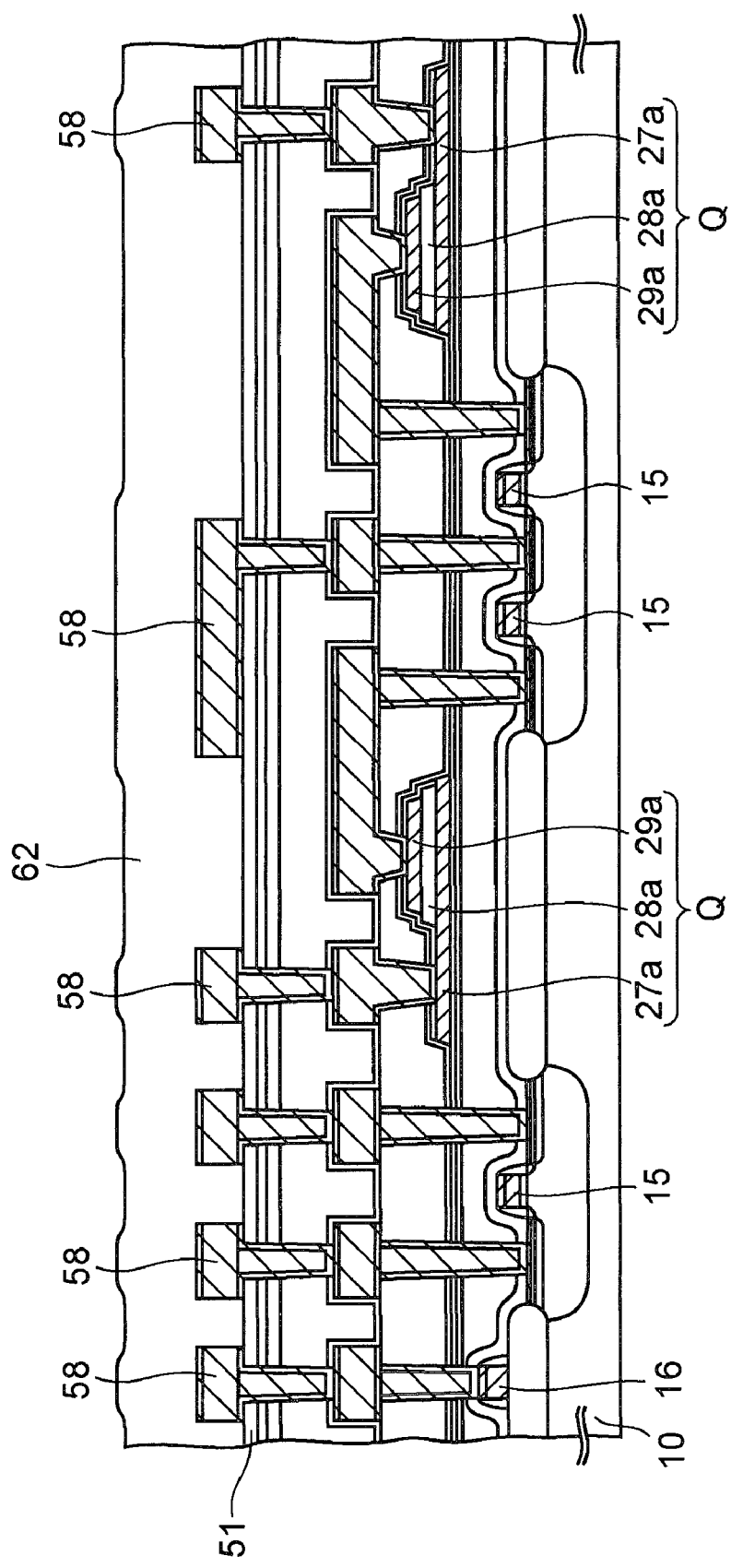

Next, as shown in FIG. 1Y, a silicon oxide film is formed with a thickness of approximately 2200 nm on the first cover insulating film 51 and the second layer metal wirings 58 by the plasma CVD method using the TEOS gas. The resultant film is used as a second insulating film 62.

Figure 1Z:
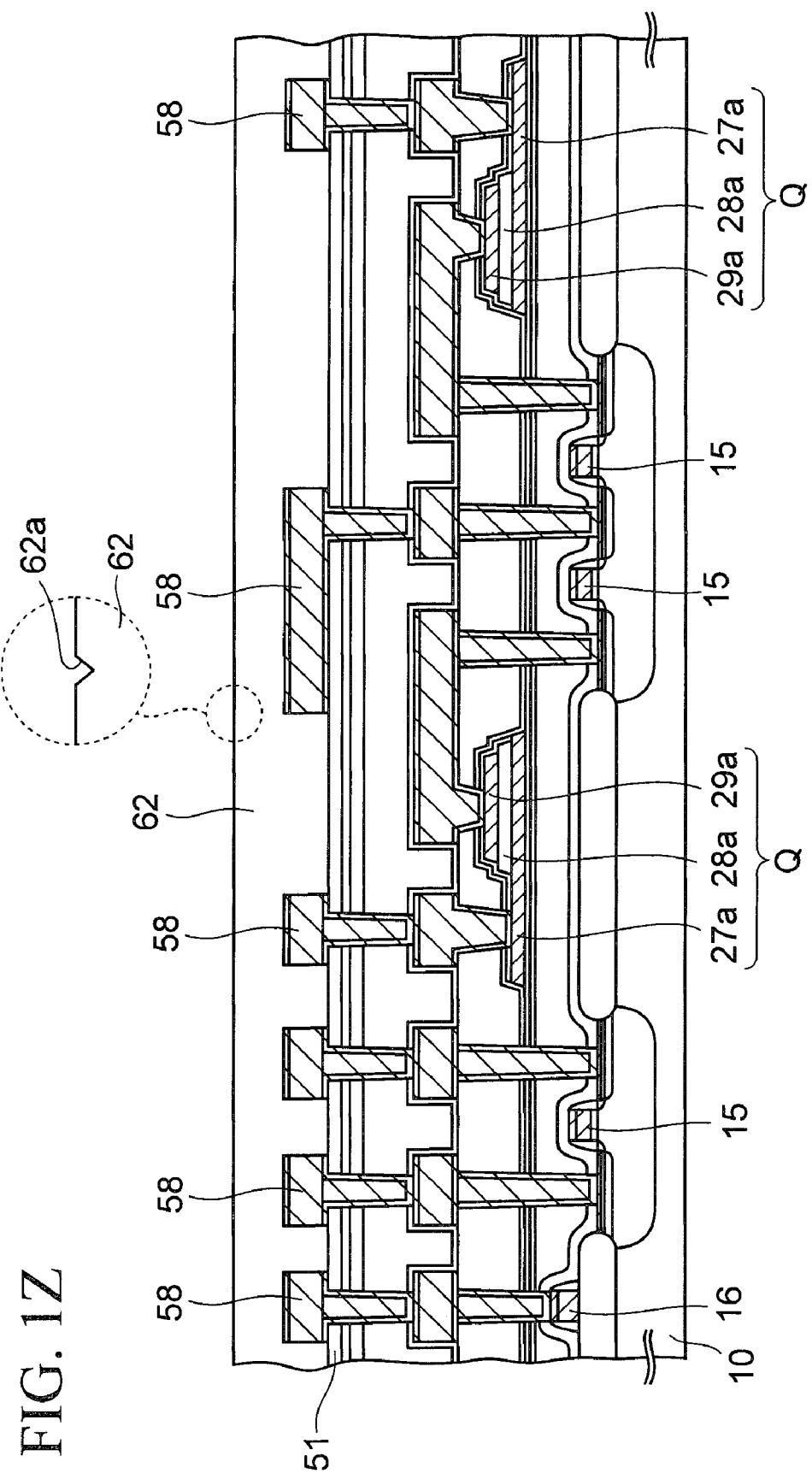

Next, as shown in FIG. 1Z, the upper surface of the second insulating film 62 is planarized by the CMP method. Like the CMP carried out on the first insulating film 48 (see, FIG. 1N), a fine scar (micro scratch) 62a is also formed on the surface of the second insulating film 62.

Next, as shown in FIG. 2A, $N_2O$ plasma processing is carried out on the second insulating film 62 under conditions with a substrate temperature of 350° C. and a processing time of four minutes. Thereby, the second insulating film 62 is dehydrated, and the upper surface thereof is nitrided to prevent the second insulating film 62 from resorbing moisture. The $N_2O$ plasma processing is carried out by using, for example, a CVD equipment.

Figure 2B:
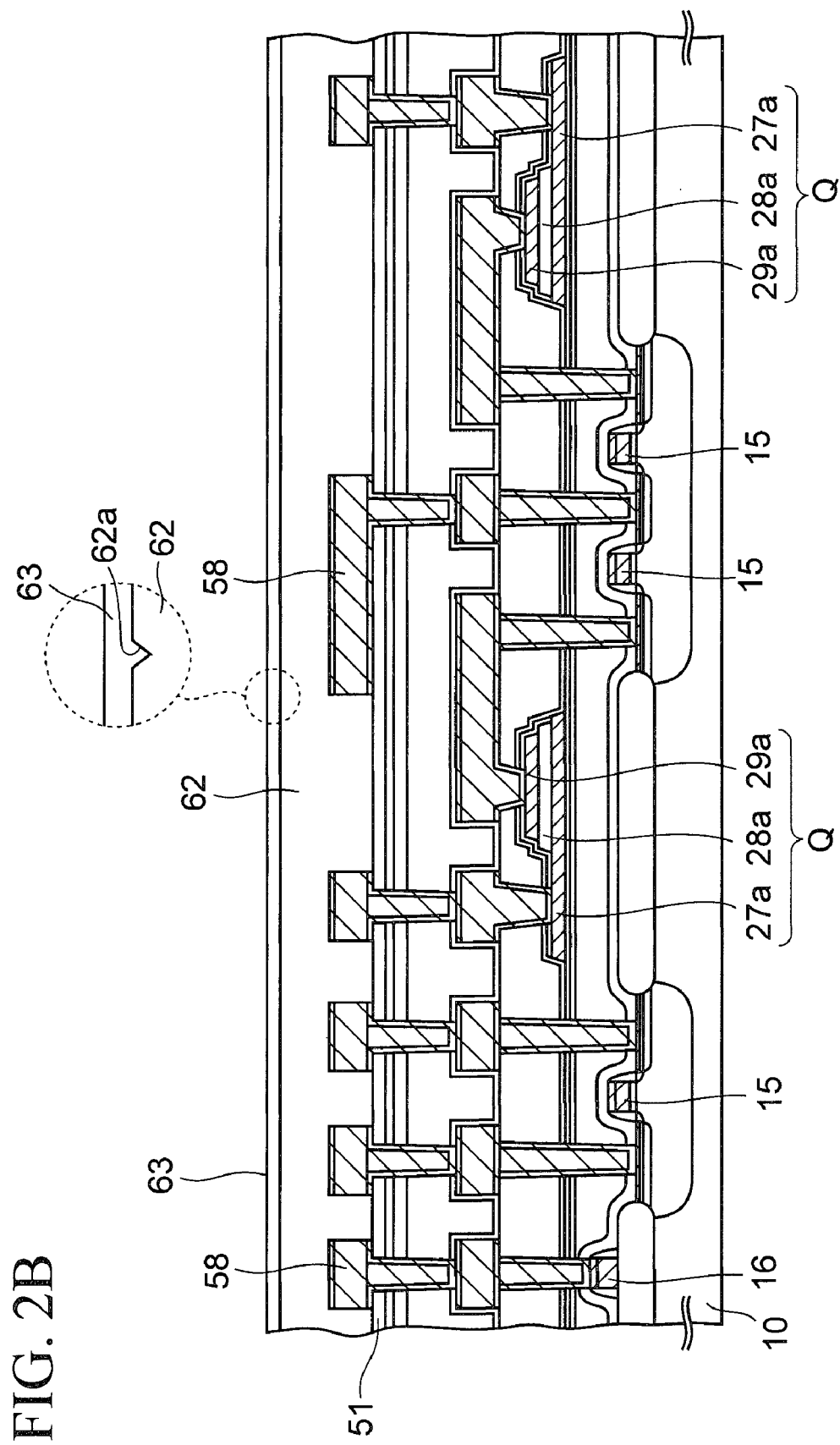

Next, as shown in FIG. 2B, a silicon oxide film is formed as a cap insulating film 63 with a thickness of approximately 100 nm on the second insulating film 62 by the plasma CVD method using the TEOS gas. The scar 62a is completely embedded by the cap insulating film 63. With the scar 62a being embedded in this manner, the flatness of the upper surface of the cap insulating film 63 becomes preferable. Thus, a thin film can be formed on the cap insulating film 63 with excellent coverage.

Figure 2C:
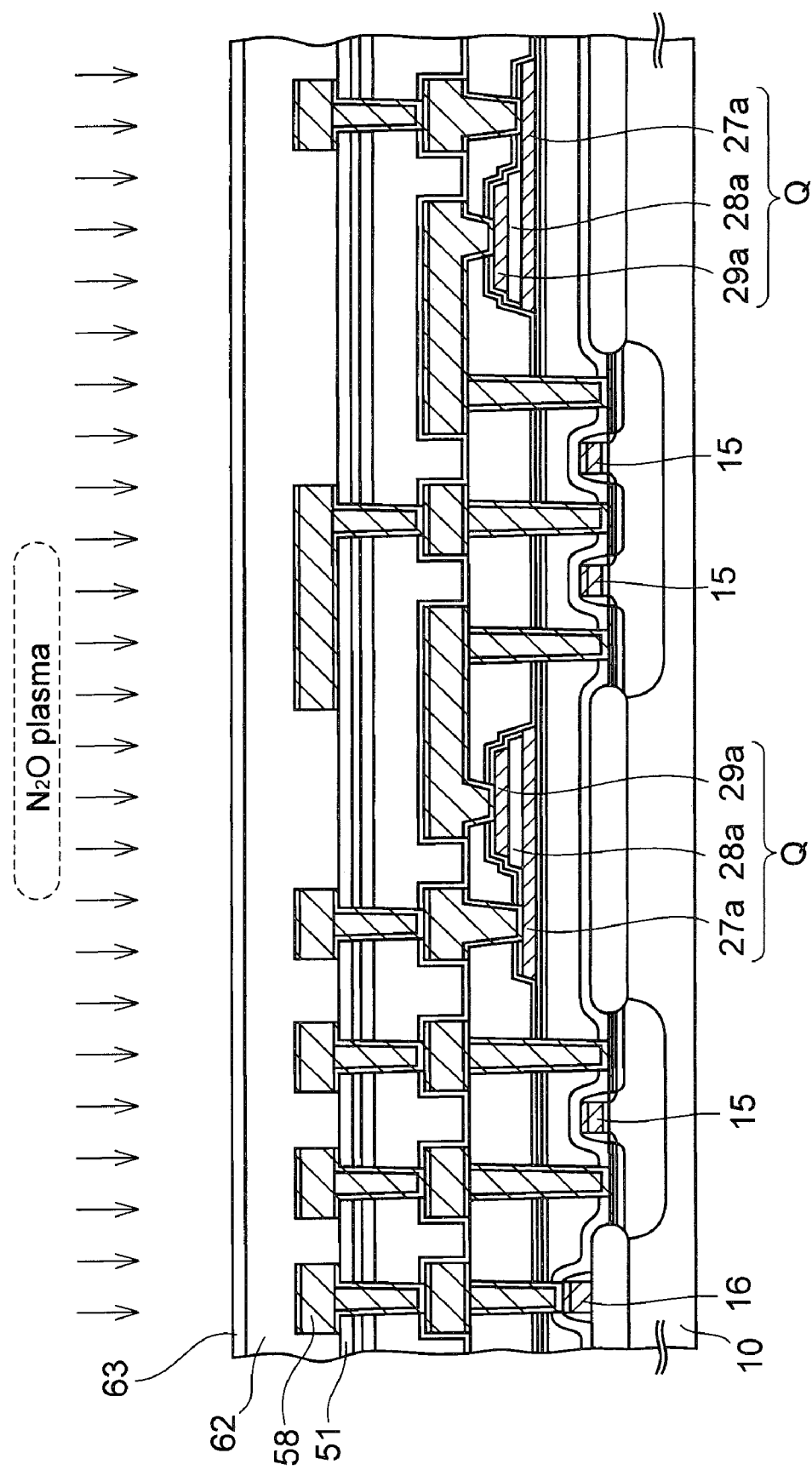

Thereafter, as shown in FIG. 2C, $N_2O$ plasma processing is carried out on the cap insulating film 63 for dehydration processing and moisture absorption prevention processing. The $N_2O$ plasma processing is carried out, for example, in a CVD equipment under conditions with a substrate temperature of 350° C. and a processing time of two minutes.

Figure 2D:
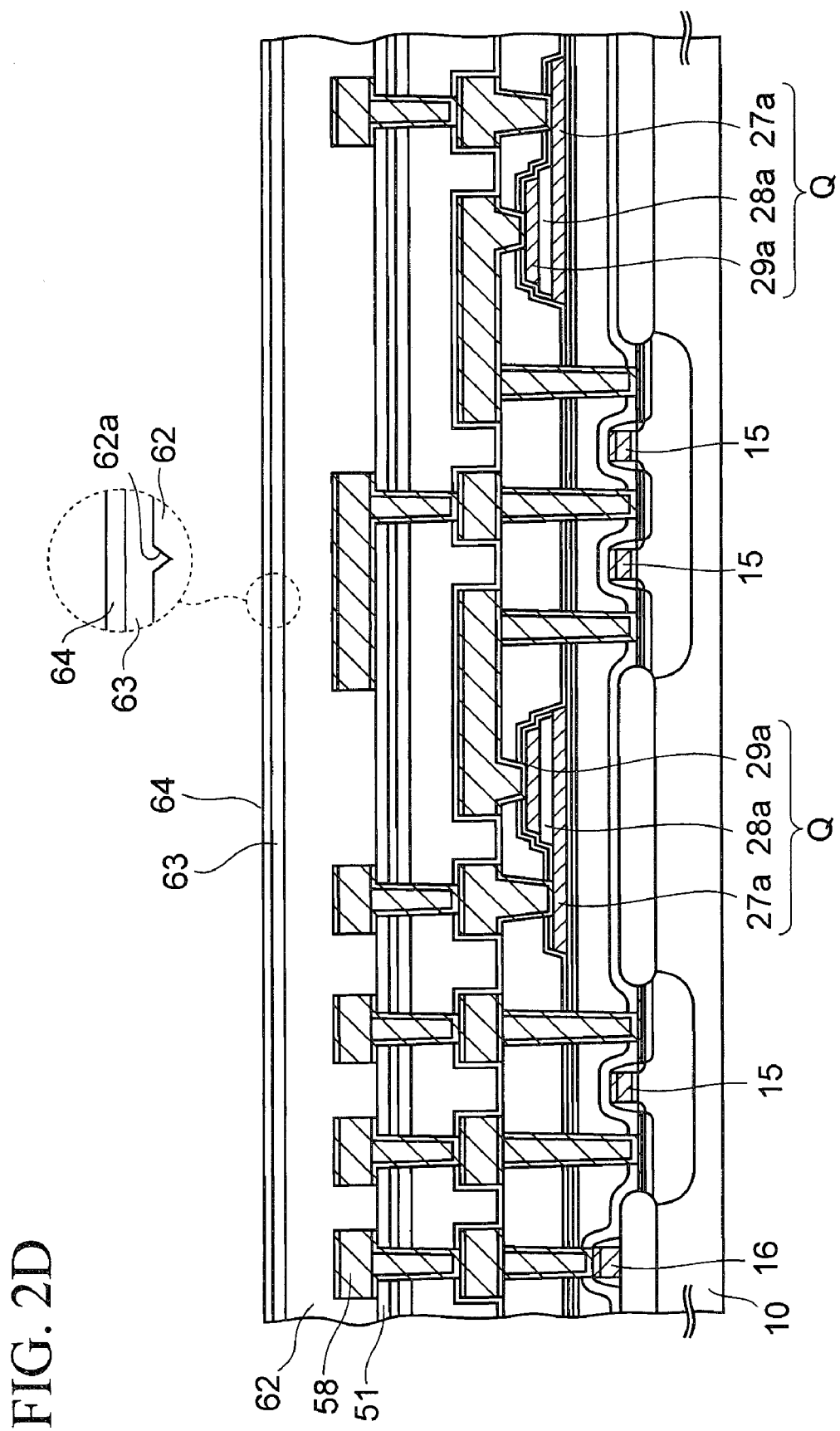

Subsequently, as shown in FIG. 2D, as a third capacitor protective insulating film 64 for protecting the capacitor dielectric film 28a from reductants, an alumina film is formed with a thickness of approximately 50 nm on the cap insulating film 63 by the sputtering method.

As described above, the scar 62a is embedded by the cap insulating film 63. Thereby, the film thickness of the third capacitor protective insulating film 64 becomes even on the entire surface of the silicon substrate 10, and thus the reductants can be blocked in the entire portion of the third capacitor protective insulating film 64.

Note that the third capacitor protective insulating film 64 is not limited to an alumina film. Like the first and second capacitor protective insulating film 46 and 50, the third capacitor protective insulating film 64 may be formed of a single layer or laminated layer of an alumina film, a titanium oxide film, a silicon nitride film, and a silicon oxynitride film.

Figure 2E:
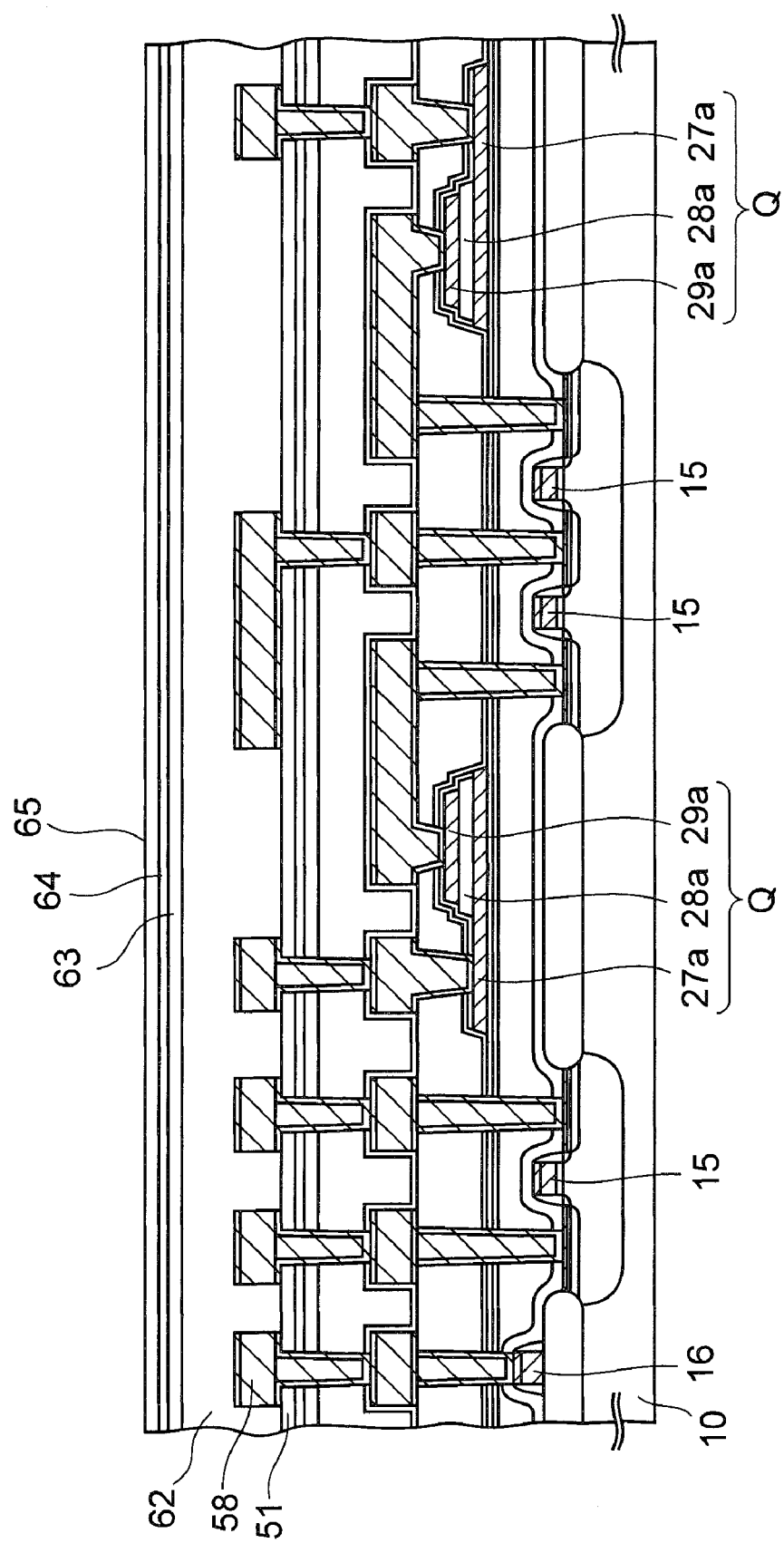

Next, as shown in FIG. 2E, a silicon oxide film is formed with a thickness of approximately 100 nm on the third capacitor protective insulating film 64 by the plasma CVD method using the TEOS gas. The resultant silicon oxide film is used as a second cover insulating film 65.

Next, as shown in FIG. 2F, $N_2O$ plasma processing is carried out on the second cover insulating film 65 under conditions with a substrate temperature of 350° C. and a processing time of two minutes. Thereby, the second cover insulating film 65 is dehydrated, and the surface thereof is nitrided to prevent the second cover insulating film 65 from resorbing moisture. The $N_2O$ plasma processing is carried out by using, for example, a CVD equipment.

Next, processes for obtaining a cross-sectional structure shown in FIG. 2G will be described.

Firstly, the second cover insulating film 65 is coated with a photoresist. The photoresist is then exposed and developed to form a fourth resist pattern 68 provided with hole-shaped eighth windows 68a over the second layer metal wirings 58.

After that, while using the fourth resist pattern 68 as a mask, the insulating films 62 to 65 is etched in a parallel plate-type plasma etching chamber to form fourth holes 67a in these insulating films on the second layer metal wirings 58. The etching uses, for example, a mixed gas of $C_4F_8$, Ar, and $O_2$, as an etching gas.

After this etching is finished, the fourth resist pattern 68 is removed.

Figure 2G:
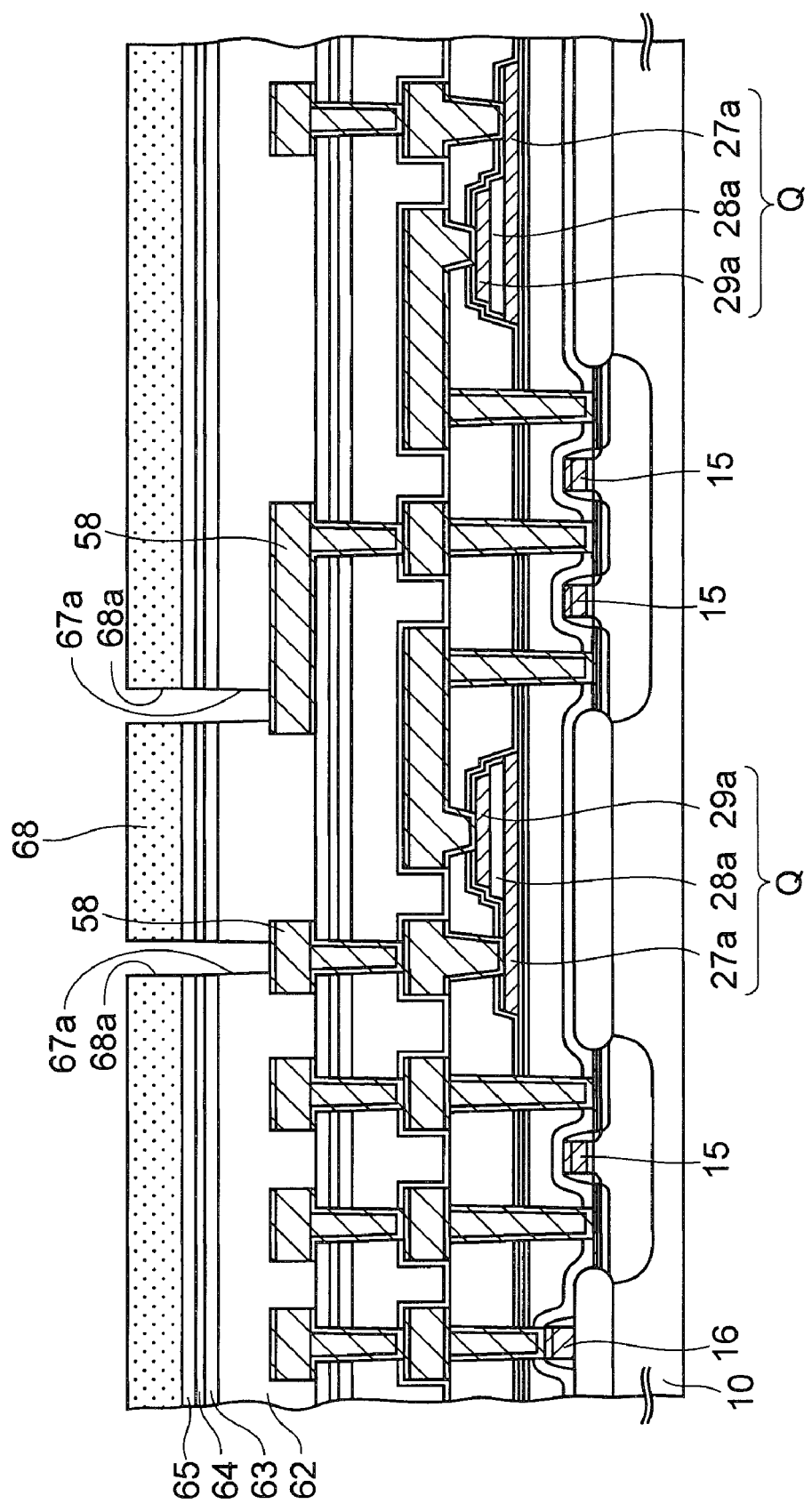
Figure 2H:
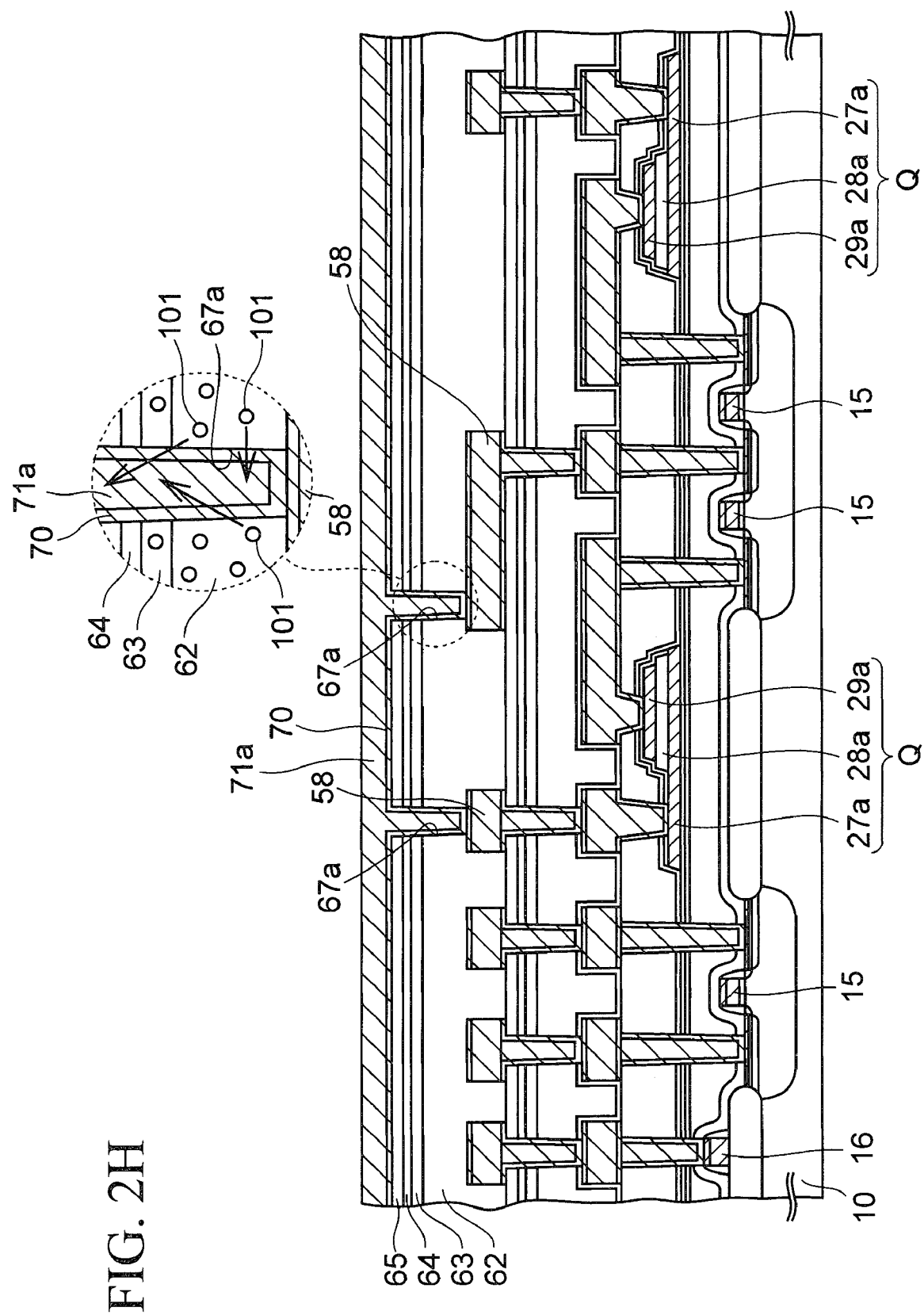

Next, as shown in FIG. 2H, a titanium nitride film is formed, as a second glue film 70, by the sputtering method with a thickness of approximately 150 nm on inner surfaces of the fourth holes 67a and on the upper surface of the second cover insulating film 65 under the substrate temperature of about 200° C. Then, a tungsten film 71a is formed on the second glue film 70 by the CVD method. The fourth holes 67a are completely embedded by the tungsten film 71a. The tungsten film 71a is formed with a substrate temperature of, for example, approximately 430° C.

In this manner, heat is applied to the second insulating film 62, the cap insulating film 63, and the second cover insulating film 65 when the second glue film 70 and the tungsten film 71a is formed. Then, residual moisture 101 of these insulating films is vaporized due to this heat and is to escape from the fourth holes 67a to the outside. Such residual moisture 101 causes some of the fourth holes 67a to be incompletely embedded by the second glue film 70 or the tungsten film 71a.

Figure 2I:
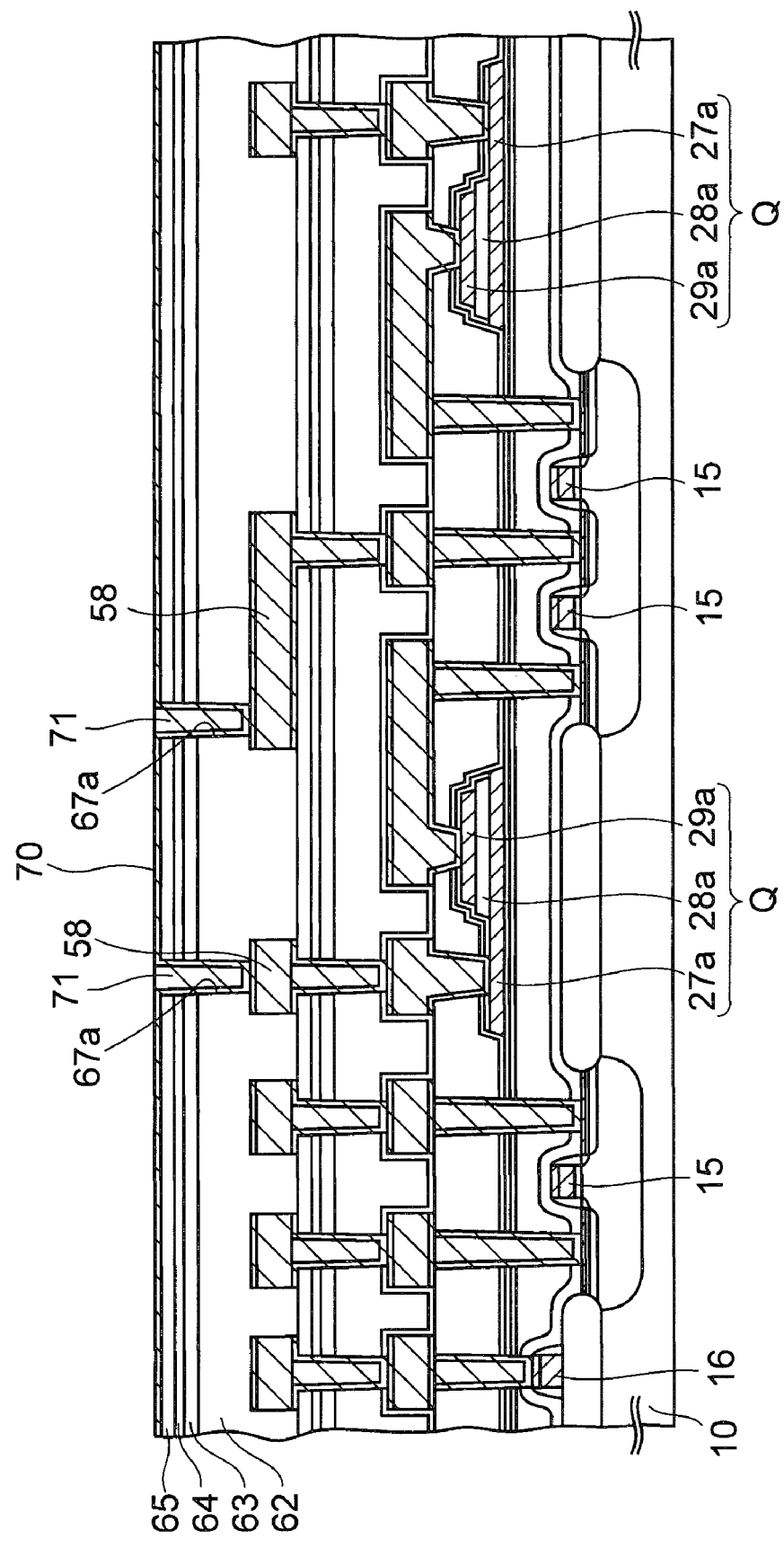

Next, as shown in FIG. 2I, the excessive tungsten film 71a on the second cover insulating film 65 is polished and removed by the CMP method, so as to leave the tungsten film 71a only in the fourth holes 67a as sixth conductive plugs 71.

Next, processes for obtaining a cross-sectional structure shown in FIG. 2J will be described.

Firstly, a copper-containing aluminum film with a thickness of approximately 550 nm, a titanium film with a thickness of approximately 5 nm, and a titanium nitride film with a thickness of approximately 150 nm are formed in this order by the sputtering method on the upper surfaces of the second glue film 70 and the sixth conductive plugs 71. Then, this metal laminated film and the second glue film 70 thereunder are patterned by photolithography to from third layer metal wirings 72 on the second cover insulating film 65.

Here, due to the same reason described by referring to FIG. 1X, since the second cover insulating film 65 is formed, the thickness of the third capacitor protective insulating film 64 can be prevented from being thinned at the time when the third layer metal wirings 72 are patterned. Accordingly, the capability of the third capacitor protective insulating film 64 to block reductants can be preferably maintained.

Figure 2J:
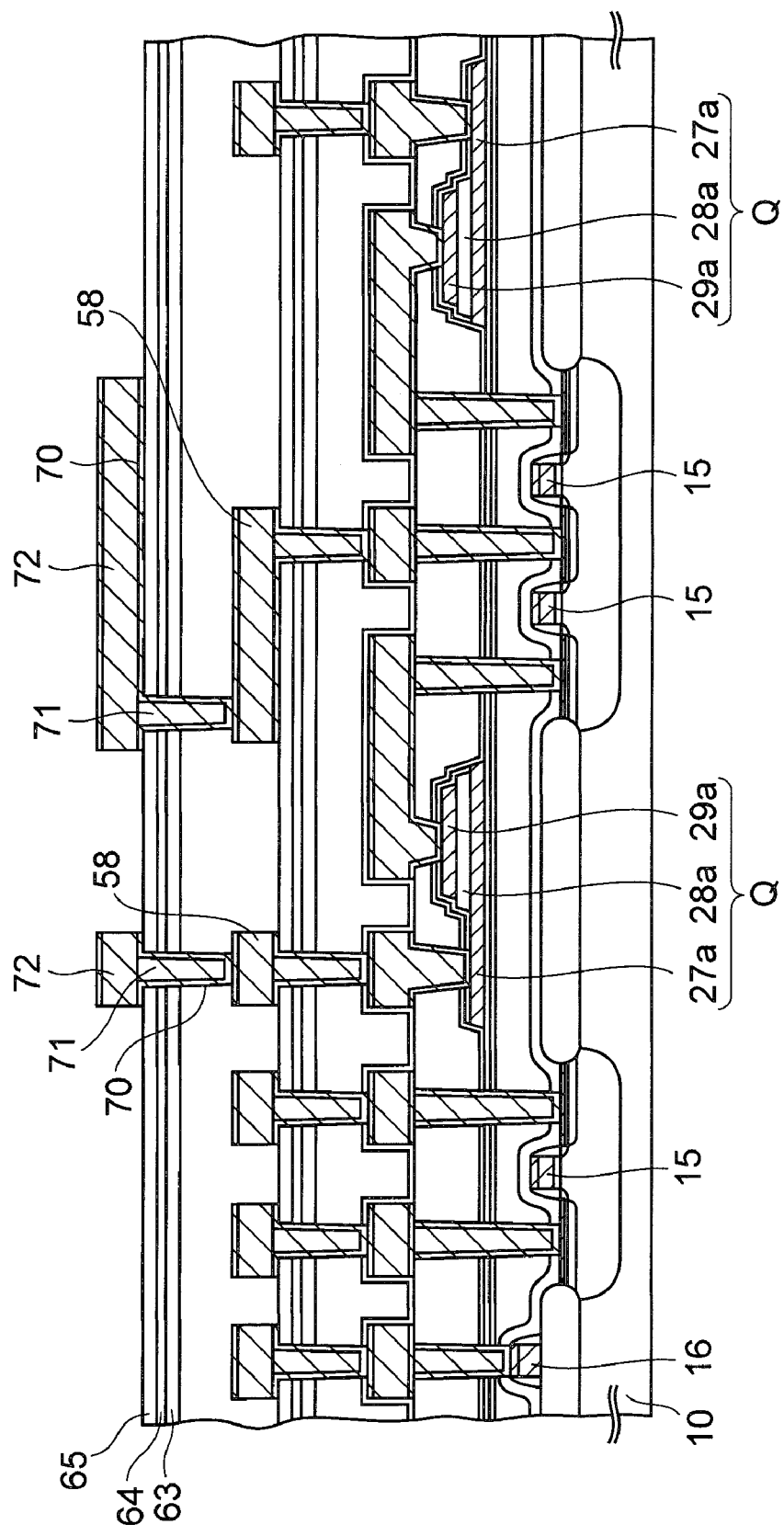
Figure 2K:
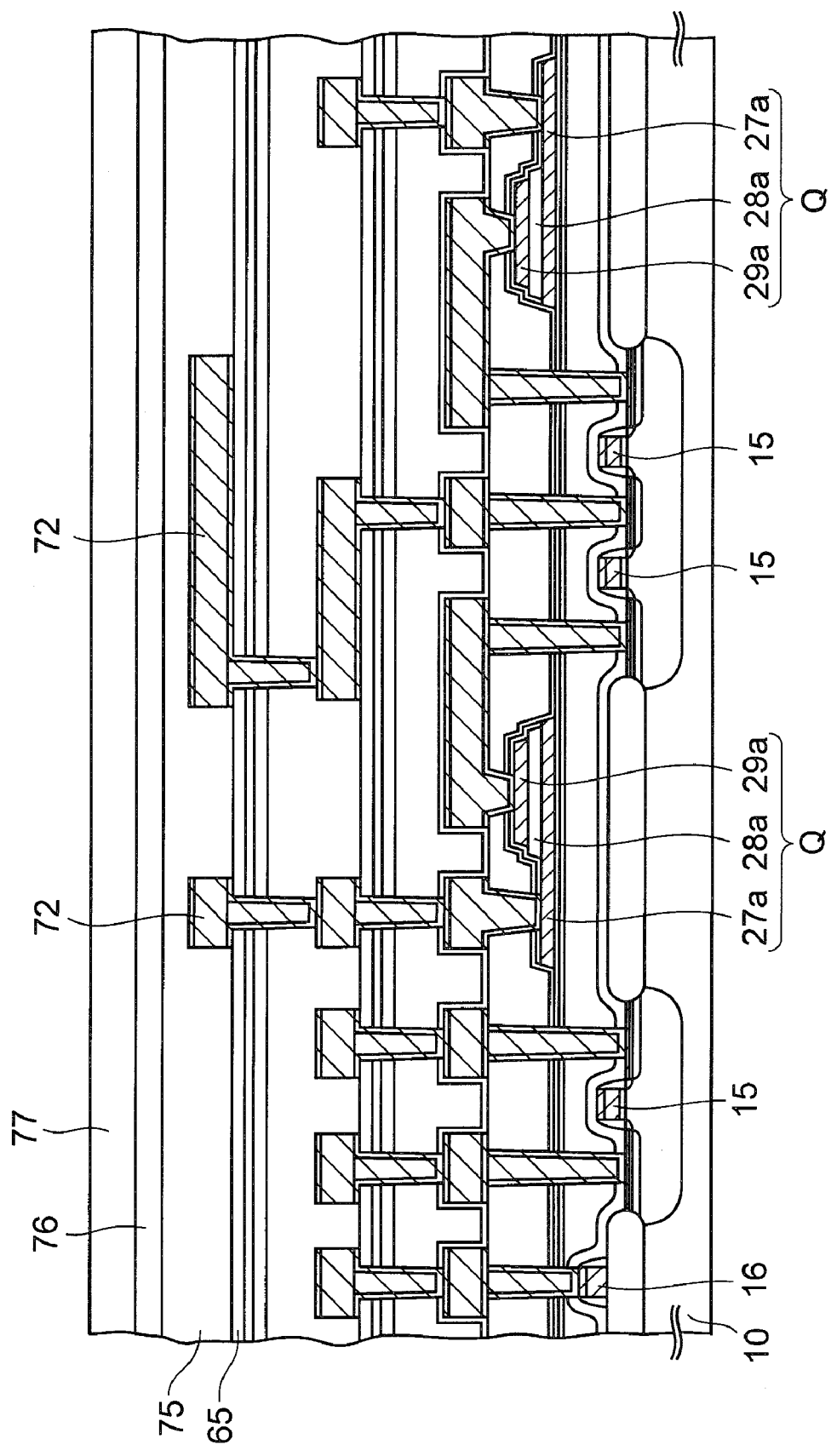

Next, as shown in FIG. 2K, a silicon oxide film is formed with a thickness of approximately 100 nm as a first passivation film 75 on the second cover insulating film 65 and the third layer metal wirings 72 by the CVD method. Furthermore, a silicon nitride film is formed as a second passivation film 76 with a thickness of approximately 350 nm on the first passivation film 75 by the CVD method.

After that, these first and second passivation films 75 and 76 are patterned to form an opening in which a bonding pad (unillustrated) formed on the same layer as that of the third layer metal wirings 72 is exposed.

Subsequently, a photosensitive polyimide is formed with a thickness of approximately 3 μm on the entire upper surface of the silicon substrate 10 to form a protective layer 77 made of a polyimide coating film. After that, the protective layer 77 is exposed and developed to form a window in which the bonding pad is exposed. In this manner, the basic structure of the FeRAM is completed.

According to the method for manufacturing the FeRAM as described above, as explained by referring to FIG. 1V, the residual moisture 100 contained in the first insulating film 48 and the cap insulating film 49 is vaporized by heat generated at the time when the first glue film 56 and the tungsten film 57a is formed, and the vaporized moisture comes out into the third holes 54a. As a result, the third holes 54a cannot be preferably embedded by the first glue film 56 and the tungsten film 57a, so that some of the fifth conductive plugs 57 (see, FIG. 1W) are not formed. Thus, the first and second layer metal wirings 45 and 58 (see, FIG. 1X) are not electrically connected by the fifth conductive plugs 57, and hence the FeRAM becomes defective.

Such problems are also caused in the sixth conductive plugs 71 (see, FIG. 2J) formed in a layer over the fifth conductive plugs 57.

In addition, in the present example, as shown in FIG. 1P, the cap insulating film 49 is formed on the first insulating film 48 so that the fine scar (micro scratch) 48a formed on the surface of the first insulating film 48 by CMP would be embedded.

However, the above-described residual moisture 100 is generated even from this cap insulating film 49. Accordingly, the problem that the fifth conductive plugs 57 is not formed is promoted by the cap insulating film 49. As a result, a yield of FeRAM is further decreased.

Furthermore, the cap insulating film 49 requires the step of forming the cap insulating film 49 and the step of the $N_2O$ plasma processing (FIG. 1Q) for dehydrating the cap insulating film 49. Accordingly, the number of steps of manufacturing a FeRAM is increased, and thus the manufacturing cost of the FeRAM is increased.

In light of the foregoing description, the inventors come up with the following embodiments of the semiconductor and manufacturing method thereof.

(2) First Embodiment

Figure 3A:
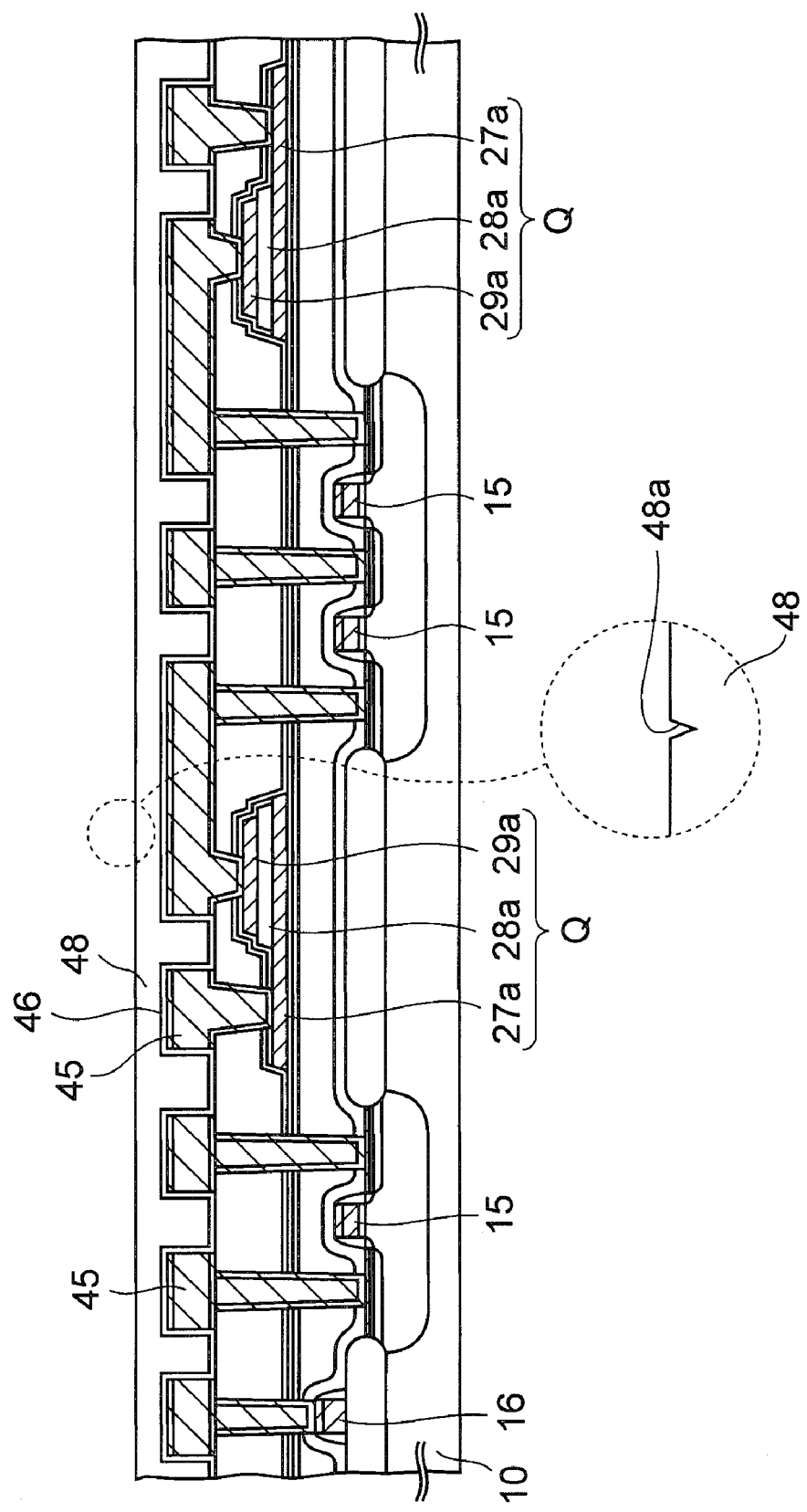
FIGS. 3A to 3U are cross-sectional views showing processes of manufacturing a semiconductor device according to a first embodiment.
Figure 3B:
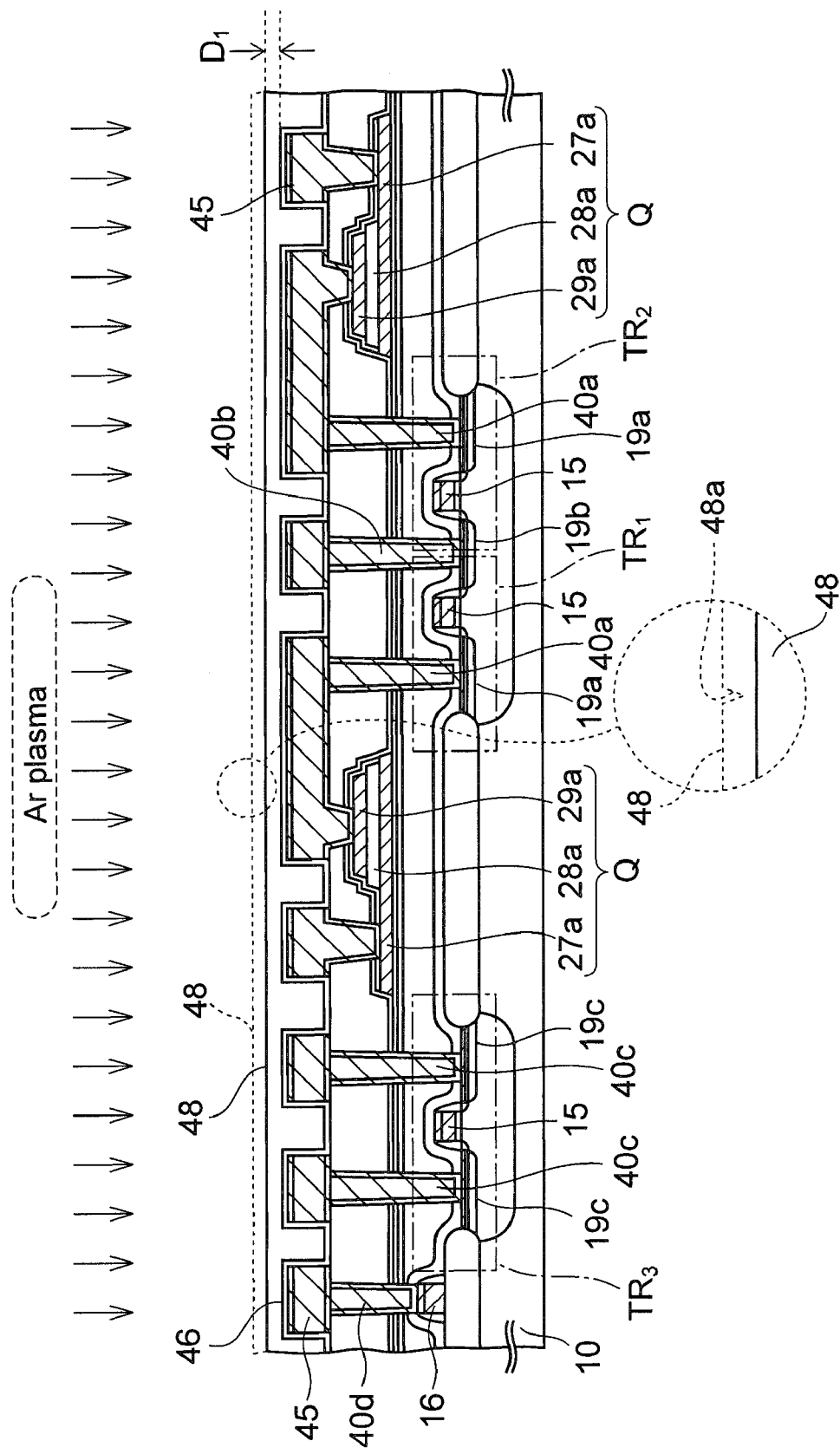
Figure 3C:
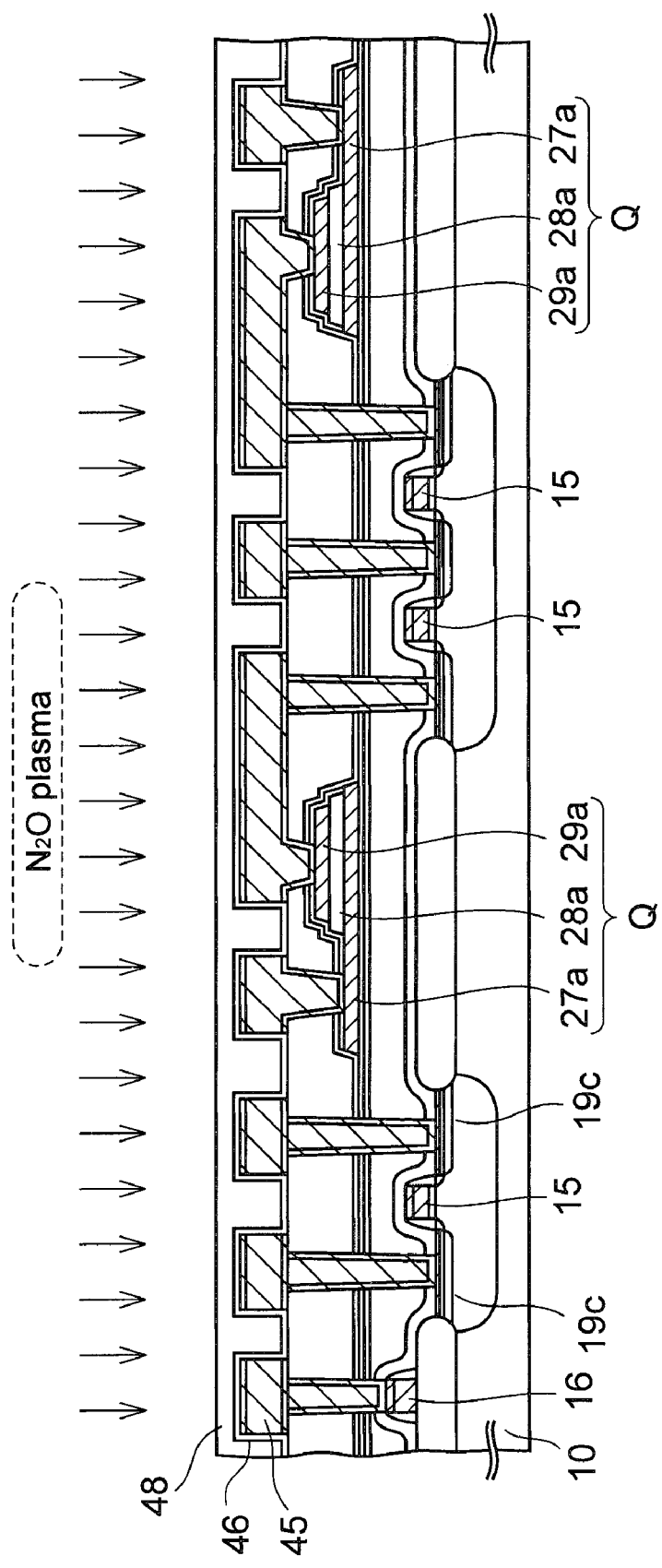
Figure 3D:
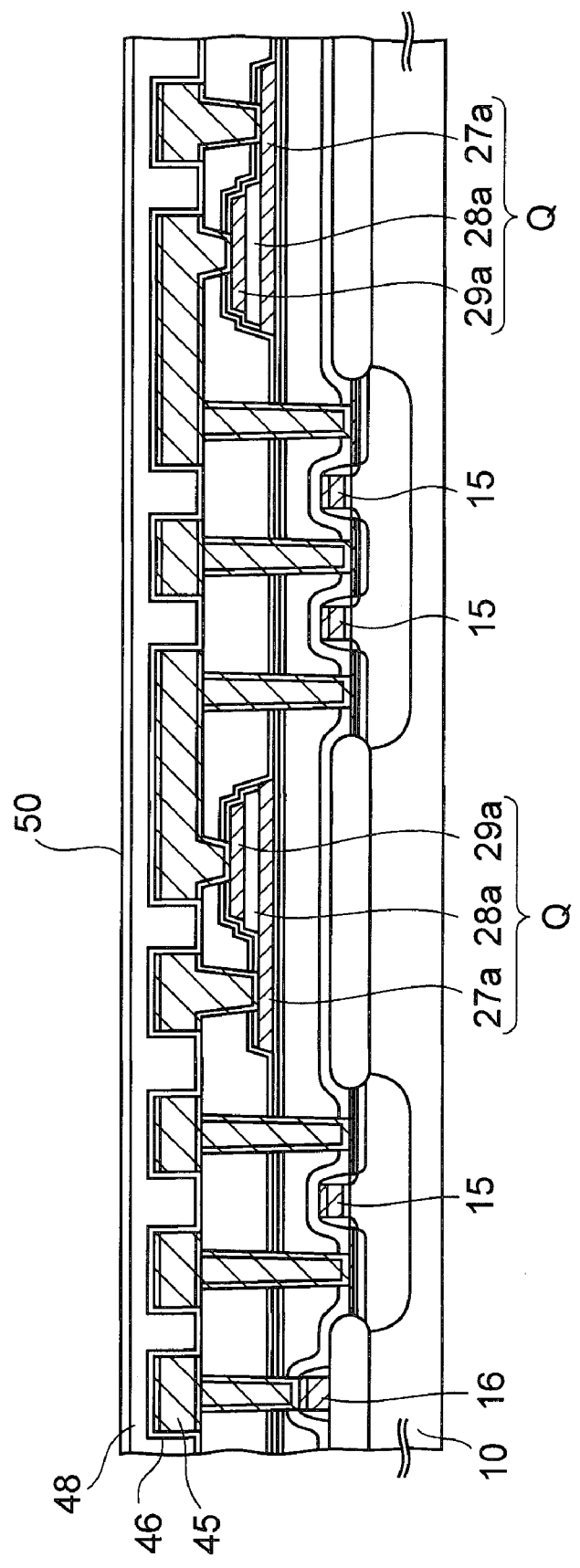
Figure 3E:
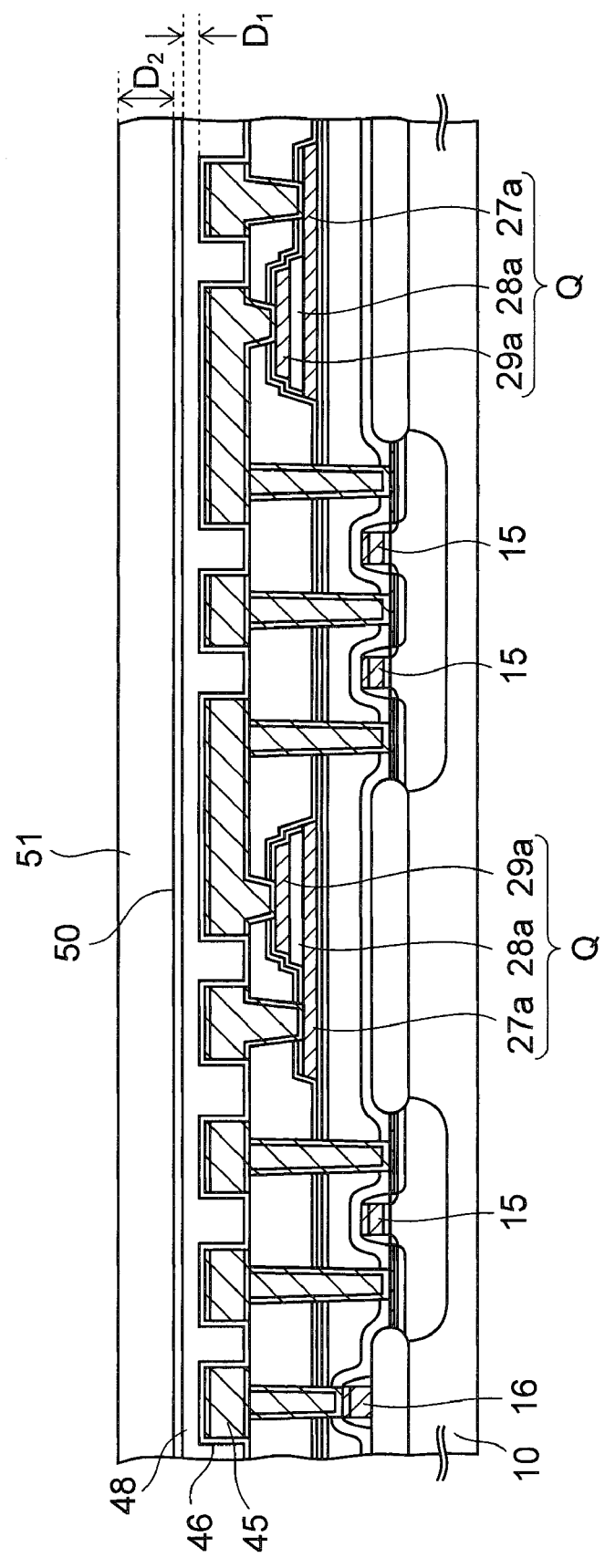
Figure 3G:
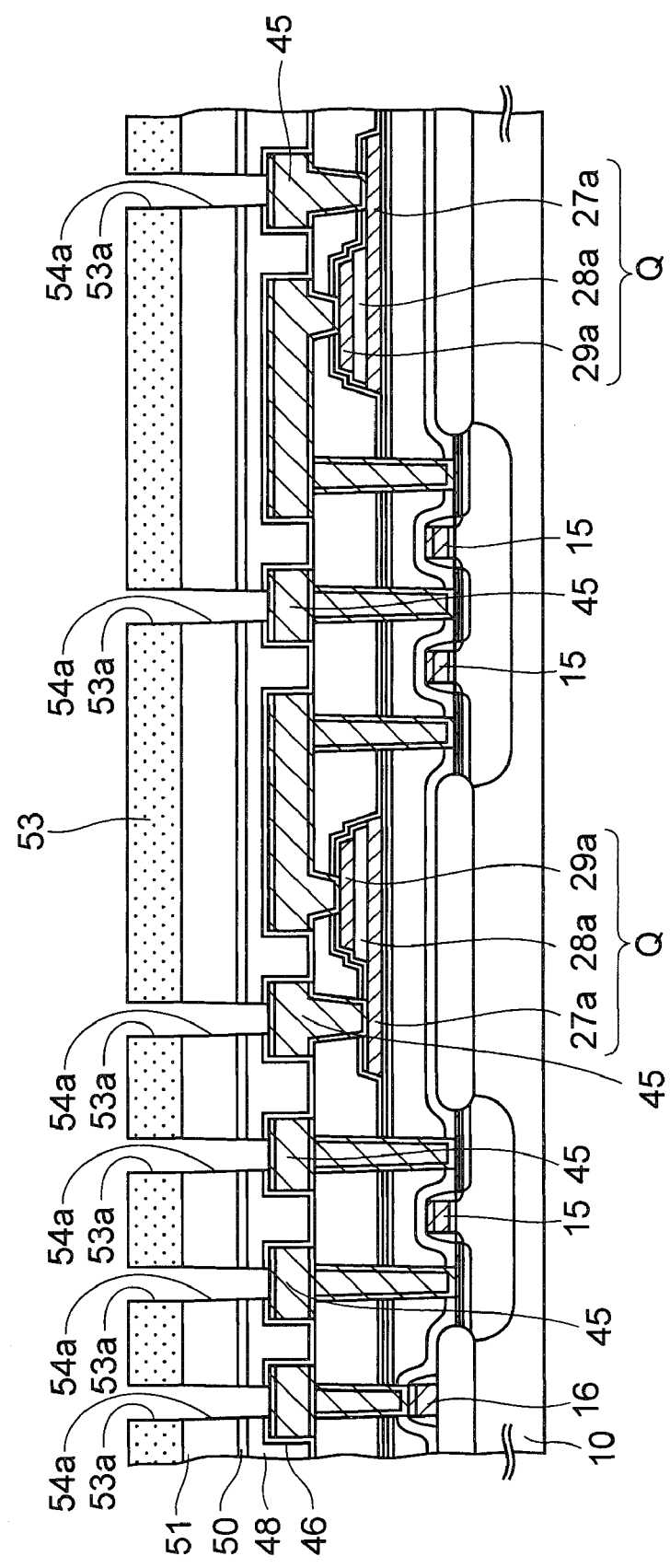
Figure 3H:
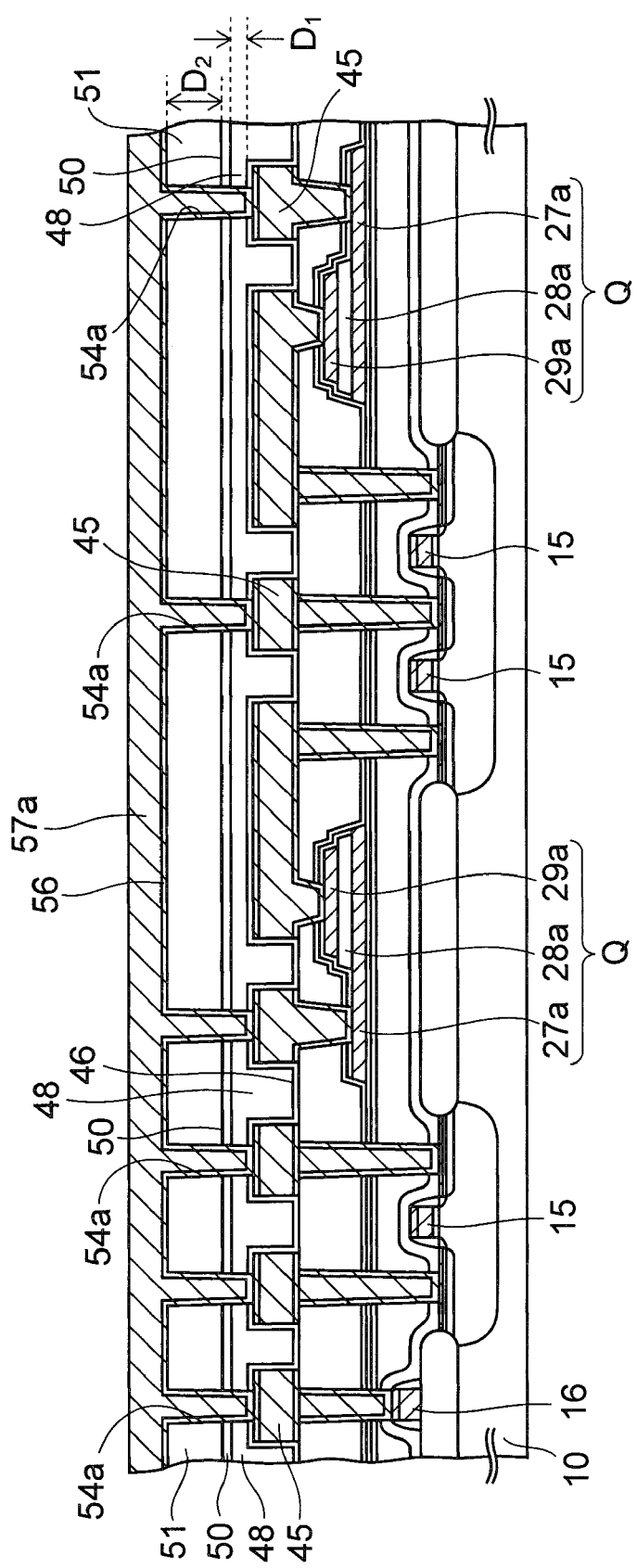
Figure 3I:
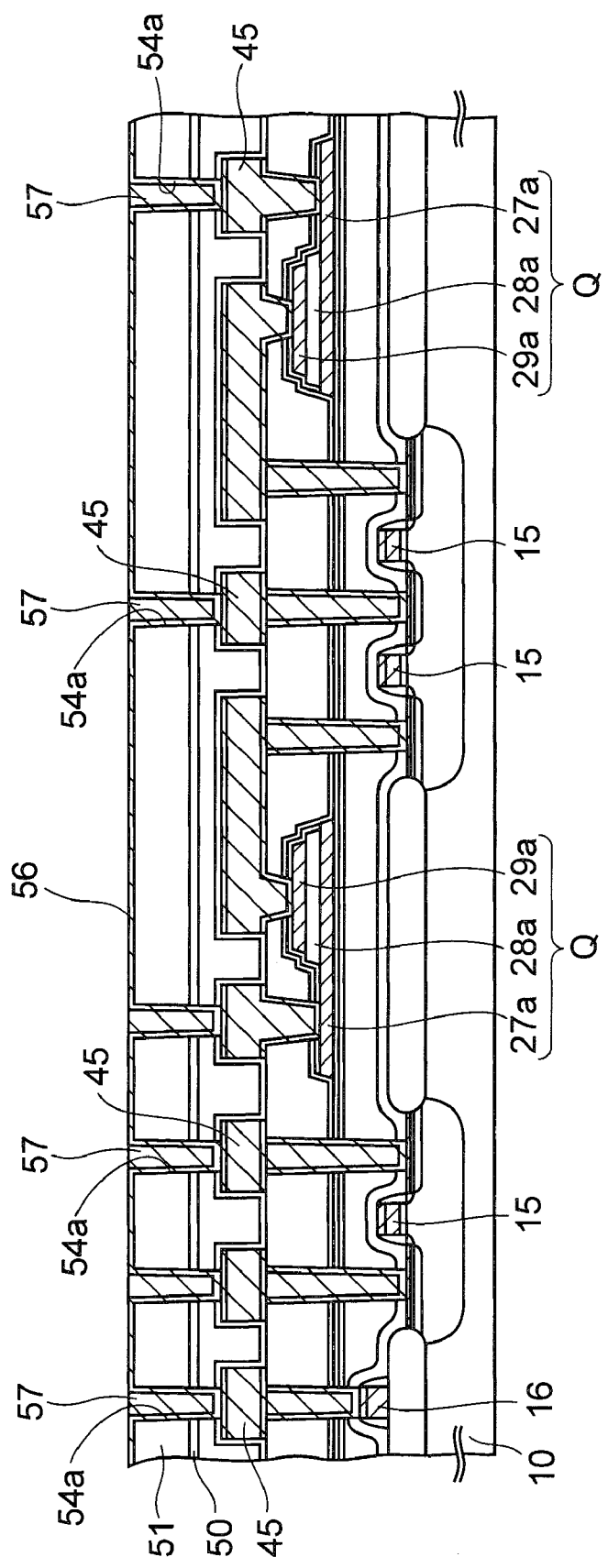
Figure 3J:
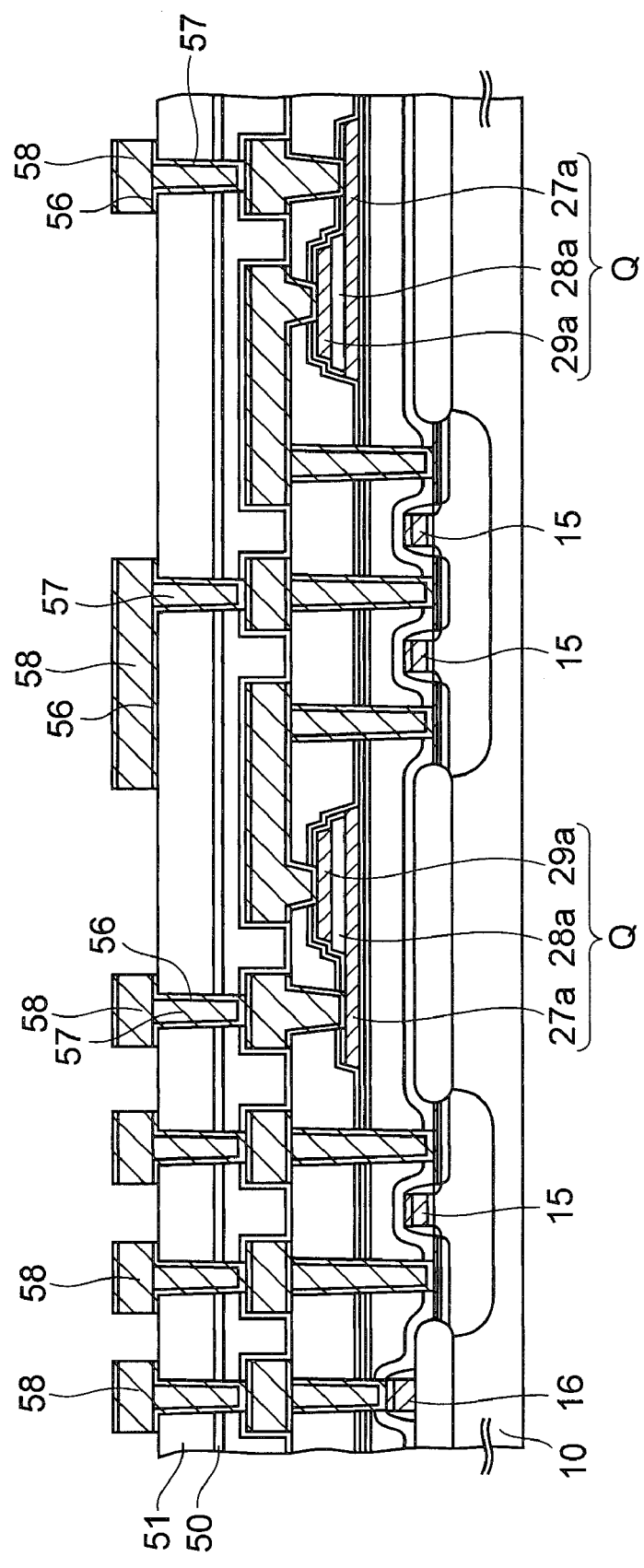
Figure 3K:
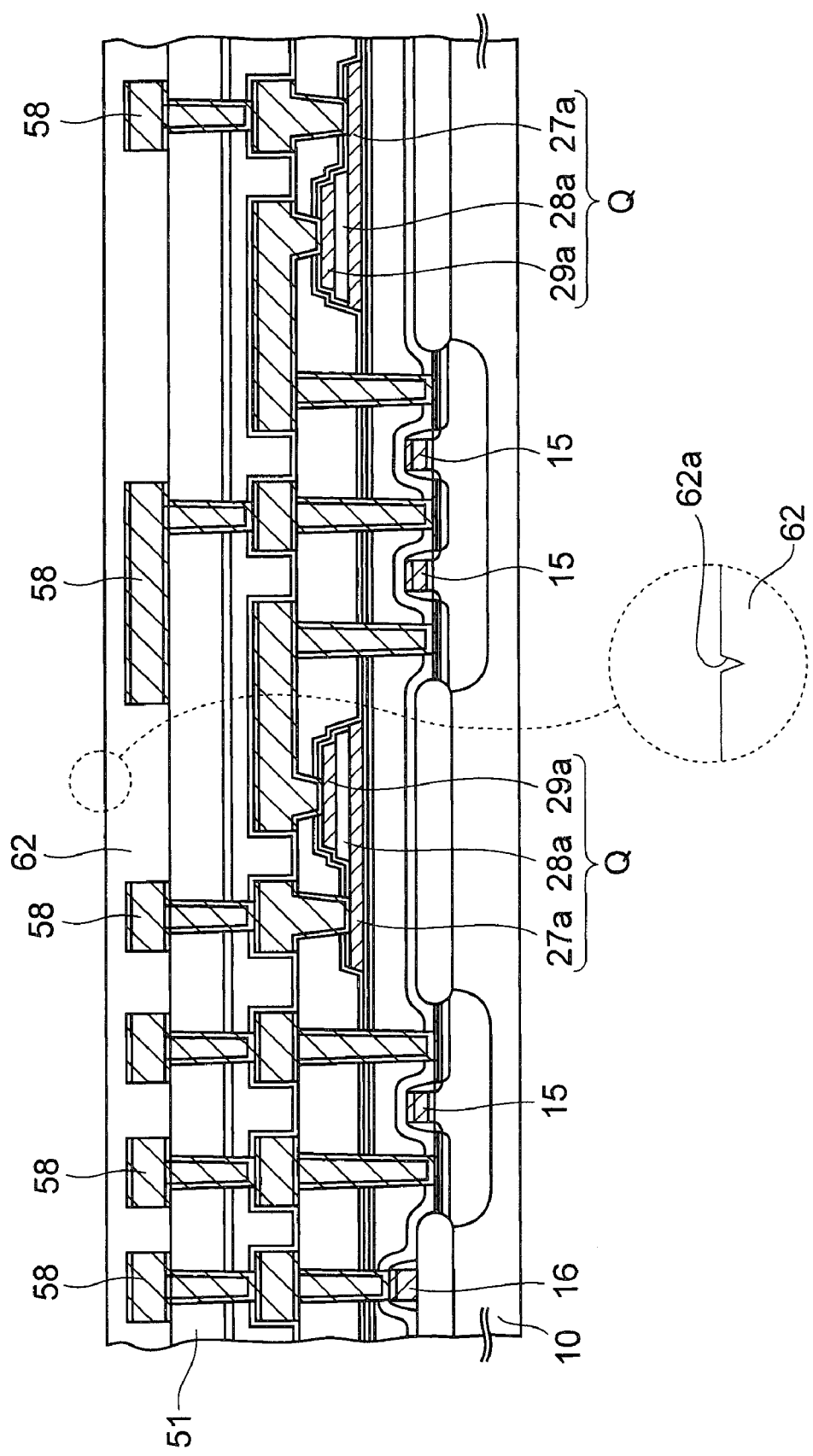
Figure 3L:
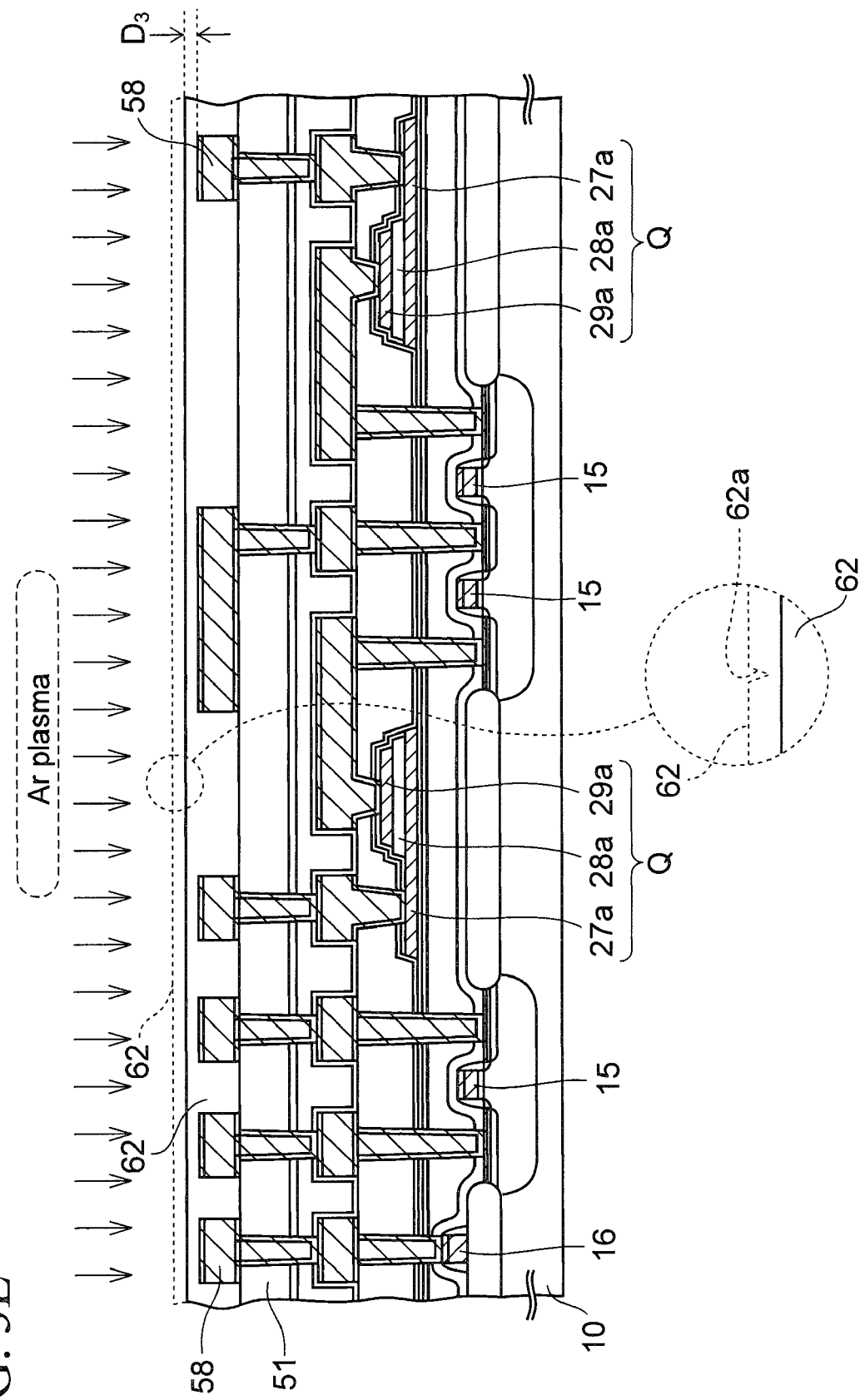
Figure 3M:
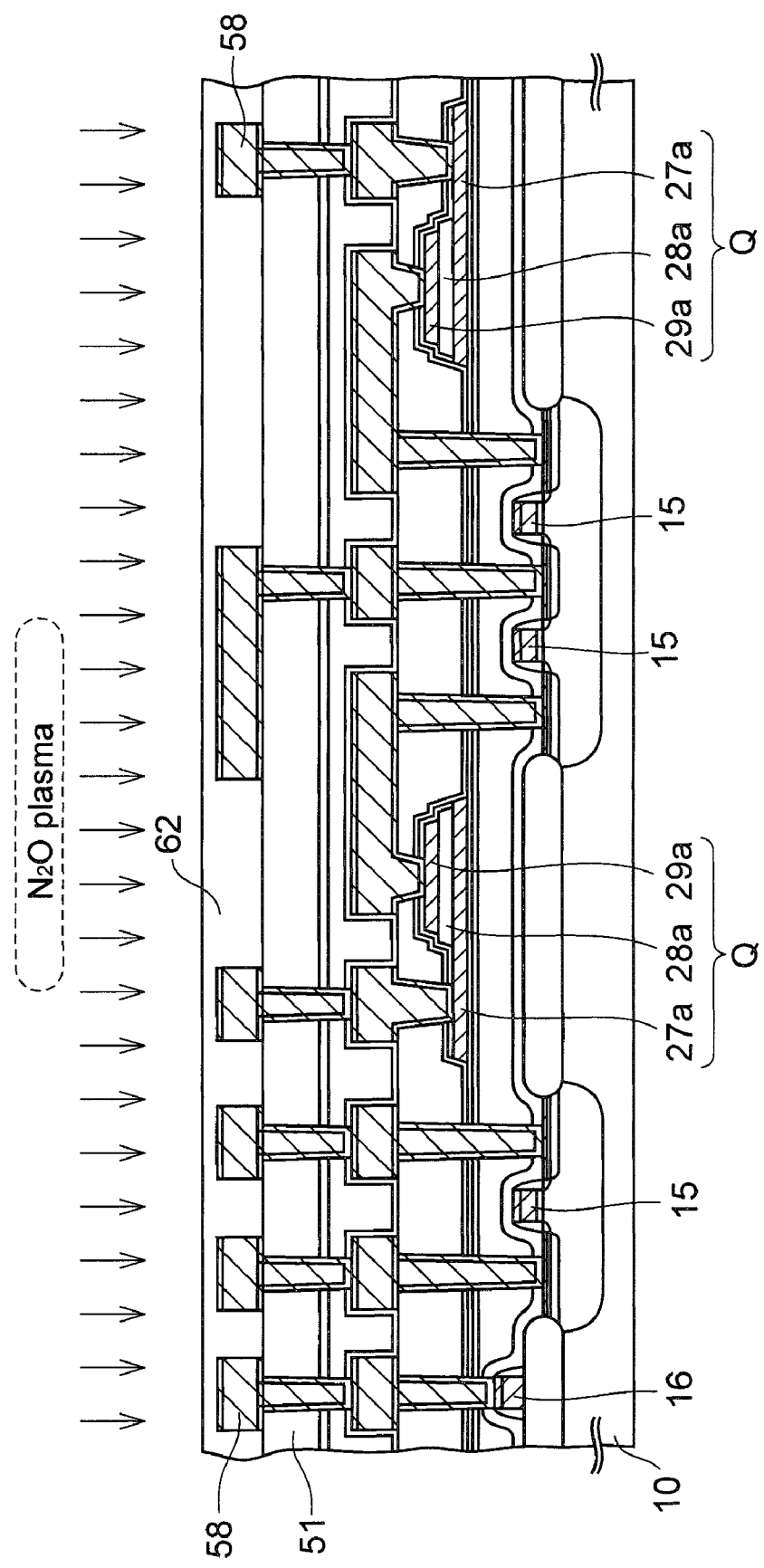
Figure 3N:
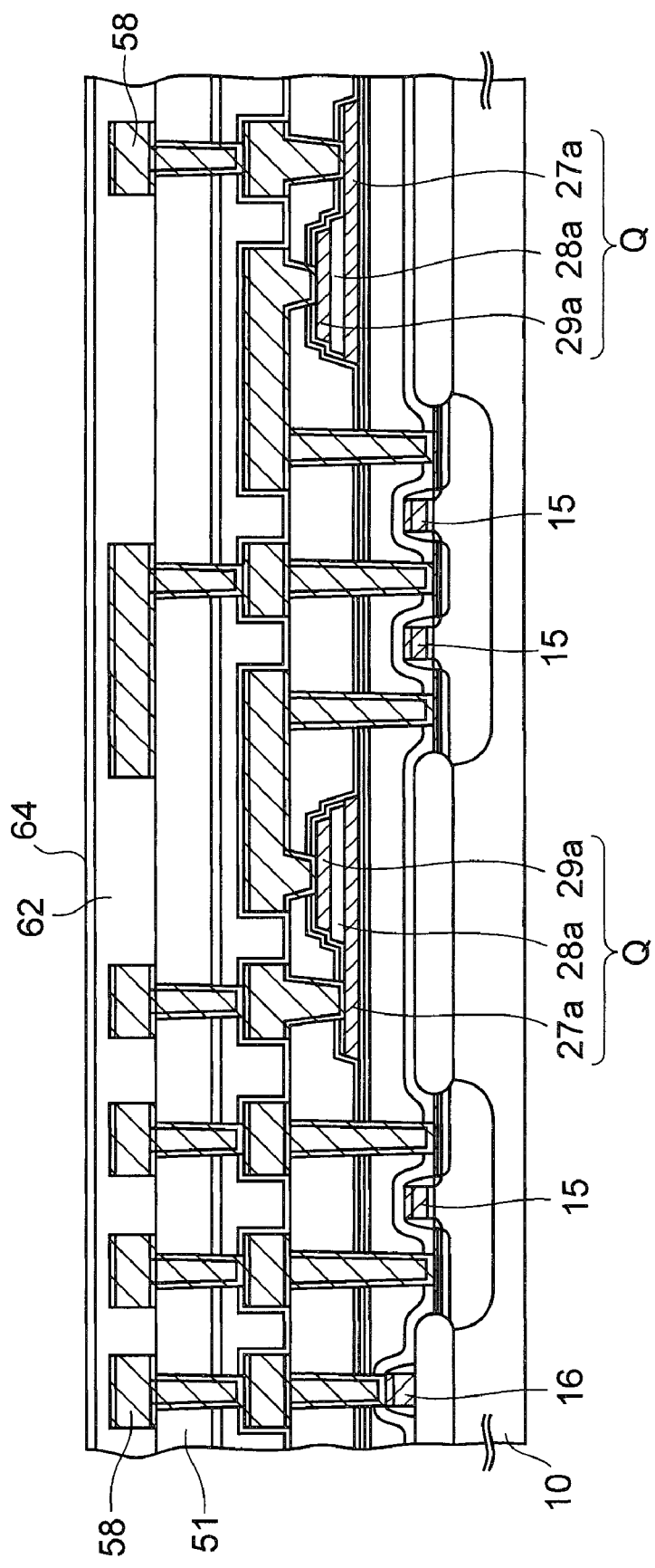
Figure 30:
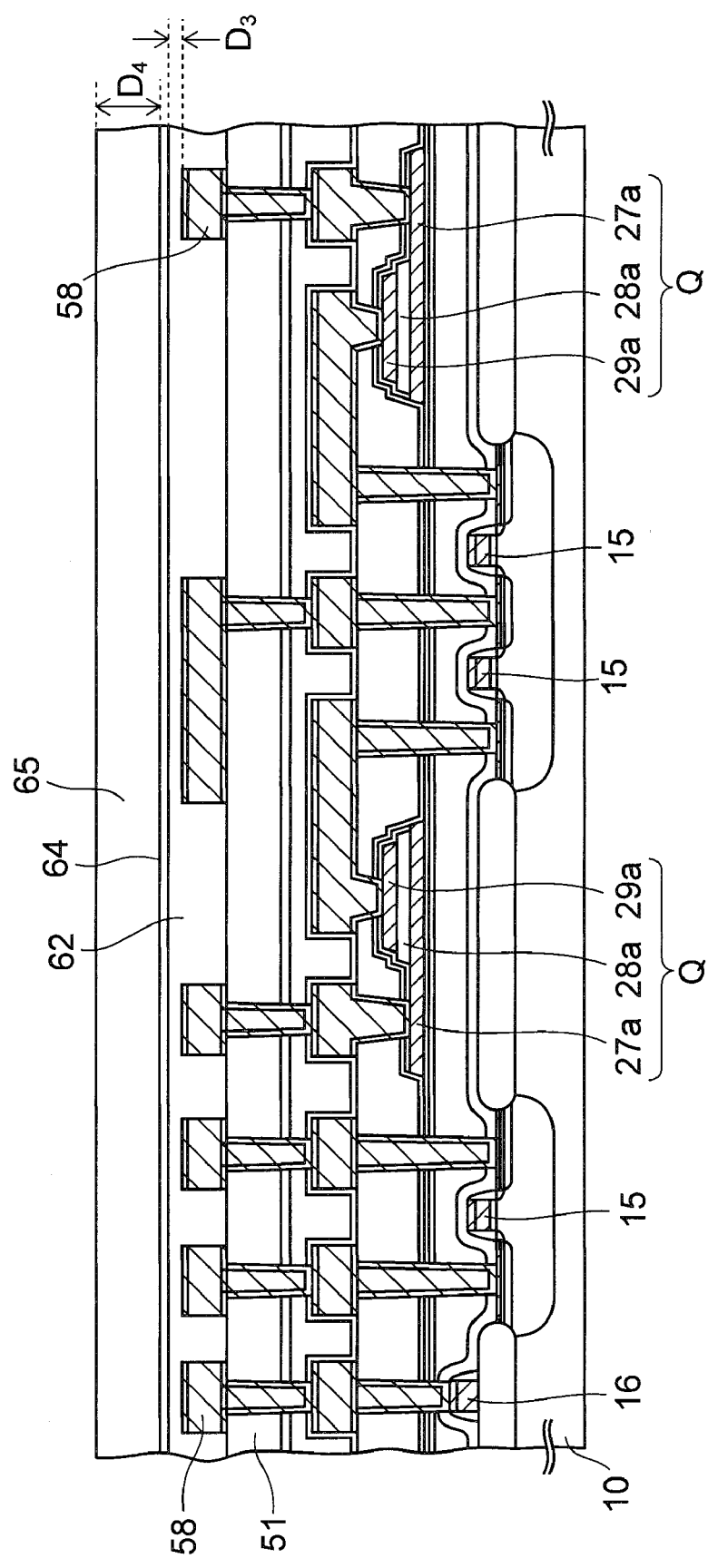
Figure 3P:
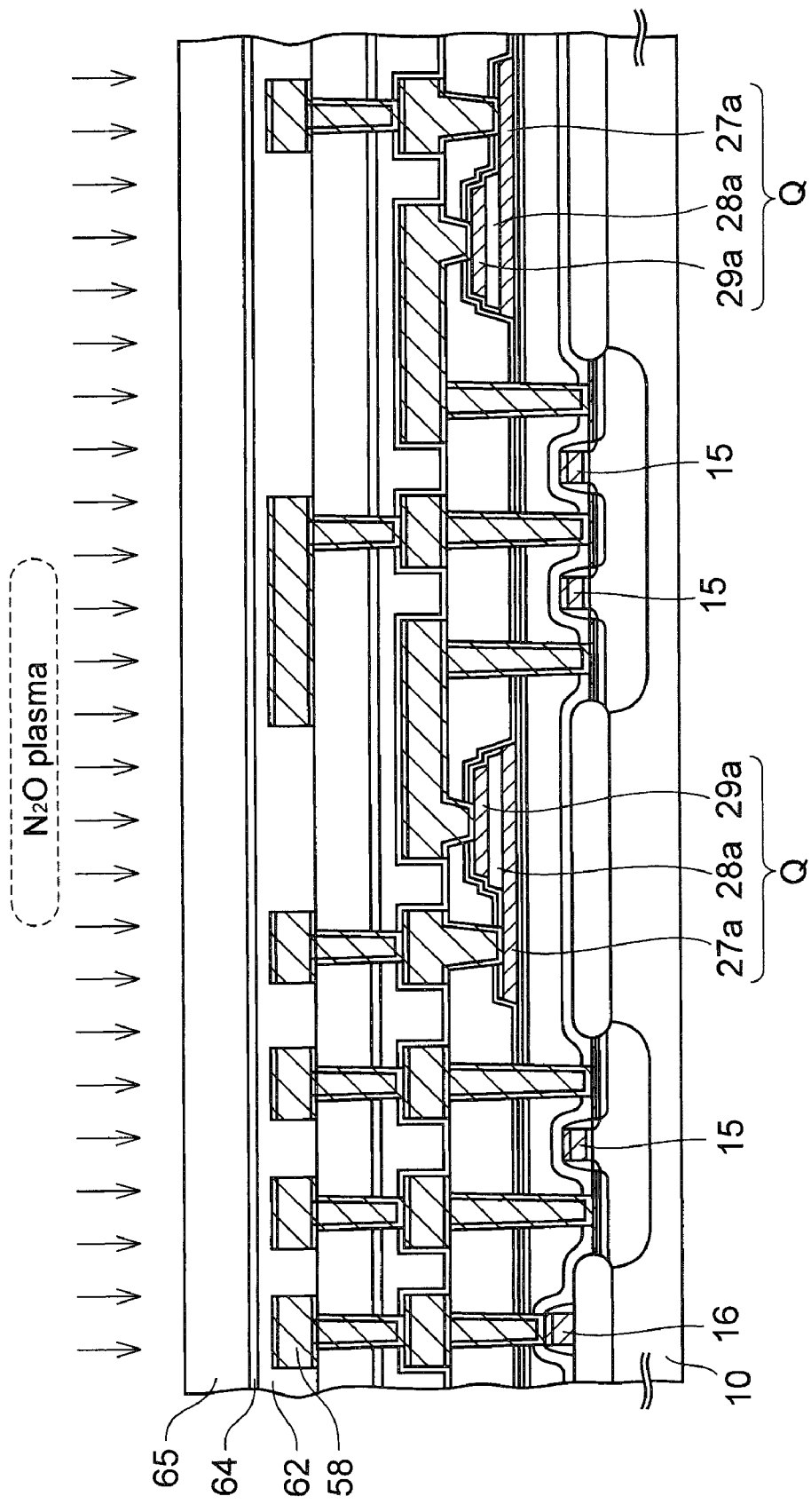
Figure 3Q:
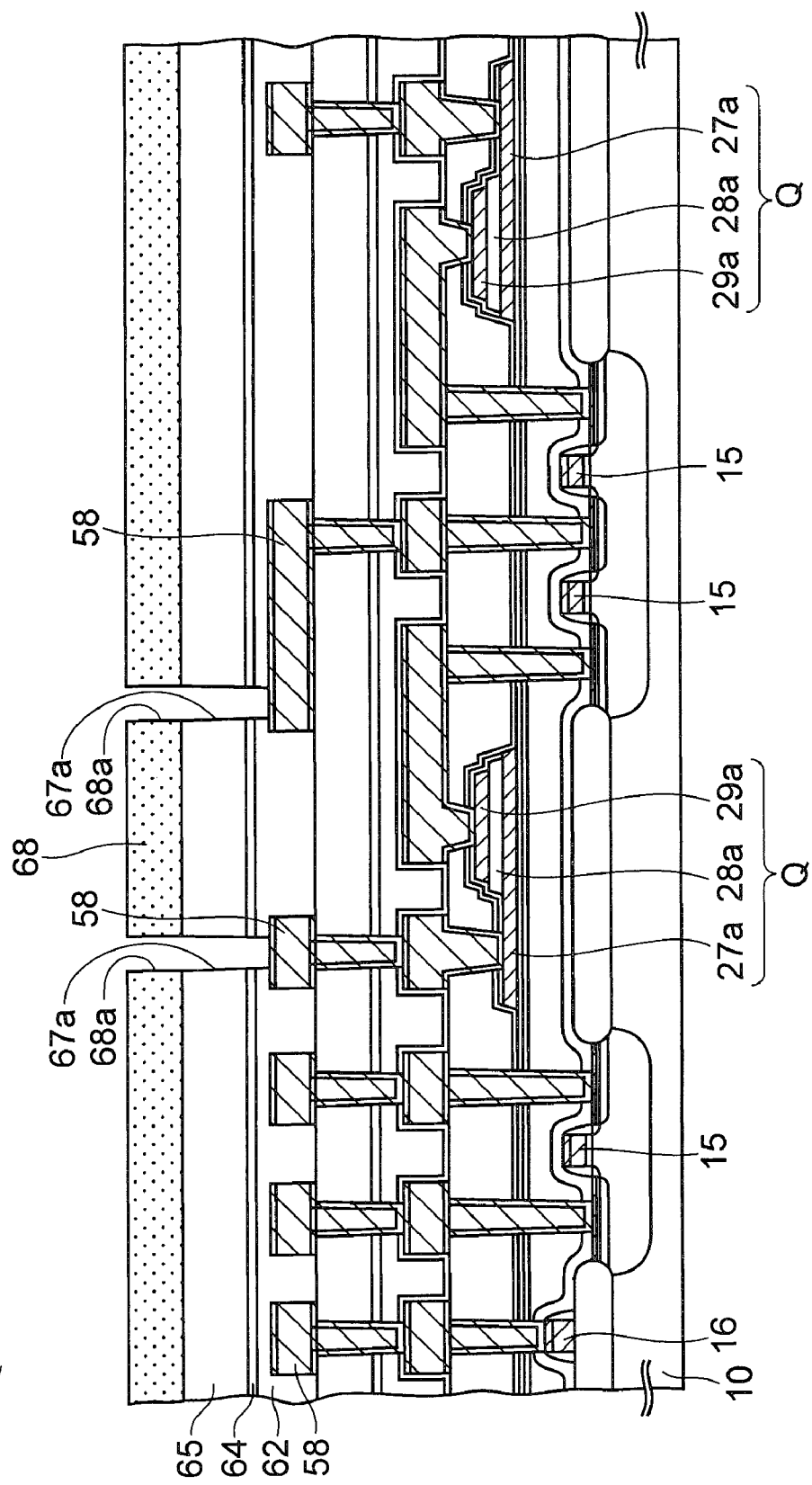
Figure 3S:
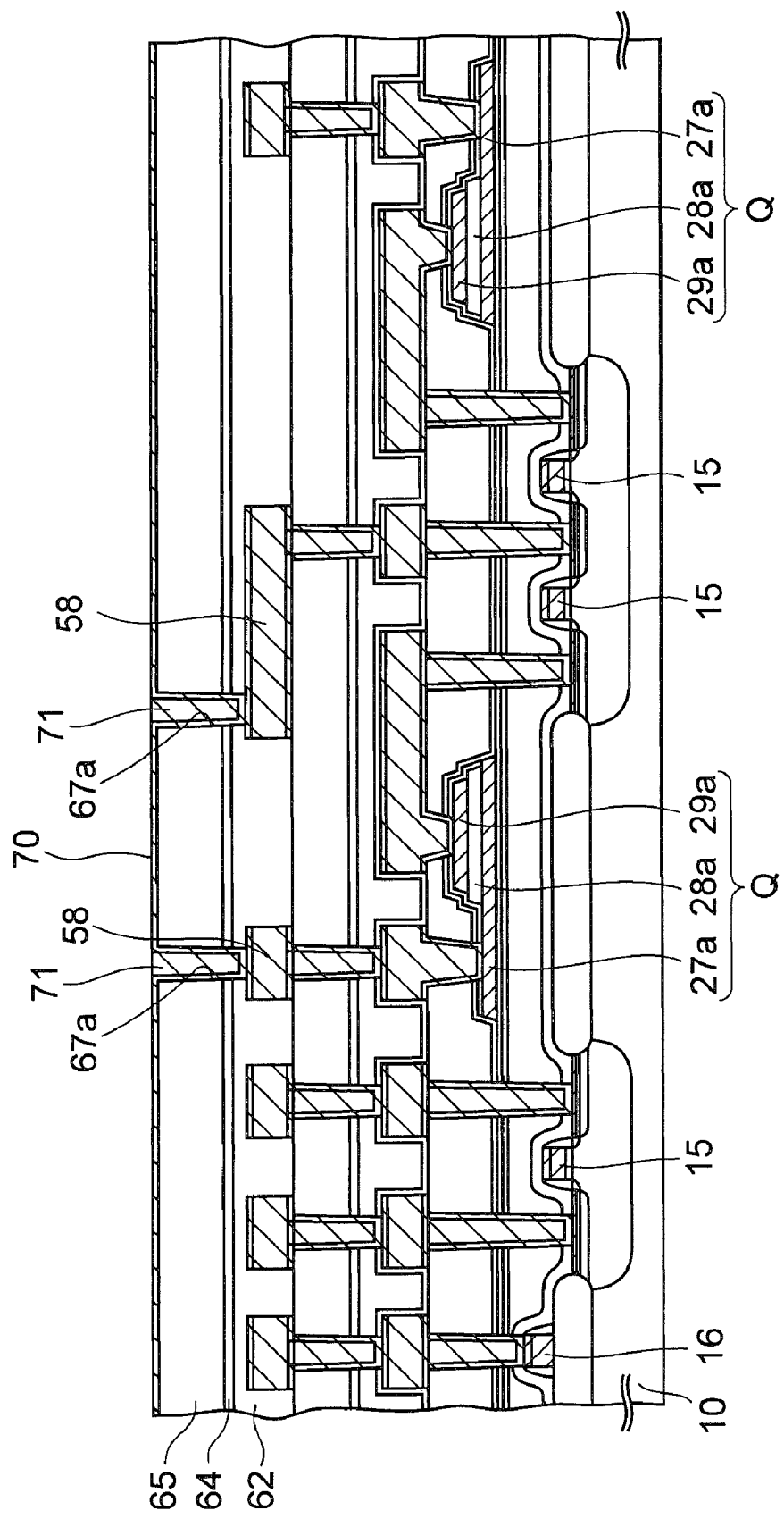
Figure 3T:
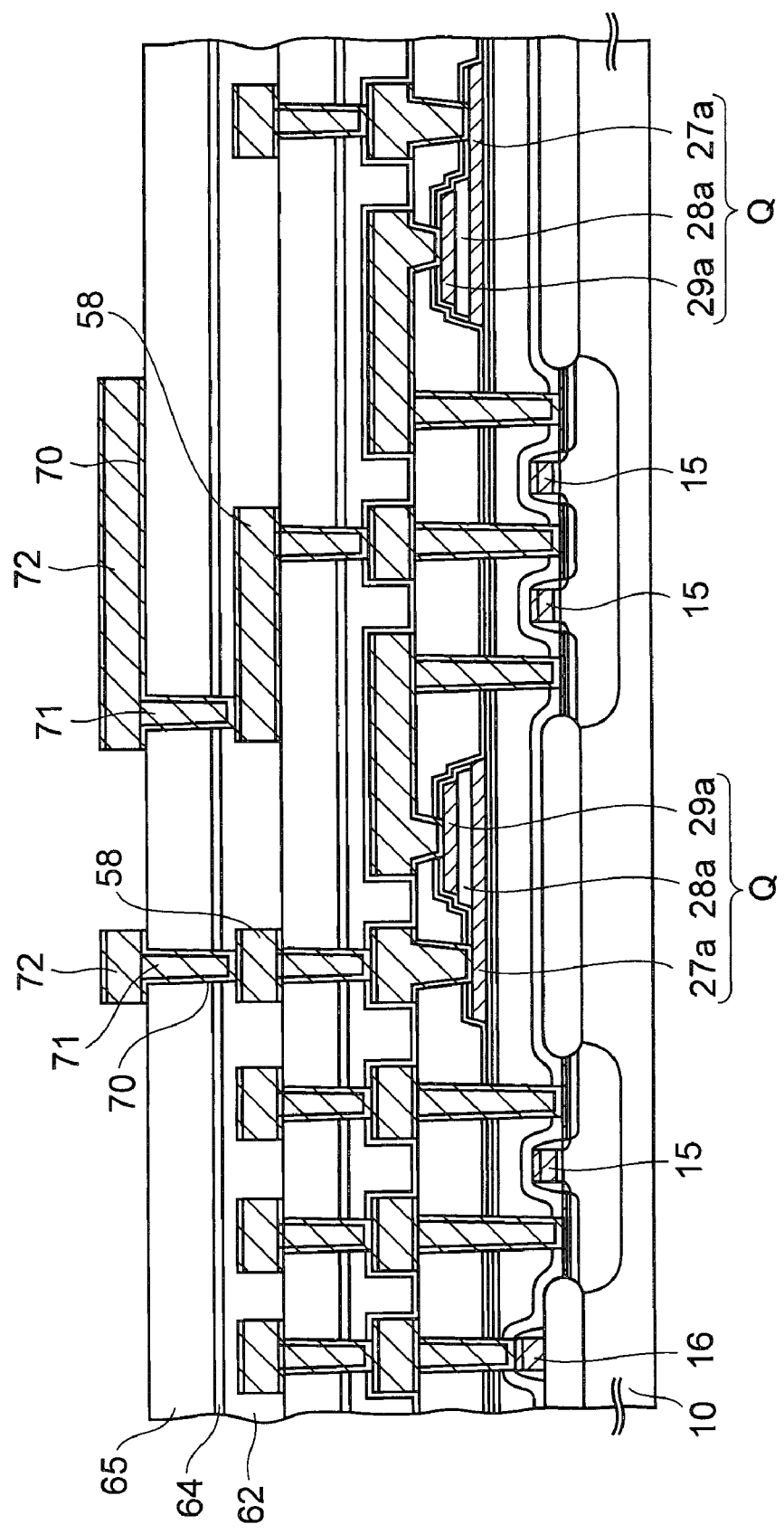
Figure 3U:
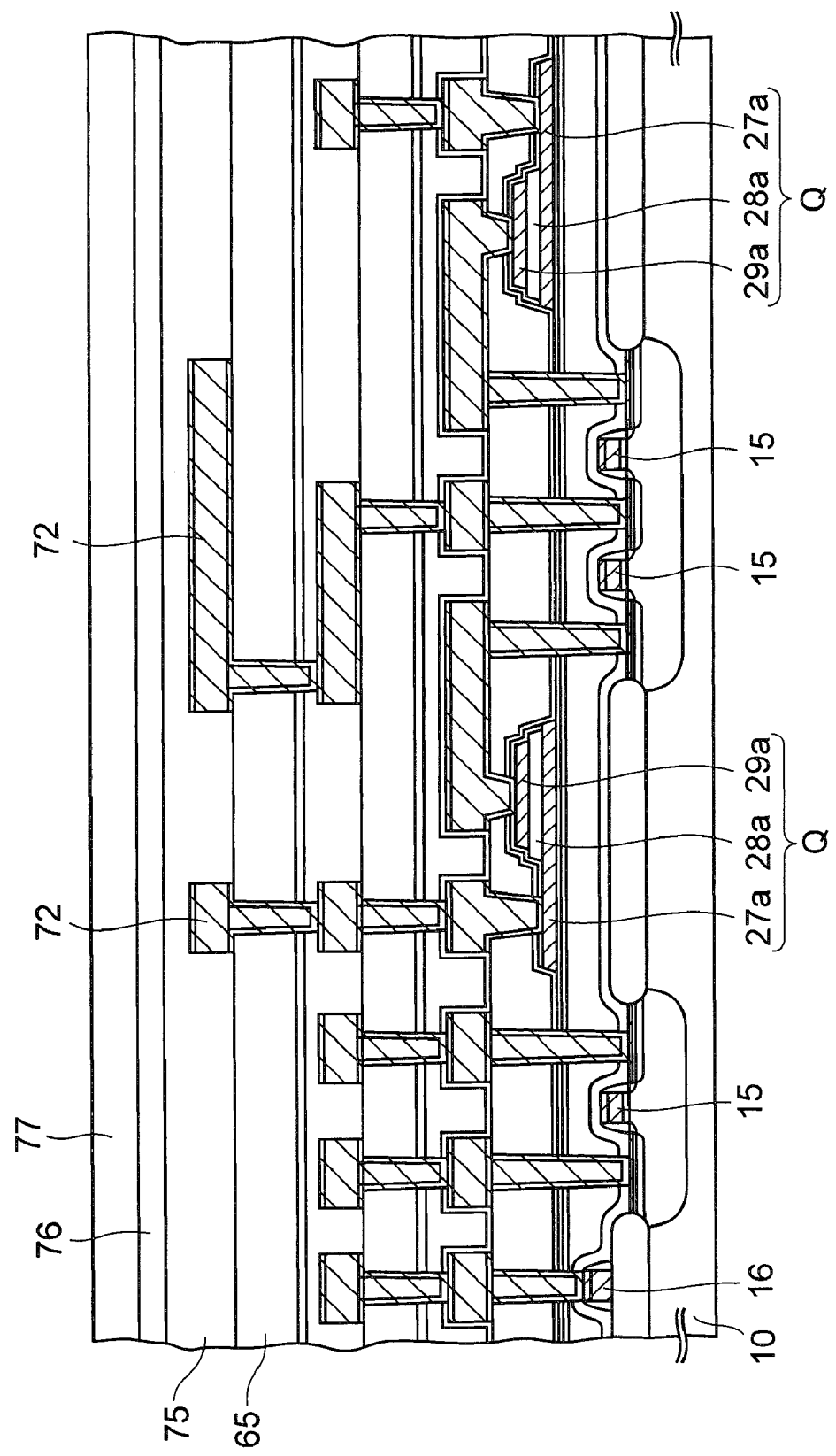

FIGS. 3A to 3U are cross-sectional views of manufacturing a semiconductor device according to a first embodiment. Note that in these figures, same reference numerals are given to denote components same as those described in the preliminary explanation, and the description thereof will not be repeated.

To form a semiconductor device according to the present embodiment, the above-described processes of FIGS. 1A to 1N are firstly carried out. Thereby, as shown in FIG. 3A, a structure, in which a first insulating film 48 with an upper surface thereof being planarized by CMP is formed in the uppermost layer, can be obtained.

In addition, as shown in the dotted-line circle, a fine scar (micro scratch) 48a caused by a scar of a polishing pad at the time of CMP is formed on the upper surface of a first insulating film 48. If such a scar 48a is formed, it is difficult to form a capacitor protective insulating film formed of alumina with excellent flatness on the first insulating film 48.

To deal with this problem, in the next process, as shown in FIG. 3B, a surface layer portion of the first insulating film 48 is etched back by sputtering etching using Ar plasmas in an inductively coupled plasma (ICP) type plasma etching chamber. Thereby, the scar 48a generated in the CMP is removed. A depth of this etching back is set to be deeper than that of the scar 48a, for example, approximately 5 nm to 100 nm.

The conditions for the sputtering etching are not particularly limited. In the present embodiment, a high frequency power with a frequency of 400 KHz and power of 500 W to 1000 W, for example 800 W, is used as bias power, and a high frequency power with a frequency of 13.56 MHz and power of 1000 W to 2000 W, for example 1400 W, is used as source power. In addition, a flow rate of an Ar gas is set to 50 sccm, and a pressure in the chamber is set to 0.5 Pa to 1.5 Pa, more preferably 0.7 Pa. With these etching conditions, an etching rate of approximately 300 nm per minute can be obtained against the first insulating film 48 made of silicon oxide that is formed by using the TEOS gas.

In addition, in place of etching back using the Ar plasmas, the first insulating film 48 may be etched back by dry etching. In this case, a fluorinated gas, for example, a gas containing $CF_4$ or $C_4F_8$, is used as an etching gas.

Furthermore, the first insulating film 48 may be etched back by wet etching using fluorinated acid.

As the result of this etching back, a thickness $D_1$ (first film thickness) of the first insulating film 48 becomes 50 nm to 1000 nm over the first layer metal wirings 45. The thickness $D_1$ is set to preferably 50 nm to 500 nm, more preferably 50 nm to 300 nm, and further more preferably 50 nm to 150 nm.

Note that the minimum thickness $D_1$ is set to 50 nm because, if the thickness of the first insulating film 48 is set to thinner than 50 nm, the first capacitor protective film 46 on the first layer metal wirings 45 might be removed by the etching back or variation of the polishing amount of the CMP for the film 48. As a consequence, reductants, such as hydrogen, penetrate from the portion at which the first capacitor protective film 46 is removed, which may possibly causes deterioration of capacitors Q.

Thereafter, as shown in FIG. 3C, $N_2O$ plasma processing is carried out on the surface of the first insulating film 48. Thereby, the first insulating film 48 is dehydrated, and the surface thereof is nitrided so as to prevent the first insulating film 48 from resorbing the moisture. As is similar to the case described in FIG. 1O, this $N_2O$ plasma processing is carried out under conditions with a substrate temperature of approximately 350° C. and a processing time of approximately four minutes in CVD equipment.

Here, the upper surface of the first insulating film 48 is planarized by the etching back as described in FIG. 3B. Thus, the scar 48a caused at the time of CMP is removed from the first insulating film 48. Accordingly, there is no need to form a cap insulating film 49 for filling the scar 48a as described in FIG. 1P.

For this reason, in the next step, as shown in FIG. 3D, an alumina film is formed as a second capacitor protective insulating film 50 directly on the upper surface of the first insulating film 48 by the sputtering method without forming the cap insulating film 49. The thickness of the second capacitor protective insulating film 50 is as thin as approximately 50 nm. However, since the upper surface of the first insulating film 48 is planarized by etching back as described above, the second capacitor protective insulating film 50 can be evenly formed on the first insulating film 48. Thus, reductants, such as hydrogen, can be effectively blocked in the entire portion of the second capacitor protective insulating film 50.

In addition, as described above, the cap insulating film 49 (see, FIG. 1P) can be omitted. Thereby, in the present embodiment, the process of forming the cap insulating film 49 and $N_2O$ plasma processing (FIG. 1Q) for dehydrating the cap insulating film 49 can be omitted, so that the number of manufacturing processes of a FeRAM can be reduced.

Next, as shown in FIG. 3E, a first cover insulating film 51 described in FIG. 1S is formed on the second capacitor protective insulating film 50.

A thickness $D_2$ (second film thickness) of the first cover insulating film 51 over the first layer metal wirings 45 is, for example, 1000 nm, which is thicker than that of the first film thickness $D_1$.

Next, as shown in FIG. 3F, $N_2O$ plasma processing is carried out again in CVD equipment to dehydrate the first cover insulating film 51 and nitride the surface thereof so as to prevent the first cover insulating film 51 from resorbing moisture. This $N_2O$ plasma processing is carried out under conditions with a substrate temperature of 350° C. and a processing time of two minutes.

Next, as shown in FIG. 3G, a third resist pattern 53 described in FIG. 1U is formed on the first cover insulating film 51. After that, by supplying a mixed gas of $C_4F_8$, Ar, and $O_2$ as an etching gas to a parallel plate-type plasma etching chamber, each of the insulating films 46, 48, 50, and 51 is etched through seventh windows 53a to form third holes 54a in these films on the first layer metal wirings 45.

Thereafter, the third resist pattern 53 is removed.

Next, processes for obtaining a cross-sectional structure shown in FIG. 3H will be described.

Firstly, while maintaining the substrate temperature at approximately 200° C., a titanium nitride film is formed with a thickness of approximately 150 nm on the inner surfaces of the third holes 54a and on the upper surface of the third cap insulating film 51 by the sputtering method. The titanium nitride film thus formed is used as a first glue film 56.

Subsequently, a tungsten film (plug conductive film) 57a is formed with a thickness that the third holes 54a are completely embedded, for example, the thickness of 650 nm, on the first glue film 56 by the plasma CVD method using a tungsten hexafluoride gas. The film-forming temperature of the tungsten film 57a is, for example, approximately 430° C.

Here, as described in the preliminary explanation, residual moisture in the first insulating film 48 is vaporized by heat generated when the first glue film 56 and the tungsten film 57a are formed, and the vaporized moisture is to escape to the outside. Since the upper and lower surfaces of the first insulating film 48 are blocked by the first and second capacitor protective insulating films 46 and 50, the moisture can escape substantially only from the third holes 54a. In the example described in the preliminary example, the vaporized moisture prevents the first glue film 56 and the tungsten film 57a from filling the third holes 54a preferably.

In contrast, in the present embodiment, the thickness $D_1$ (first film thickness) of the first insulating film 48 on the first layer metal wirings 45 is set to equal to or less than the thickness $D_2$ (second film thickness) of the first cover insulating film 51. Thereby, the amount of moisture generated from the first insulating film 48 can be set to equal or less than that of the first cover insulating film 51.

Furthermore, occupying ratio of the first insulating film 48 in the third hole 54a is equal to or less than that of the first cover insulating film 51. Thus, the amount of residual moisture escaping from the first insulating film 48 to the third holes 54a is reduced. Accordingly, the third holes 54a can be preferably embedded by the first glue film 56 and the tungsten film 57a.

Next, as shown in FIG. 3I, the tungsten film 57a is etched back and removed from the upper surface of the first cover insulating film 51 so as to be left only in the third holes 54a. Thereby, a fifth conductive plug 57, which is electrically connected to the first layer metal wiring 45 and is formed of tungsten, is formed in each of the third holes 54a.

Although the tungsten film is etched back in the present example, CMP may be employed in place of etching back.

As described above, the third holes 54a are preferably embedded by the first glue film 56 and the tungsten film 57a. Accordingly, contact resistance of each fifth conductive plug 57 and the corresponding first layer metal wiring 45 becomes a designed value, so that the number of the fifth conductive plugs 57 to cause contact defect can be reduced.

Thereafter, by carrying out the process described in FIG. 1X, as shown in FIG. 3J, second layer metal wirings 58, each being electrically connected to the corresponding fifth conductive plug 57, are formed on the first cover insulating film 51.

Here, as described by referring to FIG. 1X, the first cover insulating film 51 is formed, so that the film thickness of the second capacitor protective insulating film 50 can be prevented from being thinned at the time of pattering the second layer metal wirings 58. Accordingly, the blocking capability of the second capacitor protective insulating film 50 against reductants can be preferably maintained.

Furthermore, by carrying out the processes described in FIGS. 1Y and 1Z, as shown in FIG. 3K, a structure, in which a second insulating film 62 made of silicon oxide is formed in the uppermost layer, is obtained. Since CMP is carried out on the upper surface of the second insulating film 62, a fine scar (micro scratch) 62a caused by CMP is formed on the upper surface of the second insulating film 62.

Next, as shown in FIG. 3L, a surface layer portion of the second insulating film 62 is etched back by the depth deeper than the scar 62a, for example, approximately 50 nm to 100 nm by sputtering etching using Ar plasmas in an ICP-type plasma etching chamber. Thereby, the scar 62a is removed. Since the conditions for this sputtering etching are the same as those carried out on the first insulating film 48 (see FIG. 3B), description thereof will be omitted here.

In addition, in place of etching back using the Ar plasmas, the first insulating film 48 may be etched back by dry etching using, as an etching gas, a fluorinated gas, for example a gas containing $CF_4$ or $C_4F_8$, or by wet etching using fluorinated acid.

Then, as a result of such etching back, a thickness $D_3$ (third film thickness) of the second insulating film 62 on the second layer metal wirings 58 becomes approximately 50 nm to 900 nm.

Next, as shown in FIG. 3M, $N_2O$ plasma processing is carried out on the second insulating film 62 in CVD equipment. Thereby, the second insulating film 62 is dehydrated and the upper surface thereof is nitrided to prevent the second insulating film 62 from resorbing moisture. The $N_2O$ plasma processing is carried out under conditions with a substrate temperature of 350° C. and a processing time of four minutes.

Next, as shown in FIG. 3N, as a third capacitor protective insulating film 64 for protecting a capacitor dielectric film 28a from reductants, an alumina film is formed with a thickness of approximately 50 nm directly on the second insulating film 62 by the sputtering method.

As described by referring to FIG. 3L, the scar 62a on the upper surface of the second insulating film 62 is removed by etching back. Thus, even if the third capacitor protective insulating film 64 with a thickness of as thin as 50 nm is directly formed on the second insulating film 62, the film thickness of the third capacitor protective insulating film 64 is prevented from being thinned in the portion where the scar 62a is present. Thus, the thickness of the third capacitor protective insulating film 64 can be formed even in the entire portion on the second insulating film 62, and therefore reductants, such as hydrogen, can be effectively blocked by the third capacitor protective insulating film 64.

Next, as shown in FIG. 3O, a second cover insulating film 65 formed of silicon oxide, which is described in FIG. 2E, is formed on the third capacitor protective insulating film 64.

A thickness $D_4$ (fourth film thickness) of the second cover insulating film 65 over the second layer metal wirings 58 is, for example, 1000 nm, which is thicker than the third film thickness $D_3$.

Subsequently, as shown in FIG. 3P, $N_2O$ plasma processing is carried out on the second cover insulating film 65 in a CVD equipment under conductions with a substrate temperature of 350° C. and a processing time of two minutes. Thereby, the second cover insulating film 65 is dehydrated and the surface thereof is nitrided so as to prevent the second cover insulating film 65 from resorbing moisture.

Next, processes for obtaining a cross-sectional structure shown in FIG. 3Q will be described.

Firstly, a fourth resist pattern 68, which is described in FIG. 2G, is formed on the second cover insulating film 65.

Subsequently, each of the insulating films 62, 64, and 65 is etched through eighth windows 68a by supplying a mixed gas of $C_4F_8$, Ar, and $O_2$ as an etching gas to a parallel plate-type plasma etching chamber (unillustrated). Thereby, fourth holes 67a are formed in these insulating films on the second layer metal wirings 58.

After this etching is finished, the fourth resist pattern 68 is removed.

Next, as shown in FIG. 3R, a titanium nitride film is formed, as a second glue film 70, with a thickness of approximately 150 nm on the inner surfaces of the fourth holes 67a and on the upper surface of the second cover insulating film 65 by the sputtering method under the condition with a substrate temperature of approximately 200° C.

Furthermore, a tungsten film (plug conductive film) 71a is formed on the second glue film 70 by the CVD method. The fourth holes 67a are completely embedded by the tungsten film 71a. The tungsten film 71a is formed under the condition with a substrate temperature of, for example, approximately 430° C.

Here, residual moisture contained in the second insulating film 62 is vaporized by head generated when the second glue film 70 and the tungsten film 71a are formed. Since the upper surface of the second insulating film 62 is blocked by the third capacitor protective insulating film 64, the vaporized moisture is to escape from the fourth holes 67a to the outside.

In the present embodiment, as described above, the thickness $D_3$ of the second insulating film 62 is equal to or less than the thickness $D_4$ of the second cover insulating film 65 on the second layer metal wiring 58. Thus, the amount of the moisture generated from the second insulating film 62 is reduced when compared with that generated from the second cover insulating film 65.

Moreover, by adopting the film thickness as described above, occupying ratio of the second insulating film 62 in the side surface of the fourth hole 67a is made smaller than that of the second cover insulating film 65. Thus, the amount of the residual moisture escaping from the second insulating film 62 to the fourth holes 67a is reduced, so that the fourth holes 67a can be preferably embedded by the second glue film 70 and the tungsten film 71a.

After that, as shown in FIG. 3S, the excessive tungsten film 71a on the second cover insulating film 65 is polished and removed by the CMP method to leave the tungsten film 71a only in the fourth holes 67a as sixth conductive plugs 71.

As described above, the fourth holes 67a are preferably embedded by the second glue film 70 and the tungsten film 71a. Accordingly, each sixth conductive plugs 71 and the corresponding second layer metal wiring 58 are preferably electrically connected. Thus, the number of the sixth conductive plugs 71 causing contact defect can be reduced.

Next, by carrying out the same process as that described in FIG. 2J, as shown in FIG. 3T, third layer metal wirings 72, each being electrically connected to the corresponding sixth conductive plug 71, are formed on the second cover insulating film 65.

When the third layer metal wirings 72 are patterned, the second glue film 70 and the tungsten film 71a are over-etched in order not to leave residual films of etching on the second cover insulating film 65. Since the second cover insulating film 65 is formed on the third capacitor protective insulating film 64, the thickness of the third capacitor protective insulating film 64 is prevented from being thinned due to etching even when the over etching is carried out. Accordingly, the thickness of the third capacitor protective insulating film 64 can be sufficiently maintained, and the reductants, such as hydrogen, can be effectively blocked by the third capacitor protective insulating film 64.

Thereafter, as shown in FIG. 3U, a first passivation film 75 made of silicon oxide, a second passivation film 76 made of silicon nitride, and a protective layer 77 made of polyimide are sequentially formed on the entire upper surface of the silicon substrate 10.

With the processes described so far, the basic structure of the semiconductor device according to the present embodiment is completed.

Figure 4:
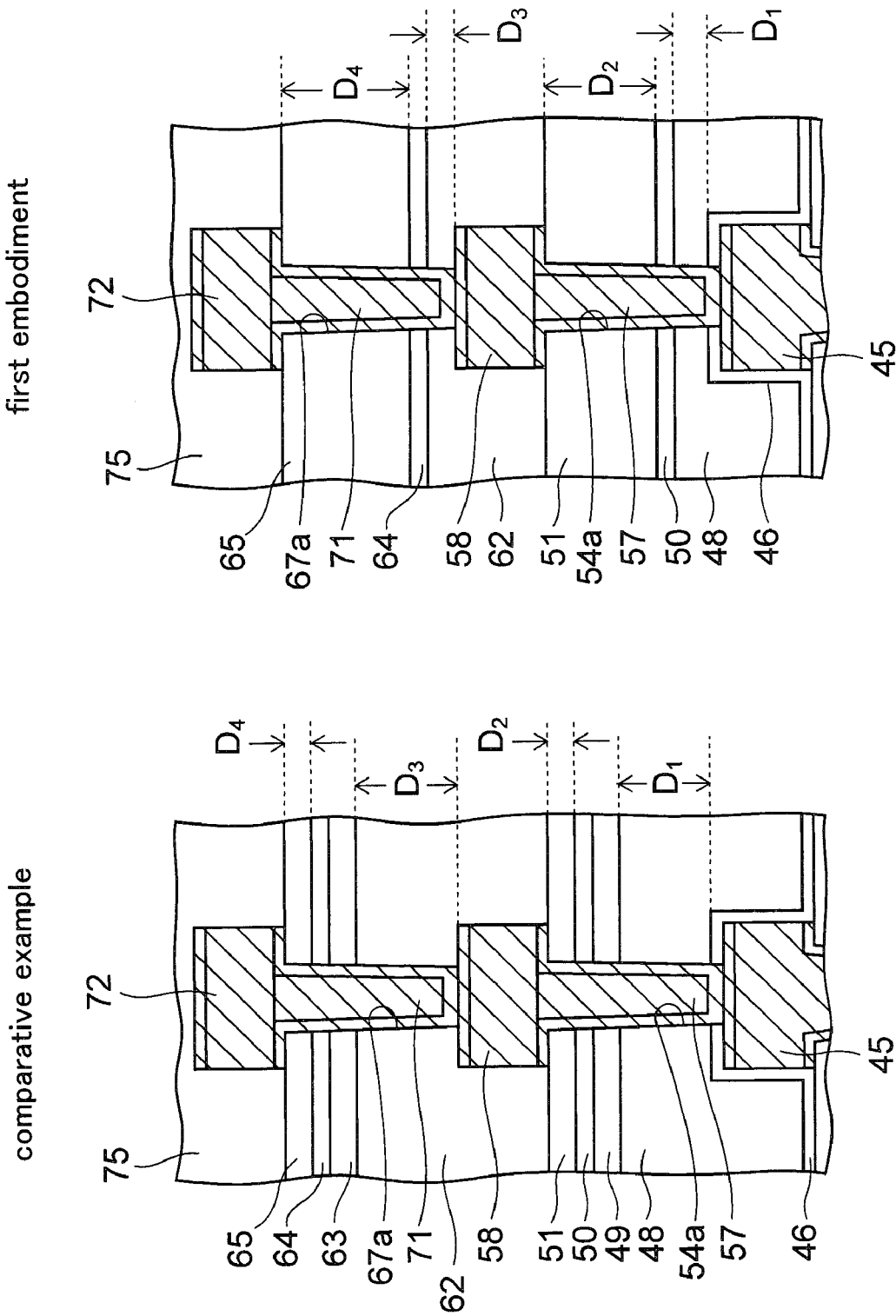
FIG. 4 is enlarged cross-sectional views of the semiconductor device according to the first embodiment and the semiconductor device that has been previously thought by the inventors.

FIG. 4 is enlarged cross-sectional views of the semiconductor device according to the present embodiment and the semiconductor device (a comparative example) described in the preliminary explanation.

FIG. 4 shows the thickness $D_1$ (first film thickness) of the first insulating film 48 over the first layer metal wiring 45 and the thickness $D_2$ (second film thickness) of the first cover insulating film 51 over the first layer metal wiring 45. In addition, FIG. 4 shows the thickness $D_3$ (third film thickness) of the second insulating film 62 on the second layer metal wiring 58 and the fourth thickness $D_4$ (fourth film thickness) of the second cover insulating film 65 over the second layer metal wiring 58.

In the comparative example (left) described in the preliminary explanation, the first film thickness $D_1$ is thicker than the second film thickness $D_2$. Accordingly, the amount of the moisture coming out from the first insulating film 48 due to heat generated when the fifth conductive plug 57 is formed becomes larger. As a result, it is likely that the fifth conductive plug 57 is not formed.

In contrast, in the present embodiment (right), the first film thickness $D_1$ is set to equal to or less than the second film thickness $D_2$. Accordingly, the amount of the moisture coming out from the first insulating film 48 to the third hole 54a becomes small, so that the fifth conductive plug 57 can be preferably embedded in the third hole 54a. As a result, the fifth conductive plug 57 and the first layer metal wiring 45 can be preferably electrically connected. Thus, contact defect of the fifth conductive plug 57 can be prevented.

Incidentally, in the present embodiment, if an interval between the first and second layer metal wirings 45 and 58 has to be changed, the thickness $D_1$ of the first insulating film 48 is fixed, and the thickness $D_2$ of the first cover insulating film 51 is adjusted.

The following table 1 shows results obtained by investigating the number of fifth conductive plugs 57 which are not formed on a wafer (semiconductor substrate 10) in the examples described in the present embodiment and the preliminary explanation.

TABLE 1

|  | The number of plugs that is not formed |
| --- | --- |
| Comparative Example | 49 |
| Present Embodiment | 6 |

Note that in this investigation, an optical defect inspection equipment manufactured by KLA-Tencor Corporation is used. In such optical defect inspection equipment, the normally-formed fifth conductive plugs 57 are seen as slightly-white dots, while the fifth conductive plugs 57, which are defectively embedded, are seen as black dots.

In addition, as the comparative example of the table 1, the example that the first film thickness $D_1$ is set to 1000 nm on the left of the FIG. 4 is adopted. In addition, as the present embodiment, the example that the first film thickness $D_1$ is set to 600 nm on the right of the FIG. 4 is adopted.

As is clear from the table 1, in the comparative example, as many as 49 fifth conductive plugs 57 are not formed for each wafer. In contrast, in the present embodiment, the number of unformed fifth conductive plugs 57 is reduced to 9. In this manner, the effects of the present embodiment can be seen.

In addition, in the present embodiment, the third film thickness $D_3$ is set to equal to or less than the fourth film thickness $D_4$. Accordingly, from a reason similar to that described above, the amount of the moisture coming out from the second insulating film 62 to the fourth holes 67a due to heat generated when the sixth conductive plugs 71 are formed can be reduced. For this reason, the sixth conductive plugs 71 are prevented from being defectively formed in the fourth holes 67a, and thus contact defect to be caused between the sixth conductive plugs 71 and the second layer metal wirings 58 can be suppressed.

Moreover, in the present embodiment, as described by referring to FIG. 3B, the upper surface of the first insulating film 48 after CMP is etched back so that the fine scar (micro scratch) 48a formed by CMP is removed. Thus, the step of forming the cap insulating film 49 and the step of performing the $N_2O$ plasma processing for moisture absorption prevention for the cap insulating film 49, which are described in the preliminary explanation, can be omitted.

Figure 5:
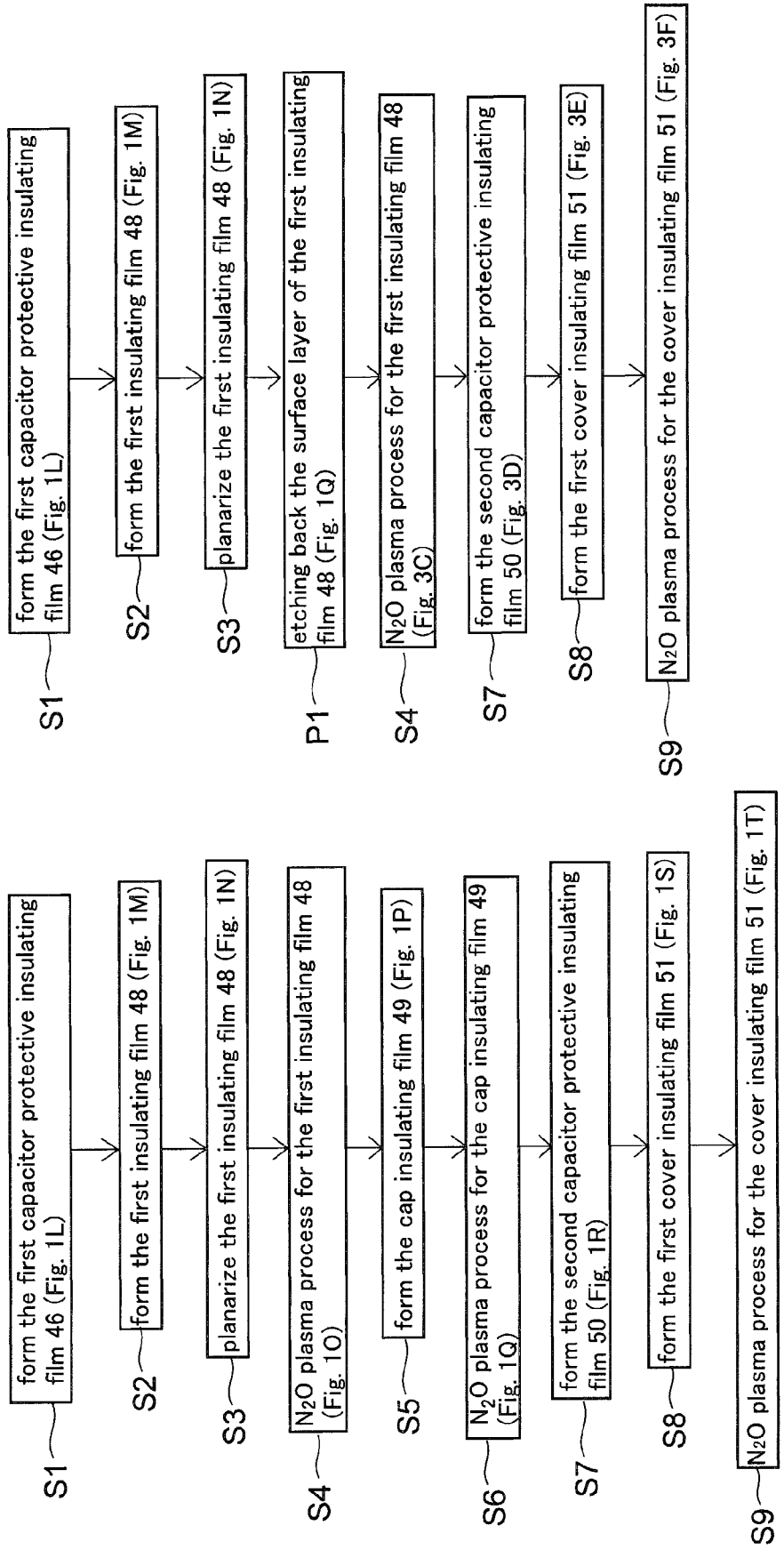
FIG. 5 is flowcharts respectively showing processes from formation of a first layer metal wiring until $N_2O$ plasma processing is carried out on a first cover insulating film in a method for manufacturing a semiconductor device according the first embodiment and a method for manufacturing a semiconductor device that has been previously thought by the inventors.

FIG. 5 shows flowcharts, each of which briefly shows main manufacturing steps (S1 to S9) from the step of forming the first layer metal wirings 45 to the step of carrying out $N_2O$ plasma processing on the first cover insulating film 51, in the manufacturing method of the semiconductor device according to the present embodiment and in the manufacturing method of the semiconductor device described in the preliminary example.

As shown in FIG. 5, in the present embodiment, only the step P1 of carrying out etching back on the first insulating film 48 is added, but the steps S5 and S6 of the comparative example can be omitted. Accordingly, the manufacturing processes of the semiconductor device can be shortened, and thus the manufacturing cost of the semiconductor device can be made inexpensive.

From a reason similar to the above, in the present embodiment, the cap insulating film 63 (see, FIG. 2B) described in the preliminary explanation can be omitted. Accordingly, the step of forming the cap insulating film 63 and the step of performing the $N_2O$ plasma processing for the cap insulating film 63 can be omitted. Thus, manufacturing cost of the semiconductor device can be further reduced.

(3) Second Embodiment

In the first embodiment, a planer-type FeRAM is described.

In the present embodiment, a stack-type FeRAM in which a conductive plug is formed directly under a capacitor lower electrode will be described. The stack-type FeRAM is advantageous in high integration of FeRAM because an area of occupancy of a capacitor can be made smaller than that of the planer-type FeRAM.

Figure 6A:
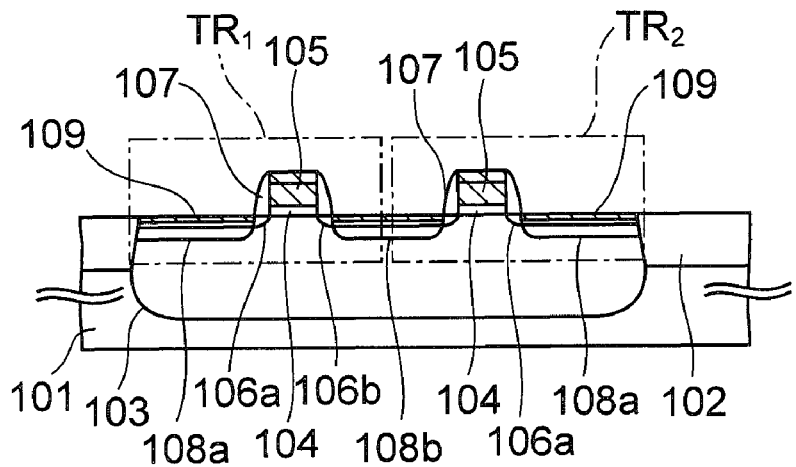
FIGS. 6A to 6X are cross-sectional views showing processes of manufacturing a semiconductor device according to a second embodiment.
Figure 6B:
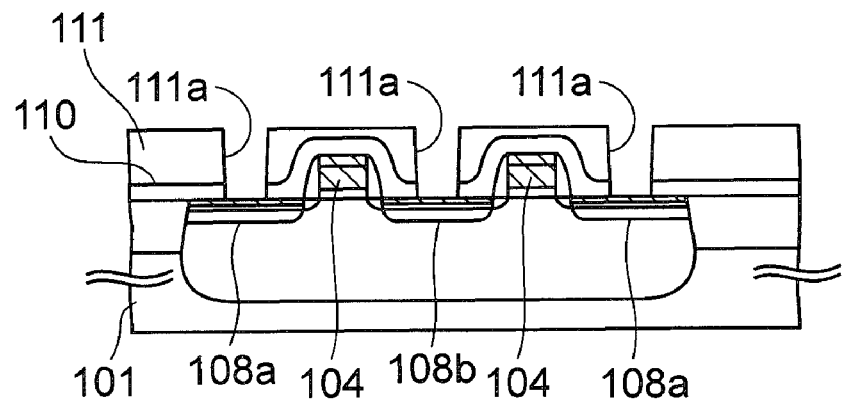
Figure 6C:
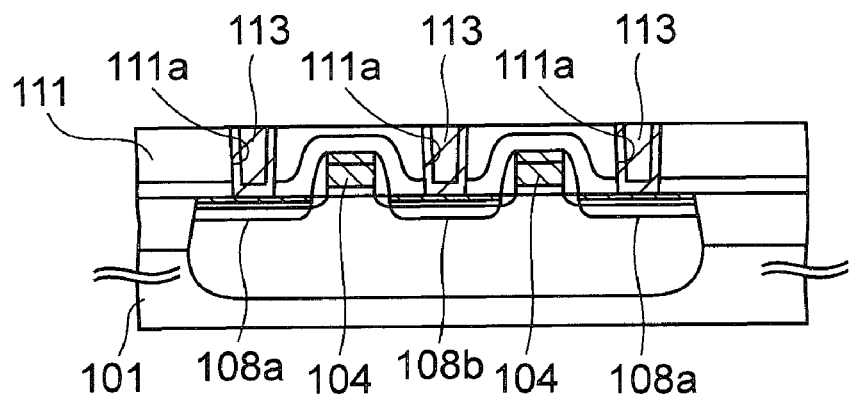
Figure 6D:
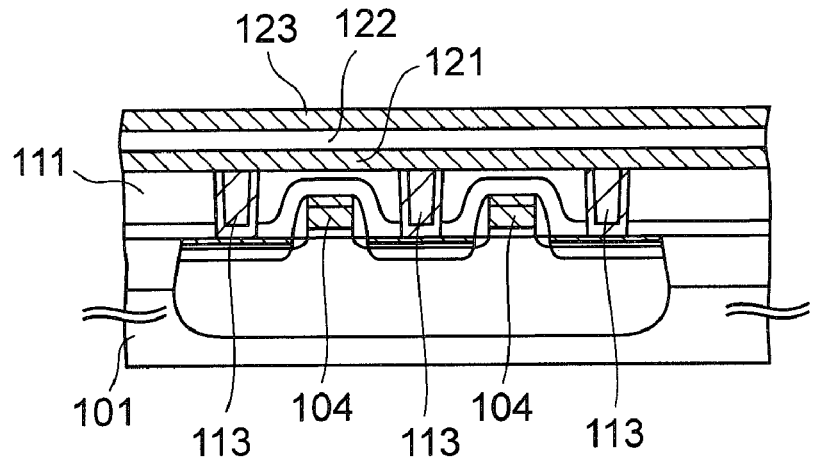
Figure 6E:
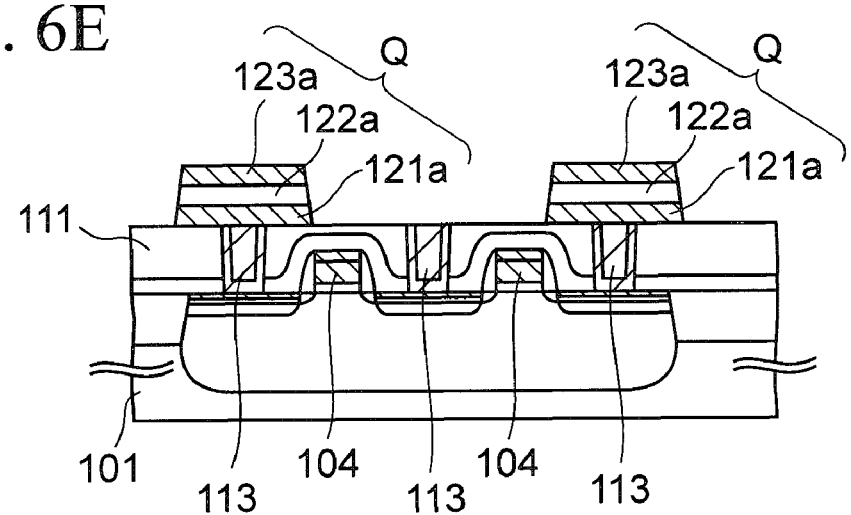
Figure 6F:
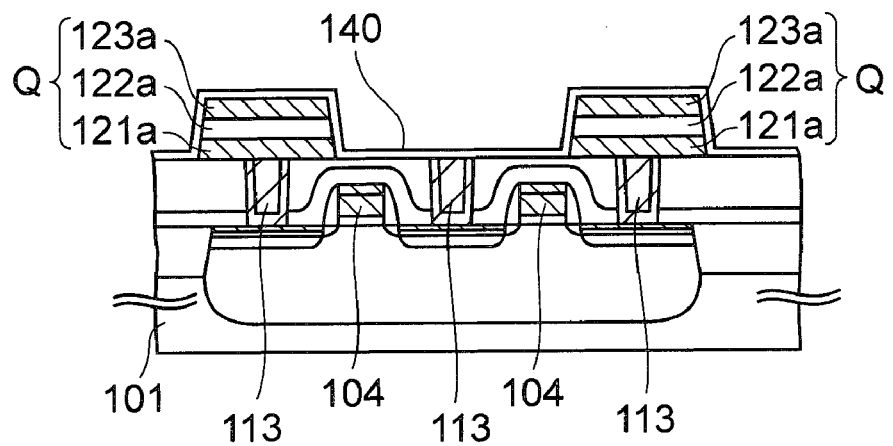
Figure 6G:
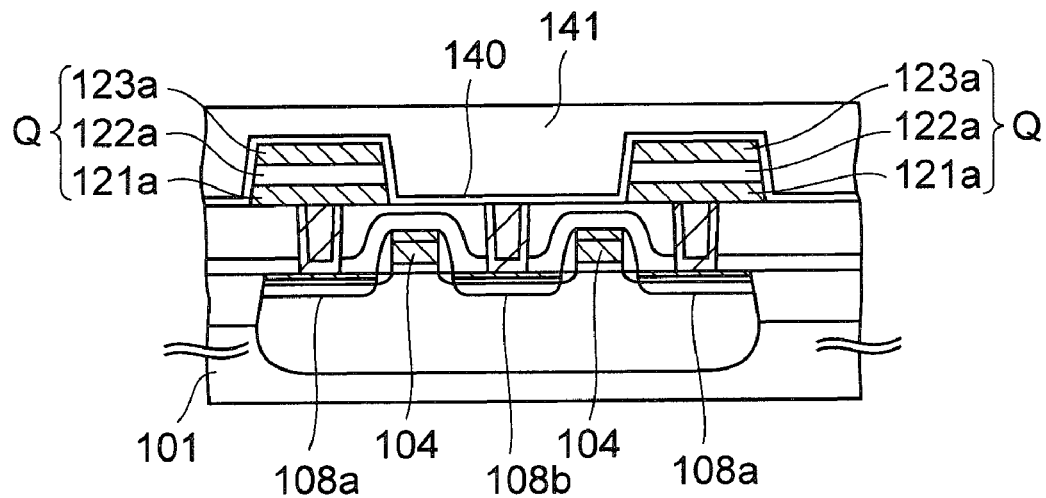
Figure 6H:
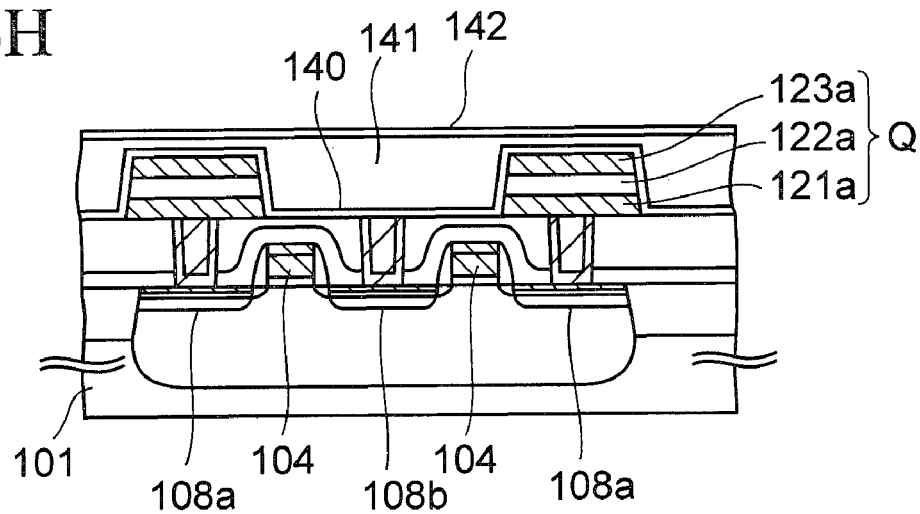
Figure 6I:
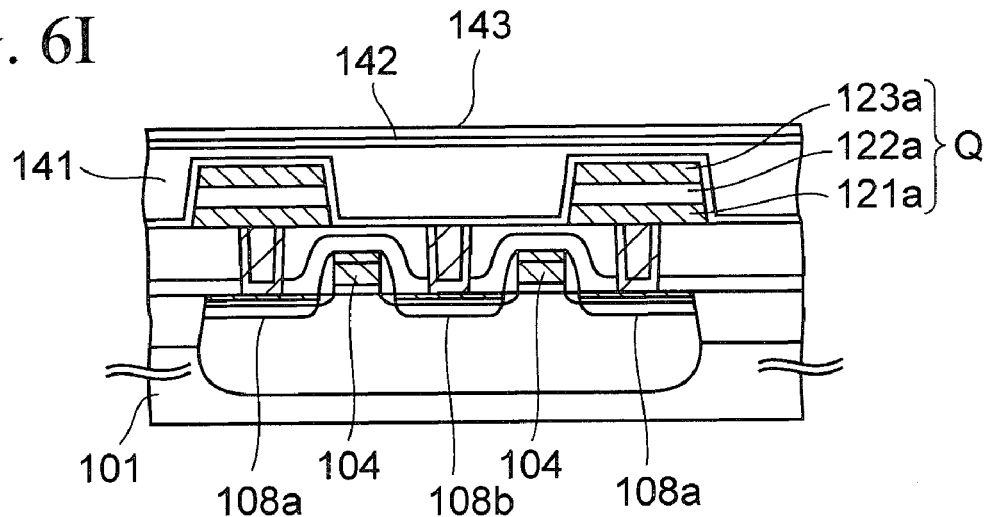
Figure 6J:
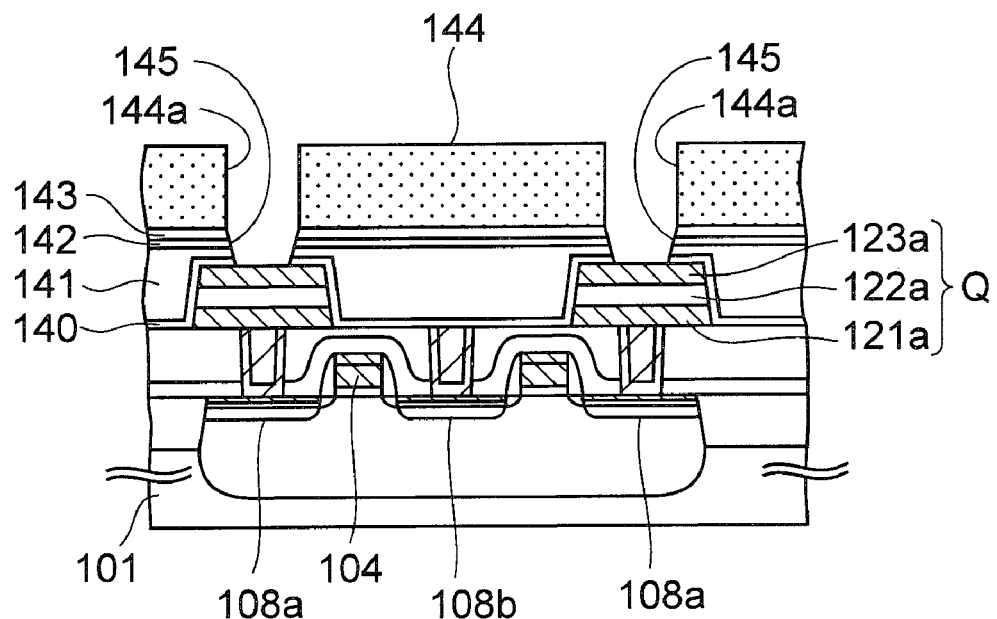
Figure 6K:
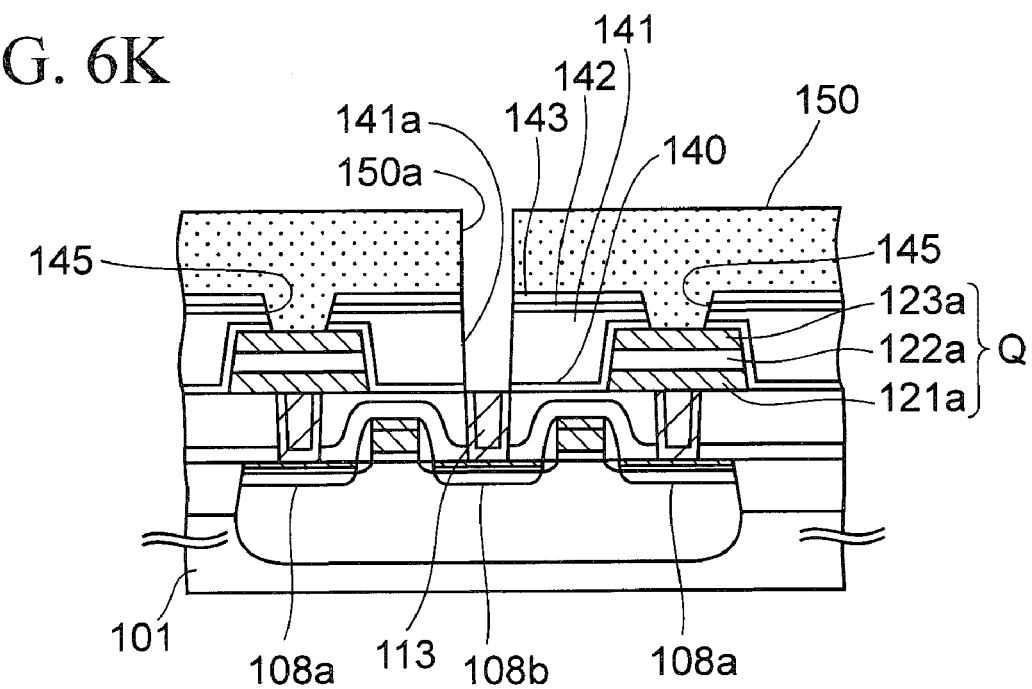
Figure 6L:
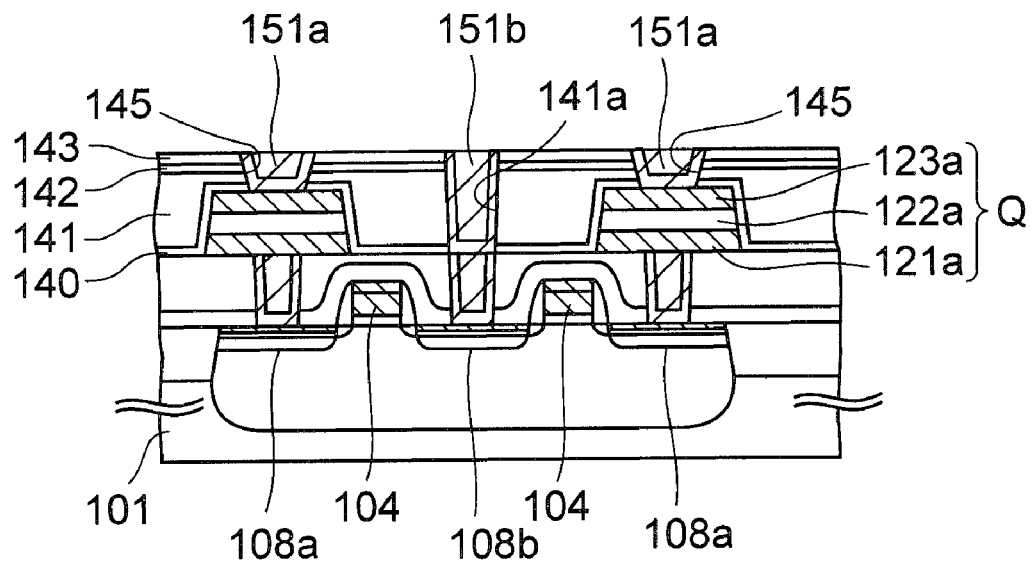
Figure 6M:
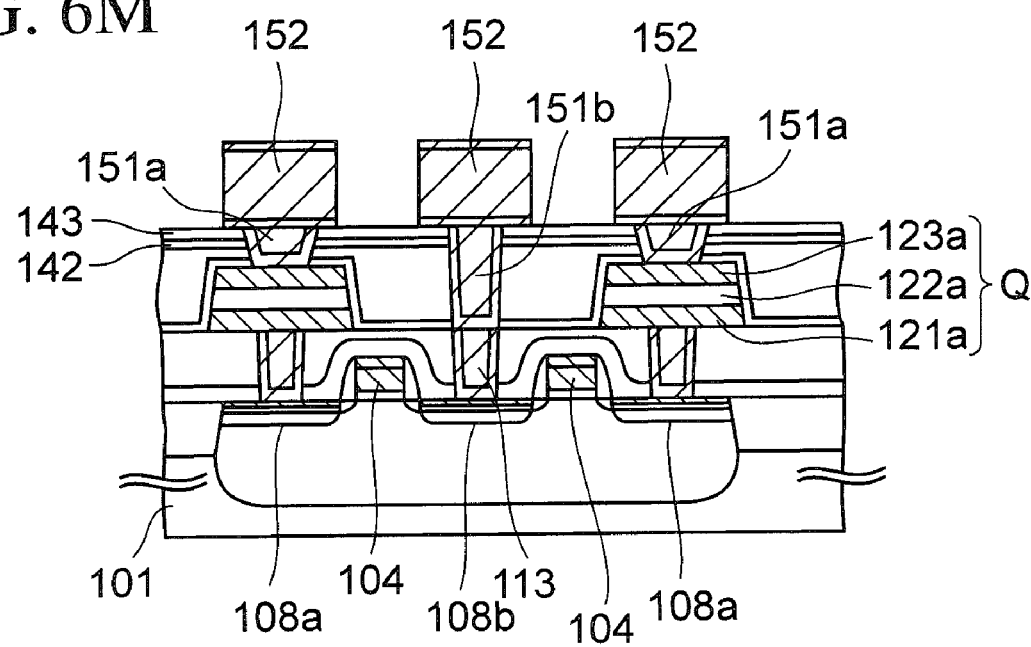
Figure 6N:
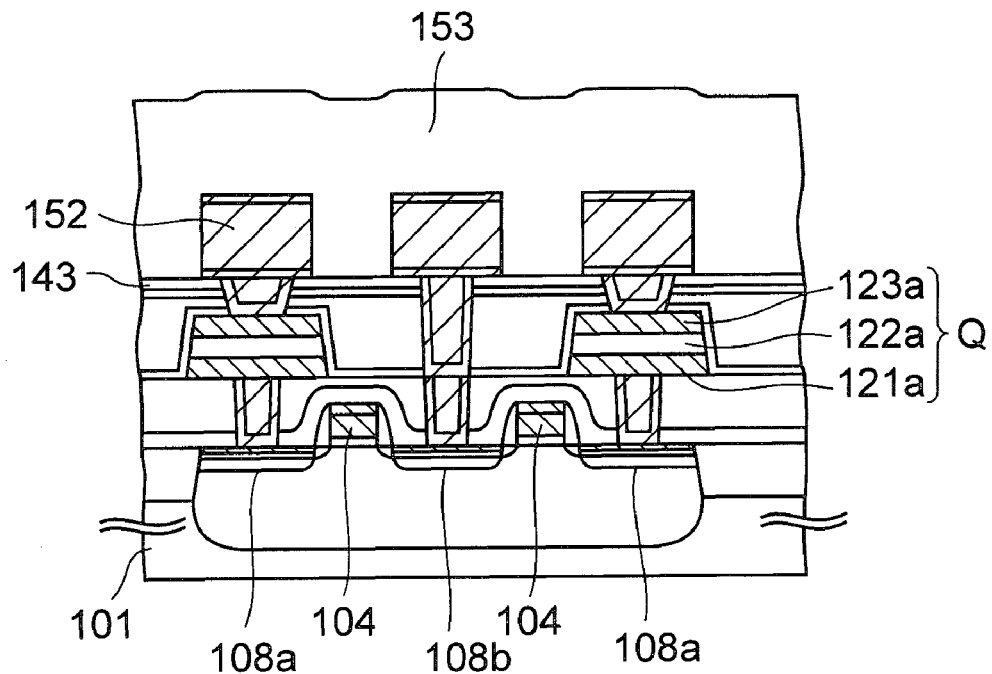
Figure 6O:
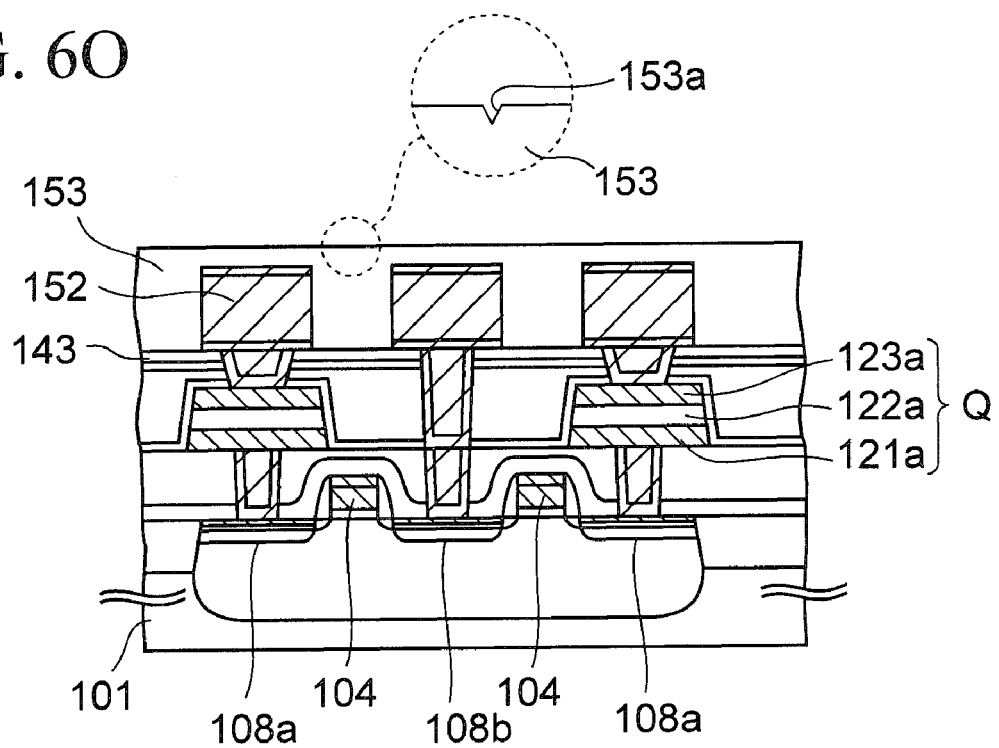
Figure 6P:
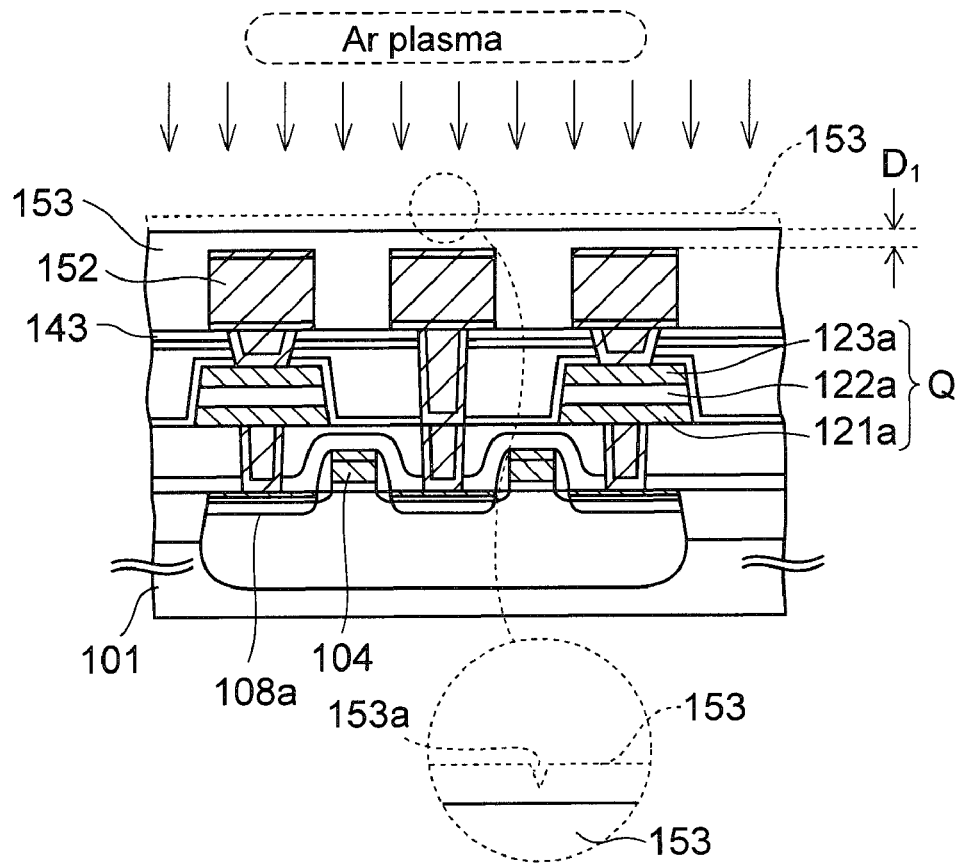
Figure 6Q:
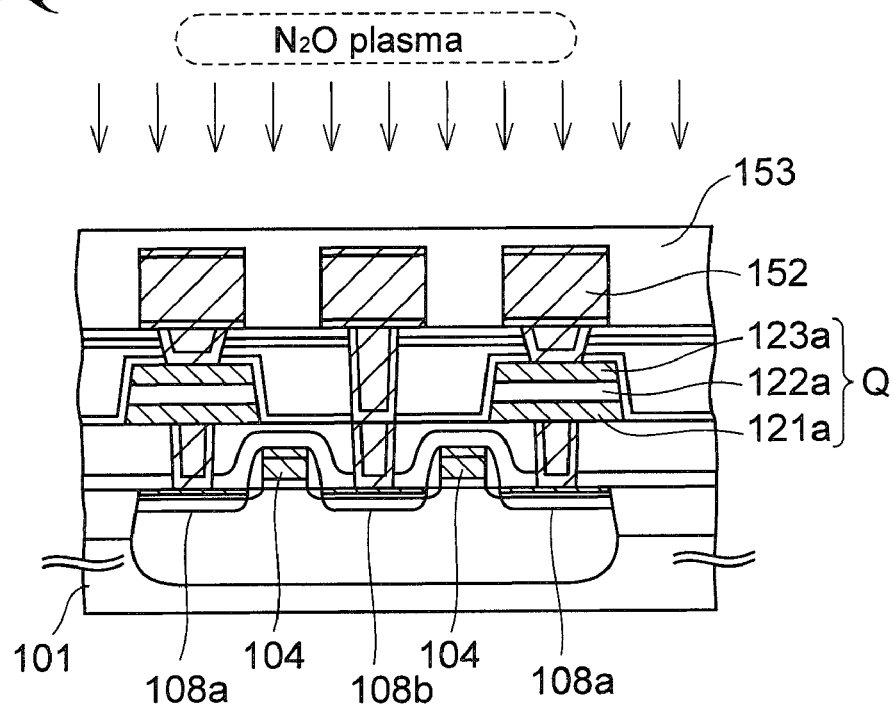
Figure 6R:
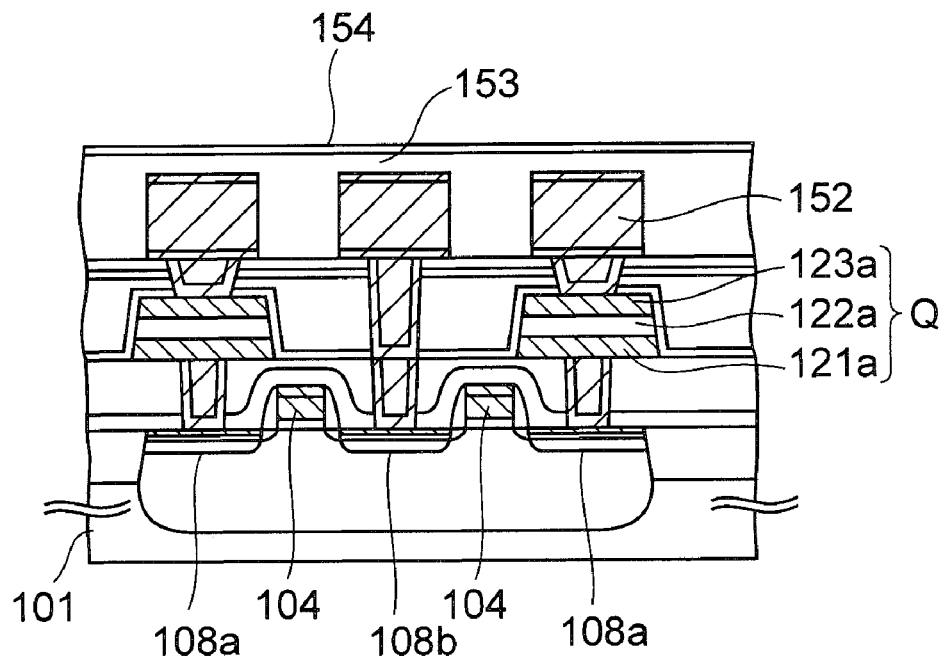
Figure 6S:
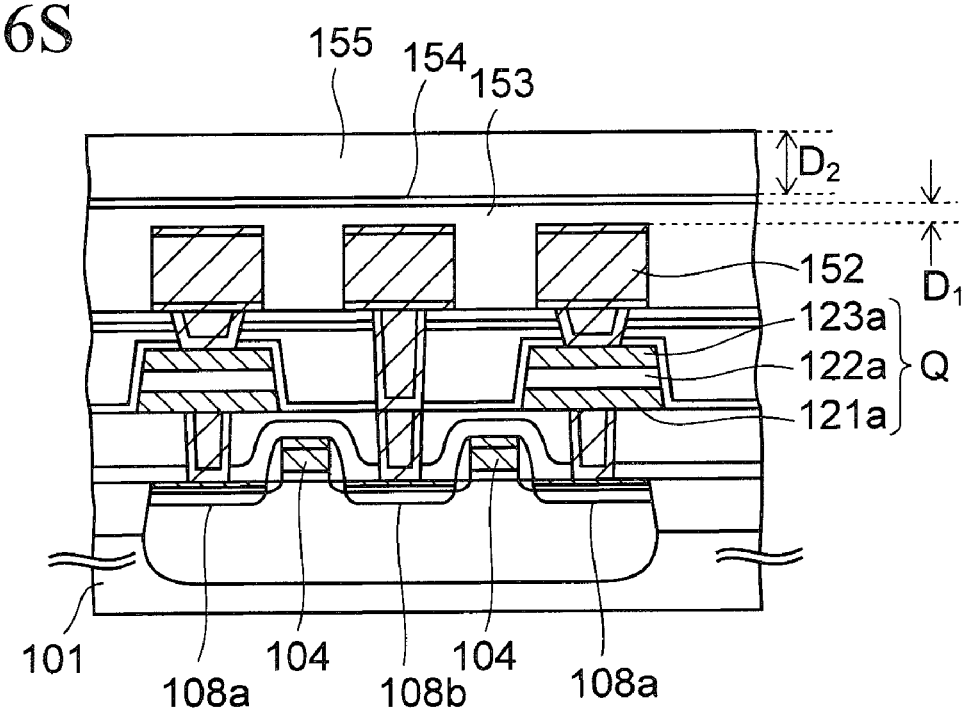
Figure 6T:
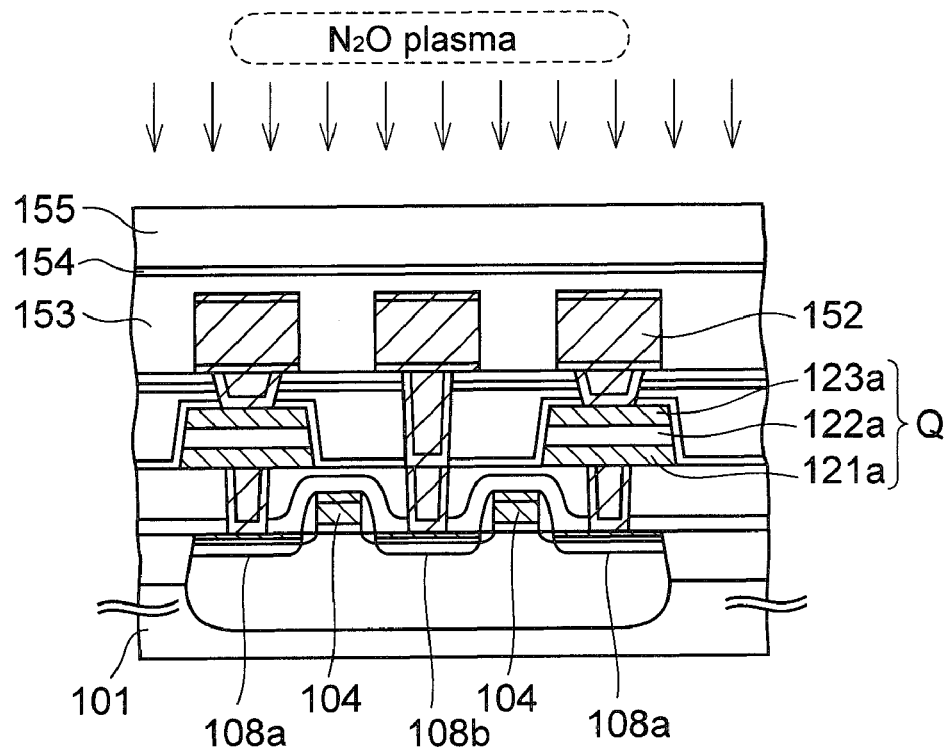
Figure 6U:
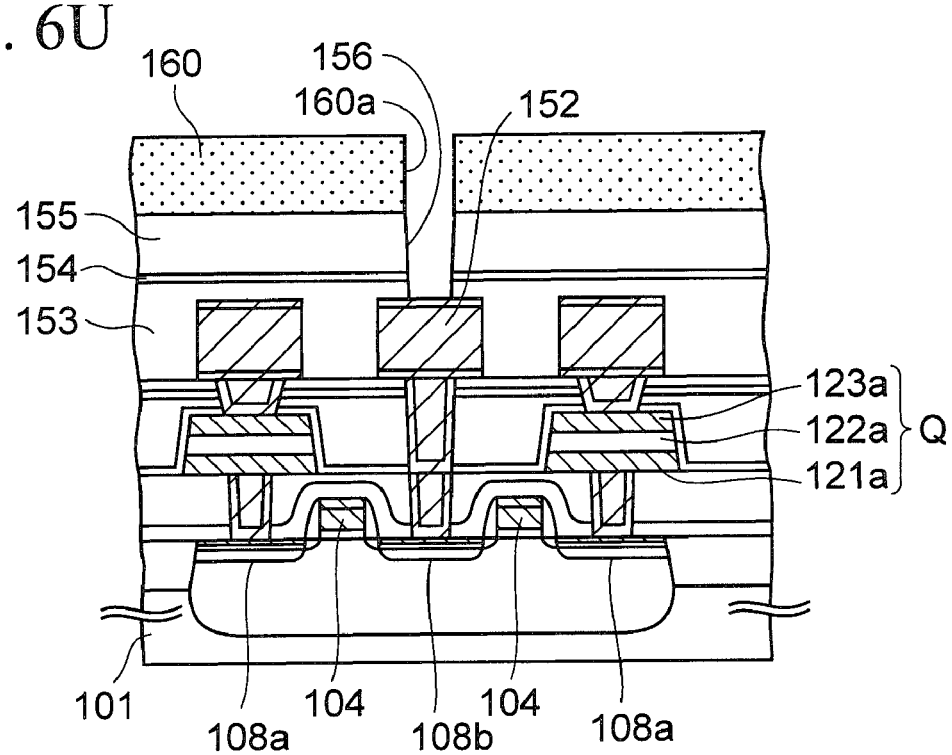
Figure 6V:
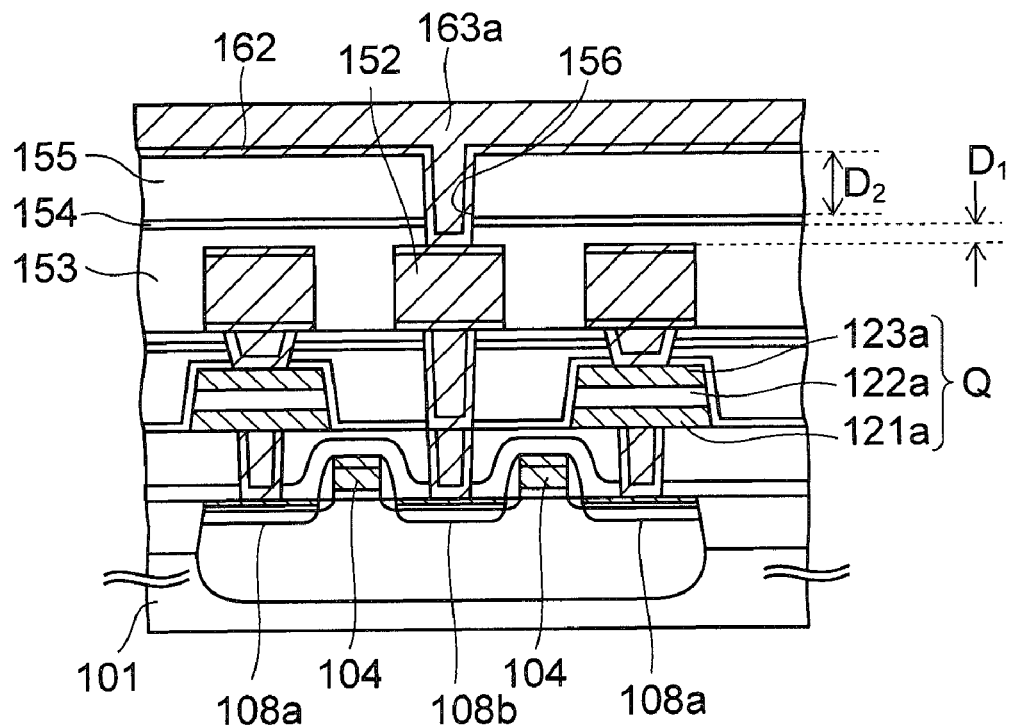
Figure 6W:
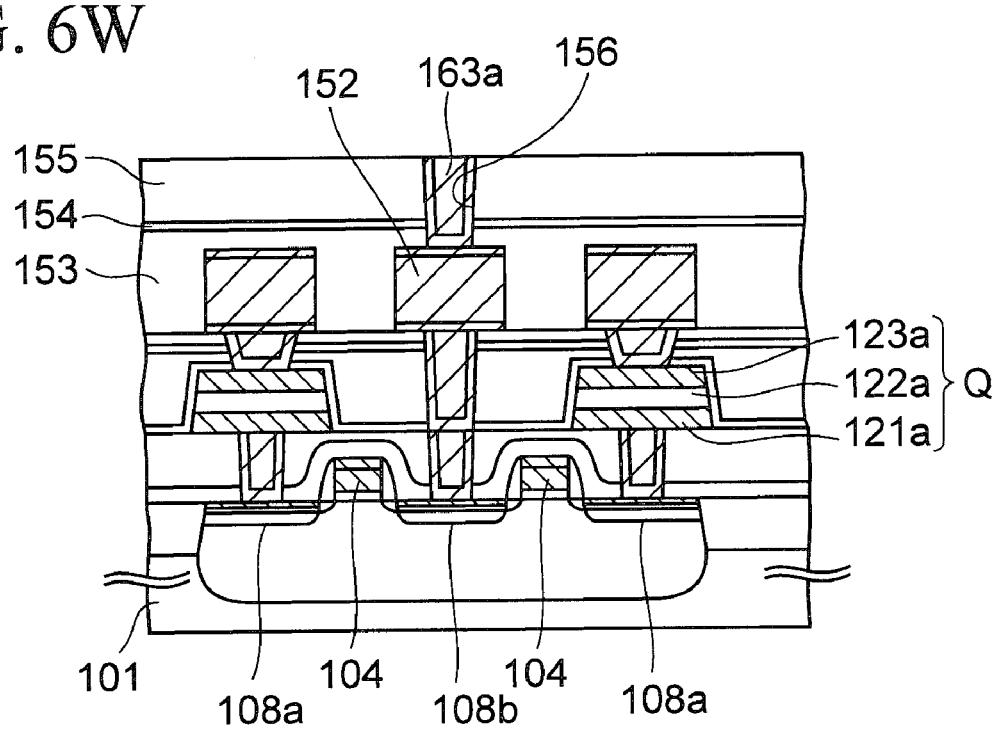
Figure 6X:
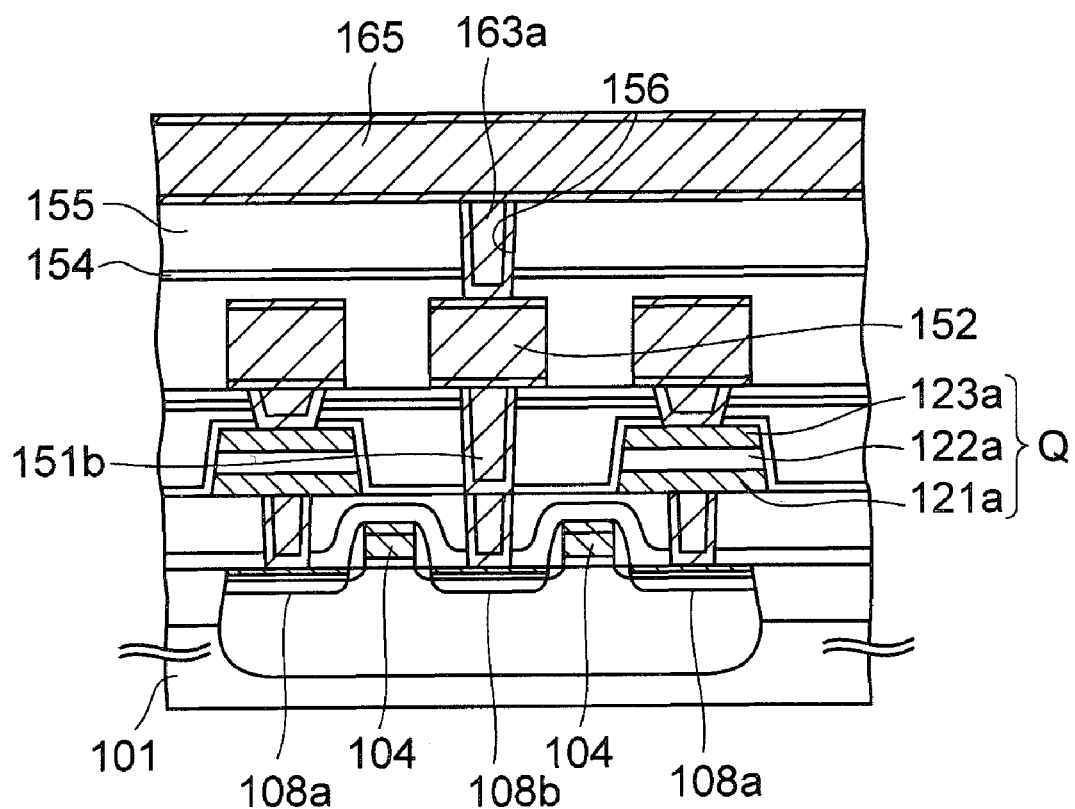

FIGS. 6A to 6X are cross-sectional views showing processes of manufacturing a semiconductor device according to the present embodiment.

Firstly, processes for obtaining a cross-sectional structure shown in FIG. 6A will be described.

First, a groove for STI defining active regions of a transistor is formed on a surface of an n-type or p-type silicon substrate 101. The groove is then embedded with a device isolation insulating film 102 such as silicon oxide. Note that the device isolation structure is not limited to STI, and the device isolation insulating film 102 may be formed by a LOCOS method.

Subsequently, a p-well 103 is formed by introducing a p-type impurity into the active region of the silicon substrate 101. Thereafter, the surface of the active region is thermally oxidized to form a thermally-oxidized film to be a gate insulating film 104.

After that, an amorphous or polycrystal silicon film is formed on the entire upper surface of the silicon substrate 101, and this film is patterned by photolithography to form two gate electrodes 105.

The above-described two gate electrodes 105 are disposed on the p-well 103 in parallel at a distance from each other, and these gate electrodes 105 constitute a part of a ward line.

Thereafter, an n-type impurity is introduced into the silicon substrate 101 beside the gate electrodes 105 by the ion implantation using the gate electrodes 105 as a mask, so that first and second source/drain extensions 106a and 106b are formed.

After that, an insulating film is formed on the entire upper surface of the silicon substrate 101, and this insulating film is etched back to form insulating sidewalls 107 beside the gate electrodes 105. As the insulating film, a silicon oxide film is formed by the CVD method, for example.

Subsequently, the n-type impurity is ion-implanted into the silicon substrate 101 again, while using the insulating sidewalls 107 and the gate electrodes 105 as a mask, to form first and second source/drain regions 108a and 108b in the surface layer of the silicon substrate 101 beside the two gate electrodes 105.

After that, a refractory metal layer, such as a cobalt layer, is formed on the entire upper surface of the silicon substrate 101 by the sputtering method. Then, the refractory metal layer is heated, and thereby caused to react with silicon to form a refractory metal silicide layer 109 on the silicon substrate 101. The refractory metal silicide layer 109 is also formed in surface portions of the gate electrodes 105. Thereby, the gate electrodes 105 are caused to have low resistance.

Thereafter, the refractory metal layer which is left unreacted on the device isolation insulating film 102 and the like is removed by wet etching.

With the processes described so far, first and second MOS transistors $TR_1$ and $TR_2$ formed of the gate insulating films 104, the gate electrodes 105, and the first and second source/drain regions 108a and 108b, are formed in the active region of the silicon substrate 101.

Next, as shown in FIG. 6B, a silicon oxynitride film is formed with a thickness of approximately 80 nm on the entire upper surface of the silicon substrate 101 by the plasma CVD method as an etching stopper film 110. Then, a silicon oxide film is formed, as a base insulating film 111, with a thickness of approximately 11000 nm on the etching stopper film 110 by the plasma CVD method using the TEOS gas.

After that, the upper surface of the base insulating film 111 is polished and planarized by the CMP method. As a result of this CMP, the thickness of the base insulating film 111 becomes approximately 800 nm on the flat surface of the silicon substrate 101.

Thereafter, the base insulating film 111 and the etching stopper film 110 are patterned by photolithography to form first holes 111a in these insulating films over the first and second source/drain regions 108a and 108b. The patterning is carried out by etching in two steps. In the first step, etching is carried out on the base insulating film 111, and in the second step, etching is carried out on the etching stopper film 110.

Next, processes for obtaining a cross-sectional structure shown in FIG. 6C will be described.

Firstly, a titanium film with a thickness of approximately 30 nm and a titanium nitride film with a thickness of approximately 50 nm are formed in this order on the upper surface of the base insulating film 111 and the inner surfaces of the first holes 111a by the sputtering method. The titanium film and the titanium nitride film thus formed are used as a glue film.

Thereafter, a tungsten film is formed on this glue film by the CVD method using a tungsten hexafluoride gas to completely fill the first holes 111a with this tungsten film.

Then, the excessive glue film and tungsten film on the base insulating film 111 are polished and removed to leave these films in the first holes 111a as first conductive plugs 113.

Subsequently, as shown in FIG. 6D, an iridium film is formed with a thickness of approximately 200 nm on the upper surfaces of the first conductive plugs 113 and the base insulating film 111 by the DC sputtering method. The iridium film thus formed is used as a first conductive film 121. The conditions for forming the iridium film are not particularly limited. In the present embodiment, an argon gas is used as a sputtering gas, a pressure in the chamber is approximately 0.11 Pa, DC power is 0.5 kW, the film-forming time is 335 seconds, and the substrate temperature is 500° C.

Thereafter, a PZT film is formed as a ferroelectric film 122 with a thickness of approximately 120 nm on the first conductive film 121 by the MOCVD method. The MOCVD method is carried out by setting, for example, the flow rate of tetrahydrofuran (THF: $C_4H_8O$) to 0.474 ml per minute, the flow rate of a Pb material made by dissolving $Pb(DPM)_2$ into the THF solvent with a concentration of 0.3 mol per liter to 0.326 ml per minute, the flow rate of a Zr material made by dissolving $Zr(dmhd)_4$ into the THF solvent with a concentration of 0.3 mol per liter to 0.2 ml per minute, and the flow rate of a Zr material made by dissolving $Ti(O\text{-}iPr)_2(DPM)_2$ into the THF solvent with a concentration of 0.3 mol per liter to 0.2 ml per minute. In addition, the film-forming pressure is approximately 5 Torr, the substrate temperature is approximately 620° C., and the film-forming time is approximately 620 seconds.

Note that the film-forming methods of the ferroelectric film 122 include a sputtering method and a sol-gel method in addition to the MOCVD method. Furthermore, the material of the ferroelectric film 122 is not limited to the above-described PZT, and it may be formed of Bi layer structure compounds, such as $SrBi_2Ta_2O_9$ and $SrBi_2(Ta,Nb)_2O_9$. Moreover, the ferroelectric film 122 may be made of a PLZT in which lanthanum is doped into the PZT, or other metal oxide ferroelectrics.

After that, an iridium oxide ($IrO_2$) film is formed with a thickness of 200 nm on the ferroelectric film 122 by the sputtering method as a second conductive film 123.

Subsequently, to recover damages received in the ferroelectric film 122 at the time when the second conductive film 123 is formed, recovery annealing is carried out in a furnace with an atmosphere containing oxygen, under conditions with a substrate temperature of 500° C. and a processing time of 60 minutes.

Next, as shown in FIG. 6E, while a hard mask (unillustrated) in a shape of a capacitor upper electrode is used as an etching mask, the first conductive film 121, the ferroelectric film 122, and the second conductive film 123 are simultaneously dry-etched. Thereby, capacitors Q, each formed by laminating a lower electrode 121a, a capacitor dielectric film 122a, and an upper electrode 123a in this order, are formed. In this dry etching, an etching gas including a halogen gas is used, for example.

Next, as shown in FIG. 6F, an alumina film 140 is formed with a thickness of approximately 20 nm on the entire upper surface of the silicon substrate 101 by an atomic layer deposition (ALD) method using a mixed gas of, for example, trimethyl aluminum (TMA) and $O_3$. The alumina film 140 has a function to prevent the capacitor dielectric films 122a from being deteriorated due to reduction, by blocking reductants such as hydrogen.

After that, the recovery annealing is carried out for recovering damages received in the capacitor dielectric films 122a during the manufacturing processes so far. This recovery annealing is carried out in a furnace in the atmosphere containing oxygen at a substrate temperature of 560° C.

Next, as shown in FIG. 6G, a silicon oxide film is formed on the alumina film 140 by, for example, the plasma CVD method using the TEOS gas. The formed silicon oxide film is used as an interlayer insulating film 141.

After that, the upper surface of the interlayer insulating film 141 is polished and planarized by the CMP method. With this CMP, the thickness of the interlayer insulating film 141 is made to be approximately 300 nm on the upper electrodes 123a.

Next, as shown in FIG. 6H, an alumina film is formed with a thickness of approximately 40 nm by the sputtering method as an interlayer capacitor protective insulating film 142 for protecting the capacitor dielectric film 122a.

Note that dehydration annealing may be carried out on the interlayer insulating film 141 before the interlayer capacitor protective insulating film 142 is formed.

In addition, the interlayer capacitor protective insulating film 142 is not limited to the alumina film. The interlayer capacitor protective insulating film 142 may be formed as a single layer of an alumina film, a titanium oxide film, a silicon nitride film, or a silicon oxynitride film, or a laminated film of these films.

Next, as shown in FIG. 6I, a silicon oxide film is formed as an interlayer cover insulating film 143 with a thickness of approximately 1400 nm on the interlayer capacitor protective insulating film 142 by the plasma CVD method using the TEOS gas.

Next, processes for obtaining a cross-sectional structure shown in FIG. 6J will be described.

Firstly, the interlayer cover insulating film 143 is coated with a photoresist. The photoresist is then exposed and developed to form a first resist pattern 144 provided with first hole-shaped windows 144a over the upper electrodes 123a.

After that, the insulating films 140 to 143 are etched through the first windows 144a to form, in these insulating films, second holes 145 in the depths so as to reach the upper electrodes 123a. The conditions for this etching are not particularly limited. In the present embodiment, the etching is carried out by using a parallel plate-type plasma etching chamber (unillustrated) and the mixed gas of $C_4F_8$, Ar, and $O_2$ as an etching gas.

Subsequently, the first resist pattern 144 is removed. Thereafter, to recover damages received in the capacitor dielectric films 122a during the manufacturing processes so far, the silicon substrate 101 is placed in the unillustrated furnace and the recovery annealing is carried out in the atmosphere containing oxygen at a substrate temperature of 550° C. for approximately 40 minutes.

Next, as shown in FIG. 6K, a second resist pattern 150 is formed on the entire upper surface of the silicon substrate 101. The second resist pattern 150 has a hole-shaped second window 150a over the second source/drain region 108b.

Subsequently, the insulating films 140 to 143 are etched through the second window 150a to form a third hole 141a in which the first conductive plug 113 is exposed on the second source/drain region 108b. Such etching is carried out, for example, in the parallel plate-type plasma etching chamber by using the mixed gas of $C_4F_8$, Ar, $O_2$, and CO as an etching gas.

After the etching is finished, the second resist pattern 150 is removed.

Next, processes for obtaining a cross-sectional structure shown in FIG. 6L will be described.

Firstly, a titanium nitride film is formed, as a glue film, with a thickness of approximately 50 nm on the upper surfaces of the interlayer cover insulating film 143 and the inner surfaces of the second and third holes 145 and 141a by the sputtering method. Thereafter, a tungsten film is formed on this glue film with a thickness sufficient to fill the second and third holes 145 and 141a, for example, a thickness of 300 nm on the flat surface of the interlayer cover insulating film 143.

After that, the excessive glue film and tungsten film on the interlayer cover insulating film 143 are polished and removed by the CMP method to leave the glue film and the tungsten film in the second and third holes 145 and 141a, respectively as second and third conductive plugs 151a and 151b.

Among these conductive plugs, the second conductive plugs 151a are electrically connected to the upper electrodes 123a, whereas the third conductive plug 151b is electrically connected to the first conductive plug 113 on the second source/drain region 108b to form a part of a bit line together with the first conductive plug 113.

Next, processes for obtaining a cross-sectional structure shown in FIG. 6M will be described.

Firstly, a metal laminated film is formed on the upper surfaces of the interlayer cover insulating film 143 and the second and third conductive plugs 151a and 151b by the sputtering method. The metal laminated film is formed by laminating, for example, a titanium nitride film with a thickness of approximately 50 nm, an aluminum film with a thickness of approximately 360 nm, and a titanium nitride film with a thickness of approximately 70 nm in this order.

Subsequently, the metal laminated film is patterned by photolithography to form first layer metal wirings 152, each of which is electrically connected to corresponding one of the second and third conductive plugs 151a and 151b.

Here, at the time of patterning the metal laminated film, over-etching is carried out so as not to leave etching residues of the metal laminated film on the first interlayer cover insulating film 143. Since the interlayer capacitor protective insulating film 142 is covered with the interlayer cover insulating film 143, the interlayer capacitor protective insulating film 142 is not etched even when over-etching is carried out in this manner. For this reason, the thickness of the interlayer capacitor protective insulating film 142 does not decrease even after the patterning of the metal laminated film is finished. Thus, the blocking capability of the interlayer capacitor preventive insulating film 142 against reductants can be sufficiently maintained.

Next, as shown in FIG. 6N, a silicon oxide film is formed on the interlayer cover insulating film 143 and the first layer metal wirings 152 as a first insulating film 153 by the plasma CVD method. This plasma CVD method uses the TEOS gas as a reaction gas. The thickness of the first insulating film 153 on the first layer metal wirings 152 is about 2600 nm.

Next, as shown in FIG. 6O, the upper surface of the first insulating film 153 is polished and planarized by the CMP method.

Here, a fine scar (micro scratch) 153a caused by a scratch of a polishing pad is formed on the first insulating film 153 after CMP.

To deal with this problem, in the next process, as shown in FIG. 6P, a surface layer portion of the first insulating film 153 is etched back by sputtering etching using Ar plasmas in an ICP-type plasma etching chamber (unillustrated). Thereby, the above-described scar 153a is removed. A depth of this etching back is set to deeper than that of the scar 153a, for example approximately 50 nm to 100 nm.

Since the conditions for the etching back using Ar plasma are the same as those in the process of FIG. 3B of the first embodiment, the description thereof will be omitted here.

With such etching back, a thickness $D_1$ (first film thickness) of the first insulating film 153 becomes approximately 50 nm to 1000 nm on the first layer metal wirings 152.

In addition, as described in the first embodiment, the first insulating film 153 may be etched back by dry etching or wet etching in place of the above-described etching back using Ar plasmas.

Next, as shown in FIG. 6Q, $N_2O$ plasma processing is carried out on the surface of the first insulating film 153. Thereby, the first insulating film 153 is dehydrated, and the surface thereof is nitrided to prevent the first insulating film 153 from resorbing moisture. This $N_2O$ plasma processing is carried out in a CVD equipment at a substrate temperature of approximately 350° C. for a processing time of approximately four minutes.

Subsequently, as shown in FIG. 6R, an alumina film is formed with a thickness of as thin as approximately 50 nm on the first insulating film 153 by the sputtering method. The alumina film thus formed is used as a first capacitor protective insulating film 154.

Note that the first capacitor protective insulating film 154 is not limited to the alumina film, and may be made from a single layer of any one of an alumina film, a titanium oxide film, a silicon nitride film, and a silicon oxynitride film, or a laminated film of these films.

As described in FIG. 6P, at the time of forming the first capacitor protective insulating film 154, the upper surface of the first insulating film 153 is planarized by etching back, and hence the scar 153a caused by CMP is not formed on the upper surface of the first insulating film 153.

Accordingly, the first capacitor protective insulating film 154 can be formed evenly on the entire upper surface of the first insulating film 153. Thus, the first capacitor protective insulating film 154 can effectively block reductants, such as hydrogen. Accordingly, it is made easier to protect the capacitor dielectric film 122*a* from being deteriorated by reductants.

Moreover, as described in the above, since the upper surface of the first insulating film 153 is planarized by etching back, there is no need to form a cap insulating film on the first insulating film 153 for filling the scar 153*a*. Accordingly, the step of forming the cap insulating film and the step of performing $N_2O$ plasma processing for the cap insulating film can be omitted. Thus, the manufacturing processes of the semiconductor device can be simplified.

Subsequently, as shown in FIG. 6S, a silicon oxide film is formed on the first capacitor protective insulating film 154 by the CVD method using the TEOS gas. This silicon oxide film is used as a first cover insulating film 155. A thickness $D_2$ (second film thickness) of the first cover insulating film 155 is approximately 100 nm, which is thicker than the first film thickness $D_1$.

Next, as shown in FIG. 6T, $N_2O$ plasma processing is carried out on the first cover insulating film 155 in CVD equipment under conditions of, for example, a substrate temperature of 350° C. and a processing time of two minutes. The first cover insulating film 155 is dehydrated and the surface thereof is nitrided by such $N_2O$ plasma processing, so that the first cover insulating film 155 is prevented from resorbing moisture.

Next, as shown in FIG. 6U, a third resist pattern 160 having a third window 160*a* over the first layer metal wiring 152 is formed on the first cover insulating film 155.

Subsequently, the insulating films 153 to 155 are dry-etched through the third window 160*a* to form a fourth hole 156 in these insulating films over the first layer metal wiring 152. The conditions for the dry etching are not particularly limited. In the present embodiment, the dry etching is carried out by using a parallel plate-type plasma etching chamber (unillustrated) and the mixed gas of $C_4F_8$, Ar, and $O_2$ as an etching gas.

The third resist pattern 160 is removed after this etching is finished.

Next, as shown in FIG. 6V, by using the sputtering method under the condition of a substrate temperature of approximately 200° C., a titanium nitride film is formed as a glue film 162 with a thickness of approximately 150 nm on the inner surface of the fourth hole 156 and on the upper surface of the first cover insulating film 155.

Furthermore, a tungsten film 163*a* is formed on the glue film 162 with a thickness that the fourth hole 156 is completely embedded, for example a thickness of approximately 650 nm, by the plasma CVD method using a tungsten hexafluoride gas. The substrate temperature at the time of forming the tungsten film 163*a* is, for example, approximately 430° C.

When the glue film 162 and the tungsten film 163*a* are formed in this manner, the silicon substrate 101 is heated. Accordingly, moisture in the first insulating film 153 is vaporized by the heat. However, since the upper surface of the first insulating film 153 is blocked by the first capacitor protective insulating film 154, the moisture can escape substantially only from the fourth hole 156. When the amount of the moisture coming out from the fourth hole 156 becomes large, the moisture prevents the glue film 162 and the tungsten film 163*a* from being formed in the fourth hole 156.

To deal with this problem, the thickness $D_1$ (first film thickness) of the first insulating film 153 on the first layer metal wiring 152 is set to equal to or less than the thickness $D_2$ (second film thickness) of the first cover insulating film 155. Thereby, the amount of moisture generated from the first insulating film 153 can be set to equal to or less than that generated from the first cover insulating film 155. Thus, the fourth hole 156 can be prevented from being defectively embedded by the glue film 162 and the tungsten film 163*a*.

Thereafter, as shown in FIG. 6W, the excessive glue film 162 and tungsten film 163*a* on the upper surface of the first cover insulating film 155 are removed to leave these films 162 and 163*a* only in the fourth hole 156 as a fourth conductive plug 163.

Next, processes for obtaining a cross-sectional structure shown in FIG. 6X will be described.

Firstly, a metal laminated film is formed on the fourth conductive plug 163 and the first cover insulating film 155 by the sputtering method. In the present embodiment, the metal laminated film is formed by laminating a titanium film with a thickness of approximately 60 nm, a titanium nitride film with a thickness of approximately 30 nm, a copper-containing aluminum film with a thickness of approximately 400 nm, a titanium film with a thickness of approximately 5 nm, and a titanium nitride film with a thickness of approximately 70 nm in this order.

Thereafter, the metal laminated film is patterned into a second layer metal wiring 165 by photolithography.

From the same reason as that described by referring to FIG. 6M, since the first cover insulating film 155 is formed on the first capacitor protective insulating film 154, the first capacitor protective insulating film 154 is not thinned even when the metal laminated film is patterned. Accordingly, the blocking capability of the first capacitor protective insulating film 154 against reductants can be sufficiently maintained.

With the processes described so far, the basic structure of the semiconductor device according to the present embodiment is completed.

According to the present embodiment, as described in FIG. 6P, the upper surface of the first insulating film 153 after CMP is etched back to remove the fine scar 153*a* caused by CMP. Thereby, like the first embodiment, there is no need to form a cap insulating film for filling the scar 153*a* in the first insulating film 153. Accordingly, the step of forming the cap insulating film and step of performing $N_2O$ plasma processing for dehydrating the cap insulating film can be omitted. As a result, the manufacturing processes of the semiconductor device can be shortened, and the manufacturing cost of the semiconductor device can be reduced.

Moreover, in the present embodiment, as described by referring to FIG. 6V, the thickness $D_1$ (first film thickness) of the first insulating film 153 on the first layer metal wiring 152 is set to equal to or less than the thickness $D_2$ (second film thickness) of the first cover insulating film 155. Thereby, moisture generated from the first insulating film 153 can be set to equal to or less than that generated from the first cover insulating film 155. Thus, the fourth hole 156 can be prevented from being defectively embedded by the glue film 162 and the tungsten film 163*a*.

FIG. 7 is enlarged cross-sectional views of the second embodiment (right) and a comparative example (left) in which the cap insulating film is formed, respectively.

As shown in FIG. 7, in the comparative example (left), a cap insulating film 200 is formed. Therefore, a distance between the first capacitor protective insulating film 154 and the first layer metal wiring 152 becomes larger by the thickness of the cap insulating film 200. Accordingly, the amount of residual moisture residing between the first layer metal wiring 152 and the first capacitor protective insulating film 154 is increased, so that the amount of the moisture escaping from the fourth hole 156 to the outside thereof becomes larger at the time when the fourth conductive plug 163 is formed. As a result, the fourth conductive plug 163 becomes easy to be defectively formed.

The foregoing is considered as illustrative only of the principles of the present invention. Further, since numerous modifications and changes will readily occur to those skilled in the art, it is not desired to limit the invention to the exact construction and applications shown and described, and accordingly, all suitable modifications and equivalents may be regarded as falling within the scope of the invention in the appended claims and their equivalents.

What is claimed is:

1. A semiconductor device comprising:
   a semiconductor substrate;
   a base insulating film formed over the semiconductor substrate;
   a capacitor formed over the base insulating film by sequentially forming a lower electrode, a capacitor dielectric film formed of a ferroelectric material, and an upper electrode;
   an interlayer insulating film covering the capacitor;
   a first wiring formed over the interlayer insulating film;
   a single-layer first insulating film which covers the interlayer insulating film and the first wiring and has a first film thickness over the first wiring;
   a first capacitor protective insulating film formed over the first insulating film;
   a first cover insulating film which is formed over the first capacitor protective insulating film and has a second film thickness over the first wiring, the second film thickness being thicker than the first film thickness;
   a first hole formed in the first cover insulating film, the first capacitor protective insulating film, and the first insulating film, over the first wiring;
   a first conductive plug which is formed in the first hole and is electrically connected to the first wiring; and
   a second wiring which is formed over the first cover insulating film and is electrically connected to the first conductive plug.

2. The semiconductor device according to claim 1, wherein an upper surface of the first insulating film is planarized.

3. The semiconductor device according to claim 1, wherein the first film thickness is between 50 nm and 1000 nm inclusive.

4. The semiconductor device according to claim 1, further comprising:
   a single-layer second insulating film which is formed over the second wiring and the first cover insulating film and has a third film thickness over the second wiring;
   a second capacitor protective insulating film formed over the second insulating film;
   a second cover insulating film which is formed over the second capacitor protective insulating film and has a fourth film thickness over the second wiring, the fourth film thickness being thicker than the third film thickness;
   a second hole formed in the second cover insulating film, the second capacitor protective insulating film, and the second insulating film, over the second wiring;
   a second conductive plug which is formed in the second hole and is electrically connected to the second wiring; and
   a third wiring which is formed over the second cover insulating film and is electrically connected to the second conductive plug.

5. The semiconductor device according to claim 1, further comprising:
   a third capacitor protective insulating film formed over the interlayer insulating film and the first wiring,
   wherein the first insulating film is formed over the third capacitor protective insulating film.

6. The semiconductor device according to claim 1, further comprising:
   an interlayer capacitor protective insulating film formed over the interlayer insulating film; and
   an interlayer cover insulating film formed over the interlayer capacitor protective insulating film,
   wherein the first wiring is formed over the interlayer cover insulating film.

7. The semiconductor device according to claim 6, wherein a third hole is formed in the interlayer insulating film, the interlayer capacitor protective insulating film, and the interlayer cover insulating film over the lower electrode and a third conductive plug, which is electrically connected to the lower electrode, is formed in the third hole.

8. A method for manufacturing a semiconductor device, comprising:
   forming a base insulating film over a semiconductor substrate;
   forming a capacitor by sequentially stacking, over the base insulating film, a lower electrode, a capacitor dielectric film formed of a ferroelectric material, and an upper electrode;
   forming an interlayer insulating film covering the capacitor;
   forming a first wiring over the interlayer insulating film;
   forming a single-layer first insulating film which covers the interlayer insulating film and the first wiring and has a first film thickness over the first wiring;
   forming a first capacitor protective insulating film over the first insulating film;
   forming, over the first capacitor protective insulating film, a first cover insulating film having a second film thickness over the first wiring, the second film thickness being thicker than the first film thickness;
   forming a first hole in the first cover insulating film, the first capacitor protective insulating film, and the first insulating film, over the first wiring;
   forming, in the first hole, a first conductive plug which is electrically connected to the first wiring; and
   forming, over the first cover insulating film, a second wiring which is electrically connected to the first conductive plug.

9. The method for manufacturing a semiconductor device according to claim 8, further comprising:
   polishing to planarize an upper surface of the first insulating film; and
   etching back the upper surface of the first insulating film after the planarization.

10. The method for manufacturing a semiconductor device according to claim 9, wherein
    when etching back the first insulating film, the first insulating film is etched back by a depth deeper than a depth of a scar formed on the upper surface of the first insulating film at the time of the planarization.

11. The method for manufacturing a semiconductor device according to claim 9, wherein
    when etching back the first insulating film, the first insulating film is etched back by a depth of between 5 nm and 100 nm inclusive.

12. The method for manufacturing a semiconductor device according to claim 9, wherein any one of sputtering etching, dry etching, and wet etching is used as the etching back.

13. The method for manufacturing a semiconductor device according to claim 8, further comprising:
    forming, over the second wiring and the first cover insulating film, a single-layer second insulating film having a third film thickness over the second wiring;
    forming a second capacitor protective insulating film over the second insulating film;
    forming, over the second capacitor protective insulating film, a second cover insulating film having a fourth film thickness over the second wiring, the fourth film thickness being thicker than the third film thickness;
    forming a second hole in the second cover insulating film, the second capacitor protective insulating film, and the second insulating film, over the second wiring;
    forming, in the second hole, a second conductive plug which is electrically connected to the second wiring; and
    forming, over the second cover insulating film, a third wiring which is electrically connected to the second conductive plug.

14. The method for manufacturing a semiconductor device according to claim 8, further comprising:
    forming a third capacitor protective insulating film over the interlayer insulating film and the first wiring,
    wherein, when forming the first insulating film, the first insulating film is formed over the third capacitor protective insulating film.

15. The method for manufacturing a semiconductor device according to claim 8, further comprising:
    forming an interlayer capacitor protective insulating film over the interlayer insulating film; and
    forming an interlayer cover insulating film over the interlayer capacitor protective insulating film,
    wherein the first wiring is formed over the interlayer cover insulating film.

16. The method for manufacturing a semiconductor device according to claim 15, further comprising:
    forming a third hole in the interlayer insulating film, the third capacitor protective insulating film, and the interlayer cover insulating film, over the lower electrode; and
    forming, in the third hole, a third conductive plug which is electrically connected to the lower electrode.

17. The method for manufacturing a semiconductor device according to claim 8, wherein any one of, or a lamination of any of, alumina film, a titanium oxide film, a silicon nitride film, and a silicon oxynitride film is formed as the first capacitor protective insulating film.

18. The method for manufacturing a semiconductor device according to claim 8, wherein the formation of the first conductive plug comprises:
    forming a plug conductive film in the first hole and over the first cover insulating film; and
    leaving the plug conductive film in the first hole as the first conductive plug by polishing and removing the plug conductive film over the first cover insulating film.

19. The method for manufacturing a semiconductor device according to claim 8, wherein, when forming the first insulating film, a silicon oxide film formed by a CVD method using TEOS is used as the first insulating film.

20. The method for manufacturing a semiconductor device according to claim 8, further comprising:
    dehydrating the first insulating film before forming the first capacitor protective insulating film.

* * * * *